(12) United States Patent
Hasegawa et al.

(10) Patent No.: US 12,211,879 B2
(45) Date of Patent: Jan. 28, 2025

(54) INTERMEDIATE CONNECTION MEMBER, METHOD FOR MANUFACTURING INTERMEDIATE CONNECTION MEMBER, ELECTRONIC MODULE, METHOD FOR MANUFACTURING ELECTRONIC MODULE, AND ELECTRONIC EQUIPMENT

(71) Applicant: CANON KABUSHIKI KAISHA, Tokyo (JP)

(72) Inventors: Mitsutoshi Hasegawa, Kanagawa (JP); Noritake Tsuboi, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 616 days.

(21) Appl. No.: 17/370,982

(22) Filed: Jul. 8, 2021

(65) Prior Publication Data
US 2022/0020807 A1    Jan. 20, 2022

(30) Foreign Application Priority Data

Jul. 16, 2020   (JP) .................................. 2020-121963
Apr. 28, 2021   (JP) .................................. 2021-075792

(51) Int. Cl.
*H01L 27/146*   (2006.01)

(52) U.S. Cl.
CPC .. *H01L 27/14636* (2013.01); *H01L 27/14683* (2013.01)

(58) Field of Classification Search
CPC ............... H01L 27/14636; H01L 24/97; H01L 2224/97; H01L 2224/023
See application file for complete search history.

(56) References Cited

U.S. PATENT DOCUMENTS 4,247,979 A      2/1981   Eck
2007/0096289 A1  5/2007   Enomoto
(Continued)

FOREIGN PATENT DOCUMENTS

CA   2524826 A1   5/2006
CN   1332597 A    1/2002
(Continued)

OTHER PUBLICATIONS

U.S. Appl. No. 17/220,606, filed Apr. 1, 2021 by Koji Noguchi et al.
(Continued)

*Primary Examiner* — Nicholas J Tobergte
*Assistant Examiner* — Adin Hrnjic
(74) *Attorney, Agent, or Firm* — VENABLE LLP

(57) ABSTRACT

An intermediate connection member includes a first insulating substrate portion, a second insulating substrate portion, an insulating layer portion provided between the first insulating substrate portion and the second insulating substrate portion and formed from a different material from the first insulating substrate portion and the second insulating substrate portion, a plurality of first wiring portions provided between the first insulating substrate portion and the insulating layer portion so as to extend in a first direction such that both end portions of the plurality of first wiring portions in the first direction are exposed to an outside, and a plurality of second wiring portions provided between the second insulating substrate portion and the insulating layer portion so as to extend in the first direction such that both end portions of the plurality of second wiring portions in the first direction are exposed to the outside.

23 Claims, 20 Drawing Sheets

(56) References Cited

U.S. PATENT DOCUMENTS

| | | | | |
|---|---|---|---|---|
| 2007/0279890 | A1* | 12/2007 | Motohara | H05K 1/144 |
| | | | | 361/810 |
| 2012/0286419 | A1* | 11/2012 | Kwon | H01L 25/0657 |
| | | | | 257/737 |
| 2015/0115465 | A1* | 4/2015 | Lin | H01L 23/49838 |
| | | | | 438/126 |
| 2016/0218057 | A1* | 7/2016 | Lee | H01L 23/49838 |
| 2020/0113056 | A1 | 4/2020 | Hasegawa | |
| 2020/0236261 | A1 | 7/2020 | Okada | |
| 2020/0315016 | A1 | 10/2020 | Tsuboi | |
| 2021/0134871 | A1* | 5/2021 | Jun | H01L 27/14627 |
| 2021/0398907 | A1* | 12/2021 | Chang | H01L 23/3121 |

FOREIGN PATENT DOCUMENTS

| | | |
|---|---|---|
| CN | 1474642 A | 2/2004 |
| CN | 1652663 A | 8/2005 |
| CN | 101026923 A | 8/2007 |
| CN | 101268550 A | 9/2008 |
| CN | 104733436 A | 6/2015 |
| CN | 108140628 A | 6/2018 |
| CN | 109890137 A | 6/2019 |
| JP | H05-55357 A | 3/1993 |
| JP | H10-275979 A | 10/1998 |
| JP | H10-326969 A | 12/1998 |
| JP | 2000-243489 A | 9/2000 |
| JP | 2001-111232 A | 4/2001 |
| JP | 2005-183410 A | 7/2005 |
| TW | 201349957 A | 12/2013 |
| TW | 201909707 A | 3/2019 |

OTHER PUBLICATIONS

Chinese Office Action issued Apr. 7, 2024 during prosecution of related Chinese application No. 202110798188.9 (English translation included).

Chinese Office Action issued Sep. 20, 2024 during prosecution of related Chinese application No. 202110798188.9 (English translation included).

\* cited by examiner

INTERMEDIATE CONNECTION MEMBER, METHOD FOR MANUFACTURING INTERMEDIATE CONNECTION MEMBER, ELECTRONIC MODULE, METHOD FOR MANUFACTURING ELECTRONIC MODULE, AND ELECTRONIC EQUIPMENT

BACKGROUND OF THE INVENTION

Field of the Invention

The present invention relates to an intermediate connection member that electrically interconnects two circuit units.

Description of the Related Art

An image pickup apparatus such as a digital camera or a smartphone including a camera serving as an example of an electronic equipment includes an image pickup module serving as an example of an electronic module. The image pickup module includes a plurality of electronic parts. In the case of an image pickup module, one of the plurality of electronic parts is an image sensor. Each electronic part is mounted on a rigid board such as a printed wiring hoard, and due to the demand for miniaturization of the electronic equipment, there has been an increasing demand that the electronic parts are highly densely mounted on the substrate in an image pickup module.

As one example of a structure that realizes the highly dense arrangement, a three-dimensional mounting structure constituted by a multiple layer structure formed by piling up circuit units is known. As methods for forming the three-dimensional mounting structure, a method of interconnecting two circuit units opposing each other by using a solder ball and a method of interconnecting the two circuit units opposing each other by using an intermediate connection member including wiring are known. In the case where an electronic part is disposed between two rigid boards of the two circuit units, the method of interconnecting the two circuit units by using the intermediate connection member is used.

Japanese Patent Laid-Open No. 2001-111232 discloses an intermediate connection member formed by defining a plurality of through holes in an insulating substrate and injecting conductor in the through holes of the insulating substrate.

Due to a demand for further miniaturization of the electronic equipment, there is a demand for further miniaturization of the three-dimensional mounting structure including the intermediate connection member, and there is a demand for reducing the pitch of wiring in the intermediate connection member. In the method of forming wiring in the through holes, typically holes are bored in the insulating substrate by a mechanical drill. If it is attempted to reduce the pitch between the through holes, a part formed from an insulating material between through holes becomes thinner, and this causes an issue that hinders maintaining high precision processing while meeting the demand for reducing the pitch of wiring, such as the thin part being peeled off or deformed while boring the holes.

SUMMARY OF THE INVENTION

According to a first aspect of the present invention, a method for manufacturing an intermediate connection member used for electrically connecting a first unit and a second circuit unit provided to oppose each other includes forming a first insulating substrate including a first main surface provided with a plurality of first grooves, forming a second insulating substrate including a second main surface provided with a plurality of second grooves, disposing a plurality of first conductive members in the plurality of first grooves, disposing a plurality of second conductive members in the plurality of second grooves, forming a structure by sticking together the first main surface of the first insulating substrate and the second main surface of the second insulating substrate with an insulating member therebetween such that a direction in which the plurality of first conductive members extend and a direction in which the plurality of second conductive members extend are aligned, and cutting the structure in a second direction intersecting with a first direction in which the plurality of first conductive members and the plurality of second conductive members extend.

According to a second aspect of the present invention, an intermediate connection member used for electrically connecting a first circuit unit and a second circuit unit provided to oppose each other includes a first insulating substrate portion, a second insulating substrate portion, an insulating layer portion provided between the first insulating substrate portion and the second insulating substrate portion and formed from a different material from the first insulating substrate portion and the second insulating substrate portion, a plurality of first wiring portions provided between the first insulating substrate portion and the insulating layer portion so as to extend in a first direction such that both end portions of the plurality of first wiring portions in the first direction are exposed to an outside, and a plurality of second wiring portions provided between the second insulating substrate portion and the insulating layer portion so as to extend in the first direction such that both end portions of the plurality of second wiring portions in the first direction are exposed to the outside.

According to a third aspect of the present invention, an intermediate connection member used for electrically connecting a first circuit unit and a second circuit unit provided to oppose each other includes a plurality of first wiring portions arranged at intervals in a second direction intersecting with a first direction. The plurality of first wiring portions are each provided to extend in the first direction such that both end surfaces thereof in the first direction are exposed to an outside. At least one of the plurality of first wiring portions has a first width, and at least another one of the plurality of first wiring portions has a second width larger than the first width.

According to a fourth aspect of the present invention, an intermediate connection member used for electrically connecting a first circuit unit and a second circuit unit provided to oppose each other includes a plurality of first wiring portions arranged at intervals in a second direction intersecting with a first direction. The plurality of first wiring portions are each provided to extend in the first direction such that both end surfaces thereof in the first direction are exposed to an outside. At least one of the plurality of first wiring portions has a first thickness, and at least another one of the plurality of first wiring portions has a second thickness larger than the first thickness.

According to a fifth aspect of the present invention, an intermediate connection member used for electrically connecting a first circuit unit and a second circuit unit provided to oppose each other includes a first insulating substrate portion, and a plurality of first wiring portions that are provided on the first insulating substrate portion and arranged at intervals in a second direction intersecting with a first direction. The plurality of first wiring portions are each provided to extend in the first direction such that both end surfaces thereof in the first direction are exposed to an outside. The first insulating substrate portion has a first groove portion having a width larger than a width of one of the plurality of first wiring portions and/or having a depth larger than a thickness of one of the plurality of first wiring portions.

Further features of the present invention will become apparent from the following description of exemplary embodiments with reference to the attached drawings.

DESCRIPTION OF THE EMBODIMENTS

Exemplary embodiments of the present invention will be described in detail below with reference to drawings.

First Embodiment

Figure 1:
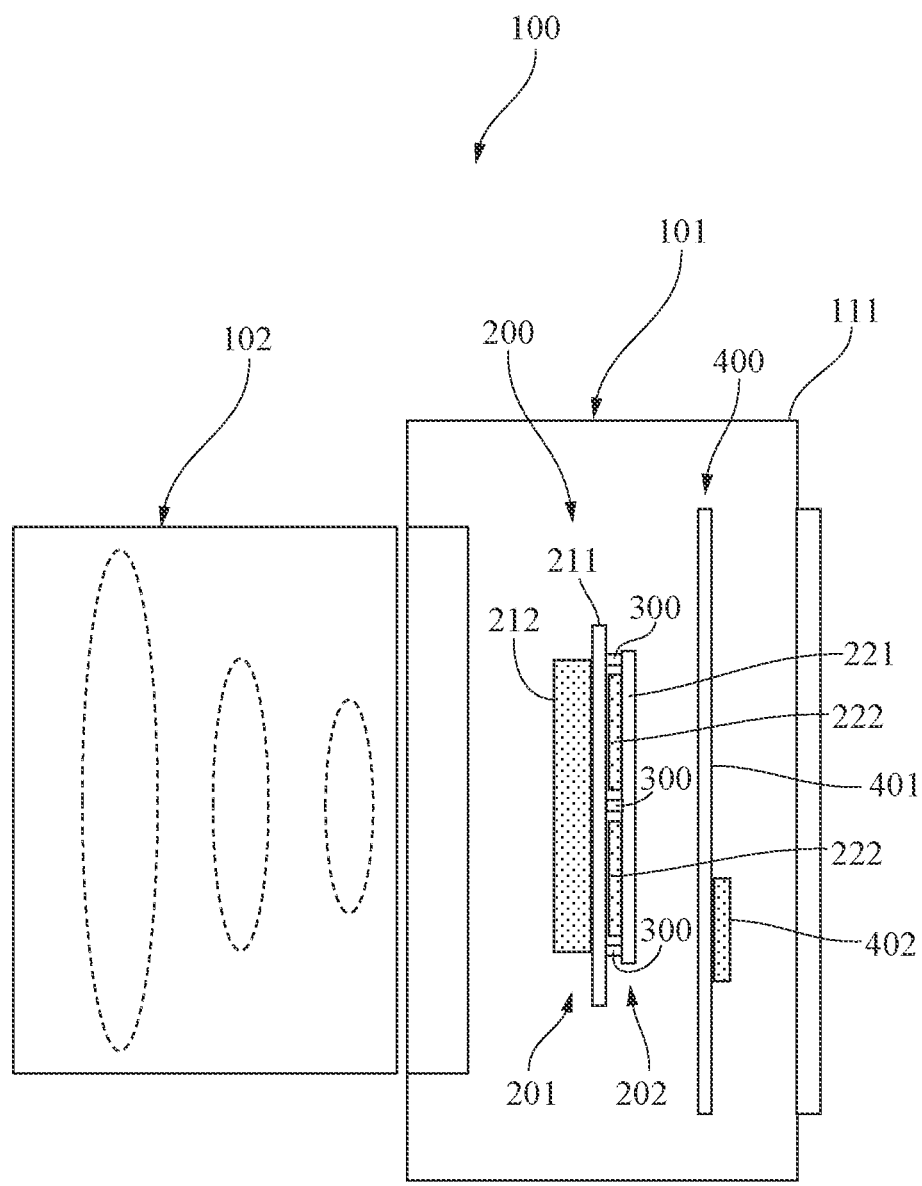
FIG. 1 is an explanatory diagram of a digital camera serving as an example of an electronic equipment according to a first embodiment.

FIG. 1 is an explanatory diagram of a digital camera 100 that is an image pickup apparatus serving as an example of an electronic equipment according to the first embodiment. The digital camera 100 is a digital camera with a replaceable lens, and includes a camera body 101. A lens barrel 102 including a lens is detachably attached to the camera body 101. The lens barrel 102 is a replaceable lens, that is, a lens unit.

The camera body 101 includes a casing 111, and an image pickup module 200 and a processing module 400 that are provided inside the casing 111. The image pickup module 200 and the processing module 400 are electrically communicably connected to each other via an unillustrated cable.

The image pickup module 200 is an example of an electronic module, and has a three-dimensional mounting structure. The image pickup module 200 includes circuit units 201 and 202, and a plurality of intermediate connection members 300. In the present embodiment, the circuit unit 201 serves as a first circuit unit, and the circuit unit 202 serves as a second circuit unit. The circuit unit 201 is a printed wiring board, a printed circuit board, or a semiconductor package, and is a semiconductor package in the present embodiment. The circuit unit 202 is a printed wiring board, a printed circuit board, or a semiconductor package, and is a printed circuit board in the present embodiment. The circuit units 201 and 202 are disposed to be separated from each other in a Z direction that is a lamination direction, and are electrically and mechanically interconnected by the plurality of intermediate connection members 300. That is, the intermediate connection members 300 are used for electrically and mechanically interconnecting the circuit units 201 and 202 that are provided to oppose each other in the Z direction.

The circuit unit 201 includes a wiring board 211, and an image sensor 212 serving as an example of a first electronic part mounted on the wiring board 211. The wiring board 211 is a package board. In addition, the wiring board 211 is a rigid board. The image sensor 212 is a semiconductor element and an image pickup element.

The circuit unit 202 includes a wiring board 221, and a plurality of memory elements 222 serving as an example of second electronic parts mounted on the wiring board 221. The wiring board 221 is a printed wiring board. In addition, the wiring board 221 is a rigid board. The memory elements 222 are semiconductor elements, and are capable of storing image data in the present embodiment. Electronic parts, the memory elements 222 mounted on the wiring board 221 in the present embodiment, are interposed between the wiring hoard 211 and 221. Therefore, in the present embodiment, the wiring boards 211 and 221 are electrically and mechanically interconnected by the plurality of intermediate connection members 300 such that the memory elements 222 do not interfere with the wiring board 211.

For example, the image sensor 212 is a complementary metal oxide semiconductor: CMOS image sensor or a charge-coupled device: CCD image sensor. The image sensor 212 has a function of converting incident light through the lens barrel 102 into electric signals.

The processing module 400 includes a printed wiring board 401, and an image processing device 402 that is a semiconductor device mounted on the printed wiring board 401. For example, the image processing device 402 is a digital signal processor. The image processing device 402 has a function of obtaining an electric signal from the image sensor 212, performing processing to correct the obtained electric signal, and generating image data.

Figure 2A:
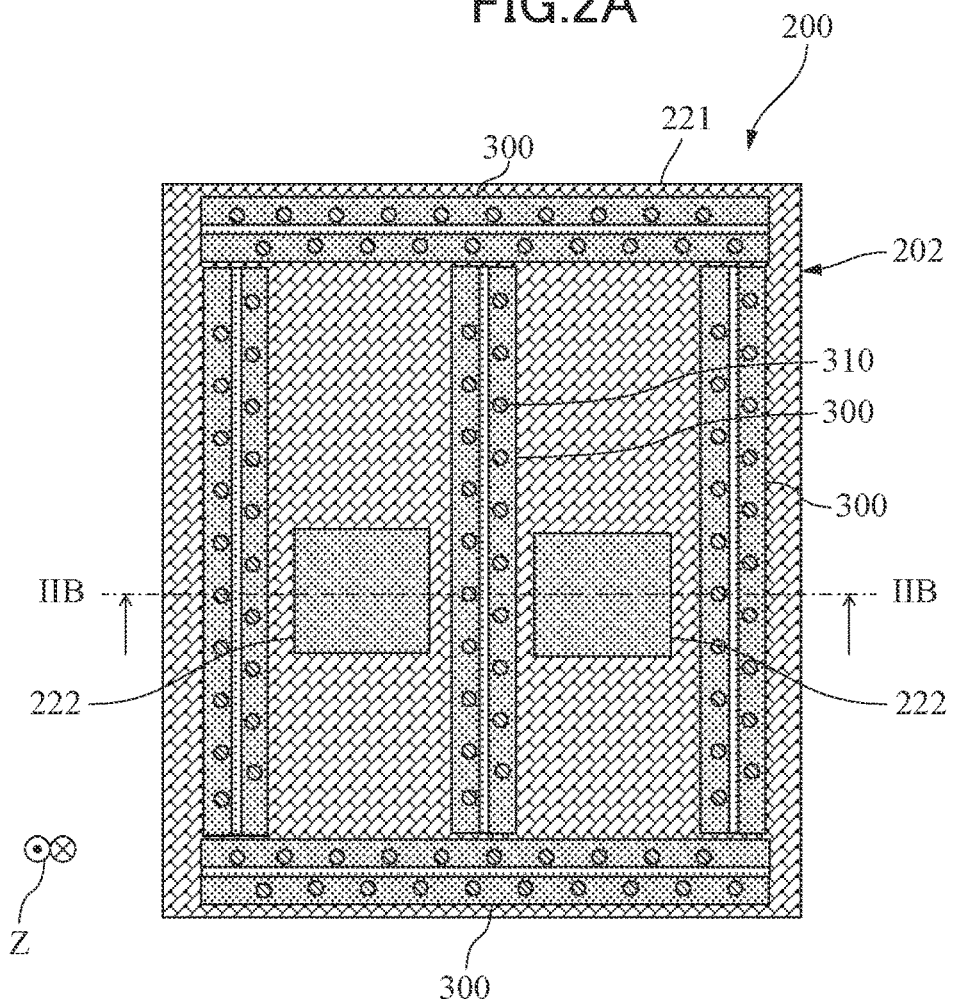
FIG. 2A is a plan view of an image pickup module serving as an example of an electronic module according to the first embodiment.
Figure 2B:
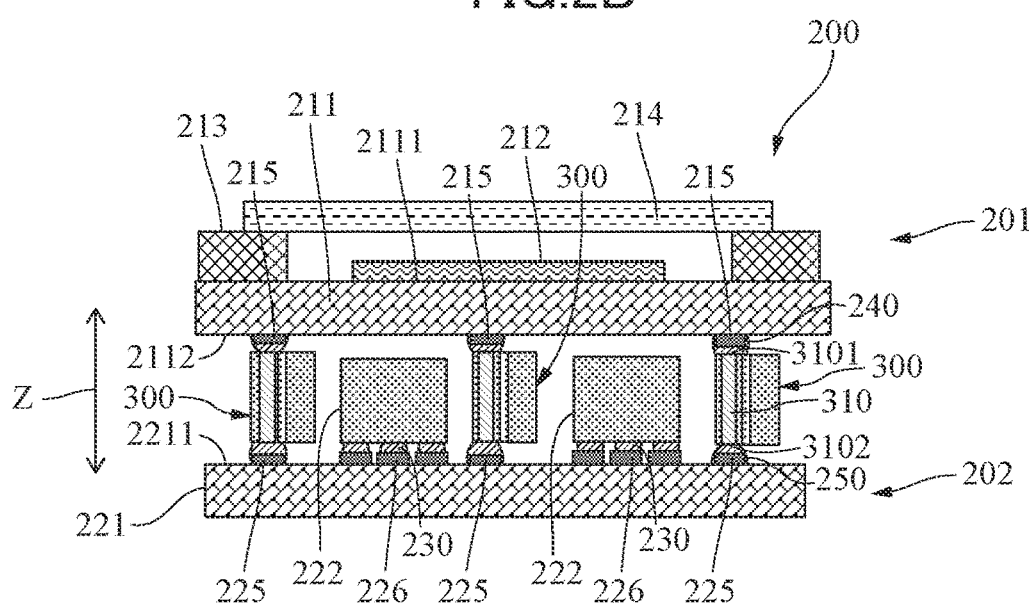
FIG. 2B is a section view of the image pickup module according to the first embodiment.

FIG. 2A is a plan view of the image pickup module 200, and FIG. 2B is a section view of the image pickup module 200. In FIG. 2A, illustration of the circuit unit 201 is omitted for the sake of convenience of description. FIG. 2B is a section view of the image pickup module 200 taken along a line IIB-IIB of FIG. 2A. The circuit unit 201 of the image pickup module 200 includes a frame 213 provided on the wiring board 211, and a lid 214 provided on the frame 213. For example, a glass substrate is used as the lid 214.

The plurality of intermediate connection members 300 are disposed to surround the plurality of memory elements 222. In the present embodiment, five intermediate connection members 300 and two memory elements 222 are provided.

In the wiring board 211, a plurality of pads 215 are disposed on a main surface 2112 opposite to a main surface 2111 on which the image sensor 212 is mounted. An unillustrated solder resist film may be provided on the main surface 2112. In this case, openings are preferably provided in the solder resist film at positions corresponding to the pads 215. The shape of each of the pads 215 is not particularly limited, and may be, for example, a circular shape or a polygonal shape in plan view. In addition, the relationship between the solder resist film and the pads may be either of solder mask defined: SMD and non-solder mask defined: NSMD. As an insulating material of the insulating substrate of the wiring board 211, a resin having a small thermal expansion coefficient is used.

In the wiring board 221, a plurality of pads 225 and a plurality of pads 226 are disposed on a main surface 2211 on which the memory elements 222 are mounted. The plurality of memory elements 222 are bonded to the plurality of pads 226 via solder 230. An unillustrated solder resist film may be provided on the main surface 2211. In this case, openings are preferably provided in the solder resist film at positions corresponding to the pads 225 and 226. The shape of each of the pads 225 and 226 is not particularly limited, and may be, for example, a circular shape or a polygonal shape in plan view. In addition, the relationship between the solder resist film and the pads may be either of SMD and NSMD. As an insulating material of the insulating substrate of the wiring board 221, a resin such as FR-4 is used.

The intermediate connection members 300 each include a plurality of wiring portions 310 extending in the Z direction. Both end surfaces 3101 and 3102 of each of the wiring portions 310 in the Z direction are exposed to the outside. The end surface 3101 is electrically and mechanically connected to corresponding one of the pads 215 via solder 240, and the end surface 3102 is electrically and mechanically connected to corresponding one of the pads 225 via solder 250.

The pads 215, 225, and 226 are each an electrode formed from metal such as copper, which is a conductive material. For example, the pads 215, 225, and 226 are each a signal electrode, a power electrode, a grounding electrode, or a dummy electrode.

Figure 3A:
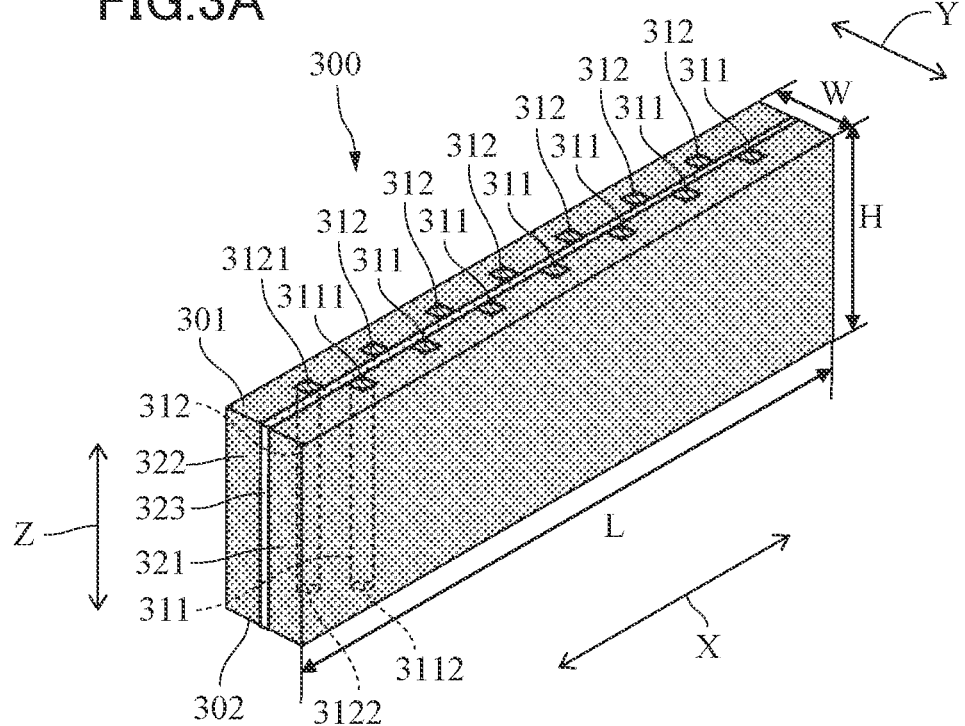
FIG. 3A is a perspective view of an intermediate connection member according to the first embodiment.
Figure 3B:
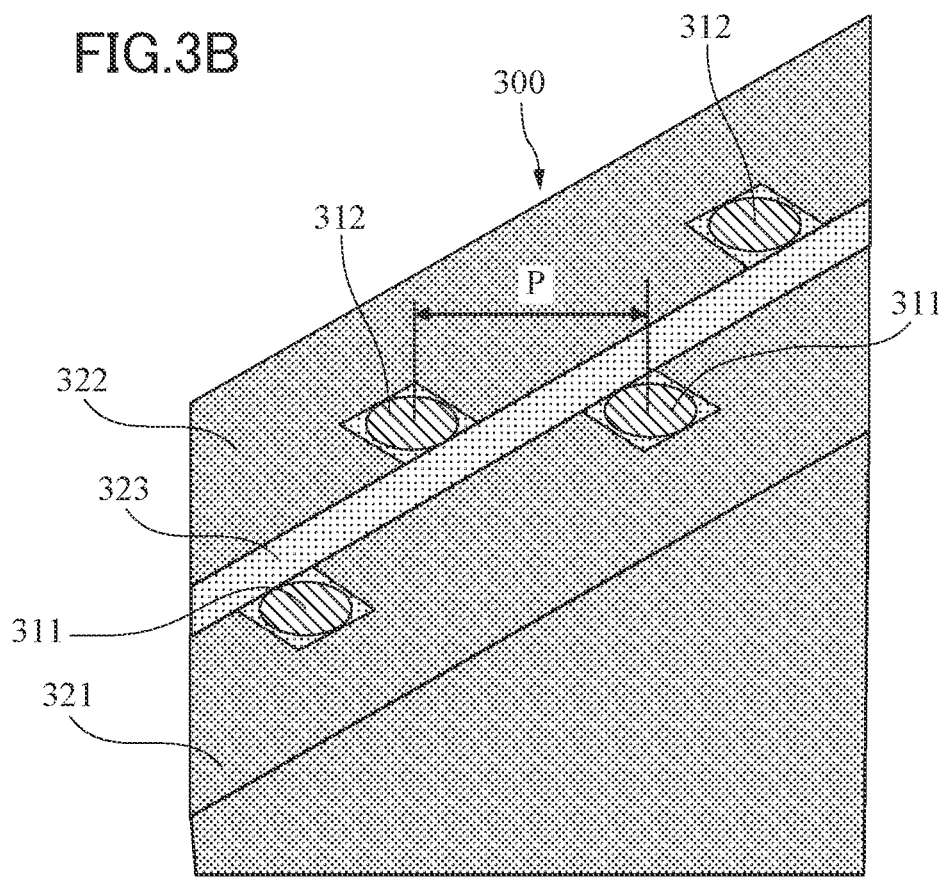
FIG. 3B is an enlarged view of part of the intermediate connection member illustrated in FIG. 3A.

FIG. 3A is a perspective view of an intermediate connection member 300 according to the first embodiment. FIG. 3B is an enlarged view of part of the intermediate connection member 300 illustrated in FIG. 3A.

The intermediate connection member 300 is a rigid board having a rectangular parallelepiped shape, and has a pair of end surfaces 301 and 302 in the Z direction that are each used for bonding. Here, the longitudinal direction of the intermediate connection member 300 is an X direction, the width direction of the intermediate connection member 300 is a Y direction, and the height direction of the intermediate connection member 300 is the Z direction. The Z direction serves as a first direction, the X direction serves as a second direction, and the Y direction serves as a third direction. The X direction, the Y direction, and the Z direction intersect with each other. In the present embodiment, the X direction, the Y direction, and the Z direction are perpendicular to each other.

The intermediate connection member 300 includes a plurality of wiring portions 311 serving as a plurality of first wiring portions, and a plurality of wiring portions 312 serving as a plurality of second wiring portions. The plurality of wiring portions 311 and the plurality of wiring portions 312 constitute the plurality of wiring portions 310 illustrated in FIGS. 2A and 2B.

The intermediate connection member 300 includes an insulating substrate portion 321 serving as a first insulating substrate portion, and an insulating substrate portion 322 serving as a second insulating substrate portion. In addition, the intermediate connection member 300 includes an insulating layer portion 323 disposed between the insulating substrate portions 321 and 322 and formed from a different material from the insulating substrate portions 321 and 322.

The plurality of wiring portions 311 are disposed between the insulating substrate portion 321 and the insulating layer portion 323. In addition, the plurality of wiring portions 311 are arranged at intervals in the X direction. In addition, the plurality of wiring portions 311 are disposed to extend in the Z direction. As a result of this, both end surfaces 3111 and 3112 in the Z direction of each of the plurality of wiring portions 311 are exposed to the outside in both the end surfaces 301 and 302 of the intermediate connection member 300 so as to be bondable to the wiring boards 211 and 221 via solder.

The plurality of wiring portions 312 are disposed between the insulating substrate portion 322 and the insulating layer portion 323. In addition, the plurality of wiring portions 312 are arranged at intervals in the X direction. In addition, the plurality of wiring portions 312 are disposed to extend in the Z direction. As a result of this, both end surfaces 3121 and 3122 in the Z direction of each of the plurality of wiring portions 312 are exposed to the outside in both the end surfaces 301 and 302 of the intermediate connection member 300 so as to be bondable to the wiring boards 211 and 221 via solder.

In addition, the plurality of wiring portions 311 and the plurality of wiring portions 312 are alternately arranged in the X direction. The insulating layer portion 323 is interposed between the plurality of wiring portions 311 and the plurality of wiring portions 312. That is, the plurality of wiring portions 311 and the plurality of wiring portions 312 are separated from each other in the Y direction. Therefore, the plurality of wiring portions 311 and the plurality of wiring portions 312 are arranged in a staggered manner in the X direction. As a result of such staggered arrangement of the plurality of wiring portions 311 and the plurality of wiring portions 312, further highly dense arrangement of wiring can be realized, and thus further miniaturization of the image pickup module 200 can be realized. To be noted, in the case where there is no need to highly densely arrange the wiring, the plurality of wiring portions 311 and the plurality of wiring portions 312 may be arranged to oppose each other instead of being arranged in a staggered manner.

The insulating layer portion 323 is formed by solidifying an adhesive, that is, curing an adhesive. That is, the insulating substrate portion 321, the insulating substrate portion 322, the plurality of wiring portions 311, and the plurality of wiring portions 312 are integrated via the insulating layer portion 323, and thus the intermediate connection member 300 is formed.

The insulating substrate portions 321 and 322 are formed from the same insulating material. The insulating material of the insulating substrate portions 321 and 322 are glass epoxy. Glass epoxy is a material obtained by, for example, impregnating a glass woven fabric, which is obtained by weaving a glass fiber into a cloth shape, with a liquid epoxy resin and thermally hardening the epoxy resin, and is also called epoxy glass, epoxy glass resin, and the like. The insulating layer portion 323 is formed by, for example, solidifying an adhesive containing epoxy resin or silicone resin as a main component. The wiring portions 311 and 312 are each formed from a conductive material such as copper.

The plurality of wiring portions 311 are each formed in the same diameter. Therefore, a wire in which a large current flows, for example, a wiring portion serving as a grounding wire among the plurality of wiring portions 311 may be formed from a different material from the other wiring portions, that is, may be formed from a material having a lower resistivity. The same applies to the plurality of wiring portions 312.

The length L of the intermediate connection member 300 in the X direction is smaller than the lengths of the wiring boards 211 and 221. The width W of the intermediate connection member 300 in the Y direction depends on the areas of the main surfaces 2112 and 2211 of the wiring board 211 and 221 and the method for manufacturing the image pickup module 200.

In the case of erecting the intermediate connection member 300 with respect to the wiring board 221 and bonding the intermediate connection member 300 to the wiring board 221 with solder in a manufacturing process, the width W of the intermediate connection member 300 is preferably 1 mm or more. In addition, in consideration of the highly dense arrangement, the width W of the intermediate connection member 300 is preferably 5 mm or less.

In addition, among electronic parts mounted on the main surface 2211 of the wiring board 221, the memory elements 222 have the largest height. The height H of the intermediate connection member 300 in the Z direction is preferably larger than the height of the memory elements 222. For example, in the case where the height of the memory elements 222 in the Z direction is 1.6 mm, the height H of the intermediate connection member 300 is preferably larger than 1.6 mm.

Among the plurality of wiring portions 311 and the plurality of wiring portions 312, the pitch P between two closest wiring portions 311 and 312 is preferably 0.36 mm to 0.44 mm. As a result of this, the intermediate connection member 300 can be manufactured with high precision while realizing a narrow pitch between the wiring portions 311 and 312.

Figure 4A:
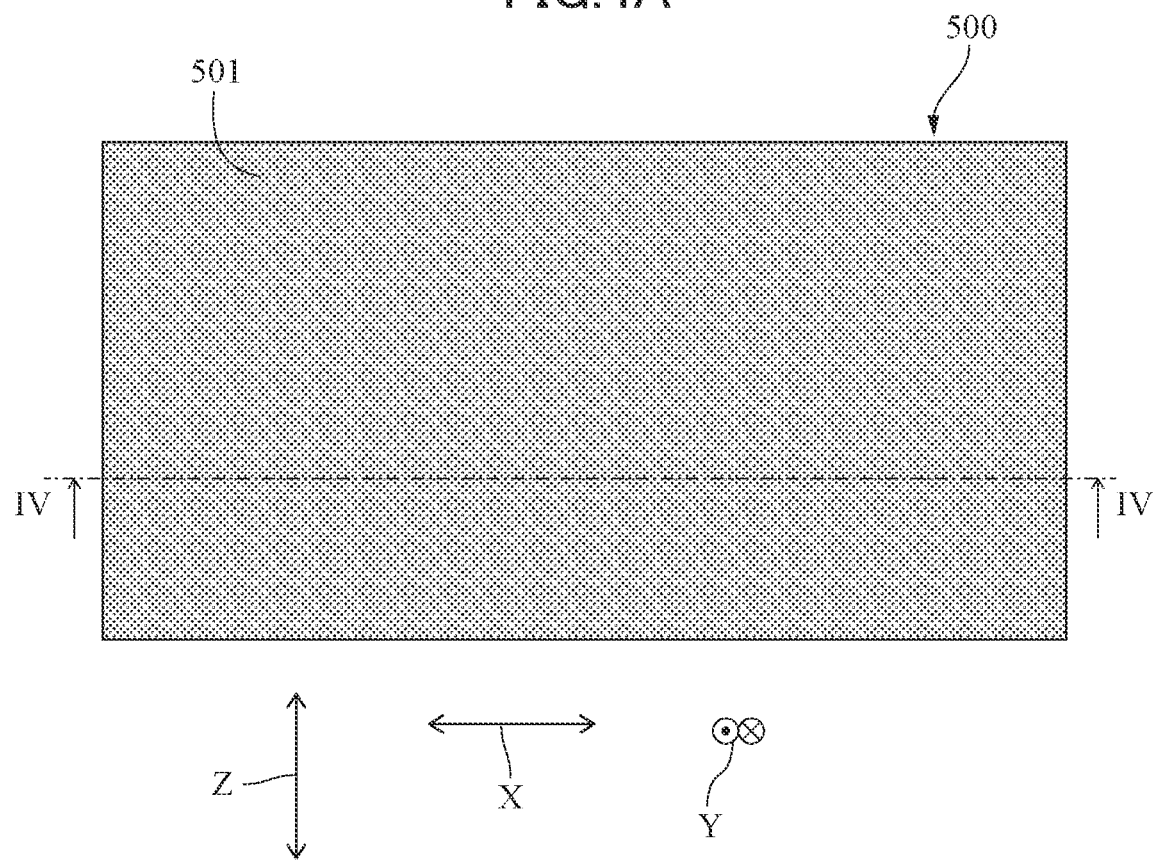
FIG. 4A is a diagram for describing a manufacturing method for the intermediate connection member according to the first embodiment.
Figure 4B:
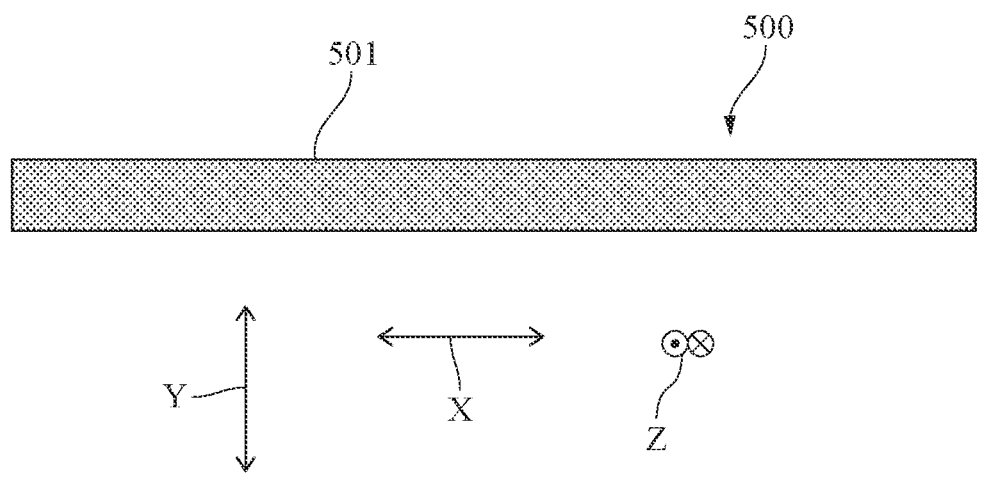
FIG. 4B is a diagram for describing the manufacturing method for the intermediate connection member according to the first embodiment.

A manufacturing method for the intermediate connection member 300 will be described. FIGS. 4A to 4B are diagrams for describing steps of the manufacturing method for the intermediate connection member 300.

In a step illustrated in FIGS. 4A and 4B, a parent material 500 having a plate shape is prepared. FIG. 4A is a plan view of the parent material 500, and FIG. 4B is a section view of the parent material 500 taken along a line IV-IV illustrated in FIG. 4A. Although illustration is omitted herein, two parent materials 500 are prepared. The parent materials 500 are formed from an insulating material such as glass epoxy, for example, FR-4. The thickness W of the intermediate connection member 300 illustrated in FIG. 3A is preferably 5 mm or smaller. Therefore, the thickness of the parent material 500 is preferably 2.5 mm or smaller.

Next, processing of defining a plurality of grooves in the main surface 501 of each of the two parent materials 500 is performed. As a result of this, in a step illustrated in FIGS.

Figure 5A:
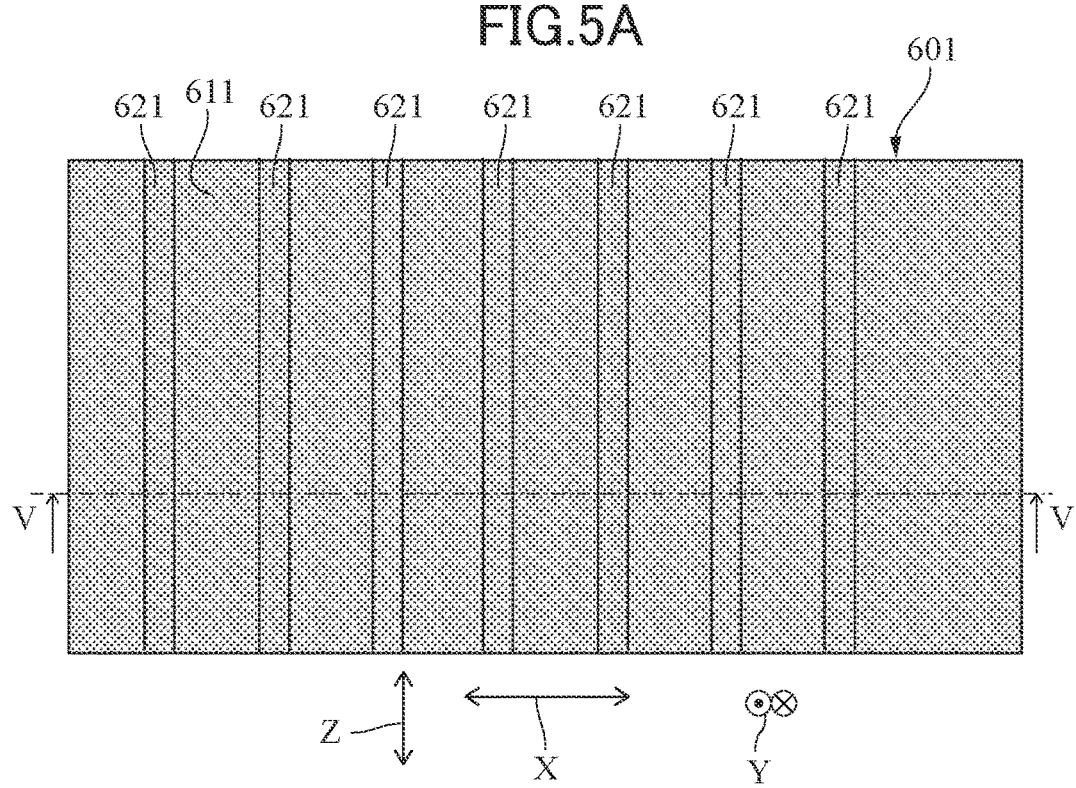
FIG. 5A is a diagram for describing the manufacturing method for the intermediate connection member according to the first embodiment.
Figure 5B:
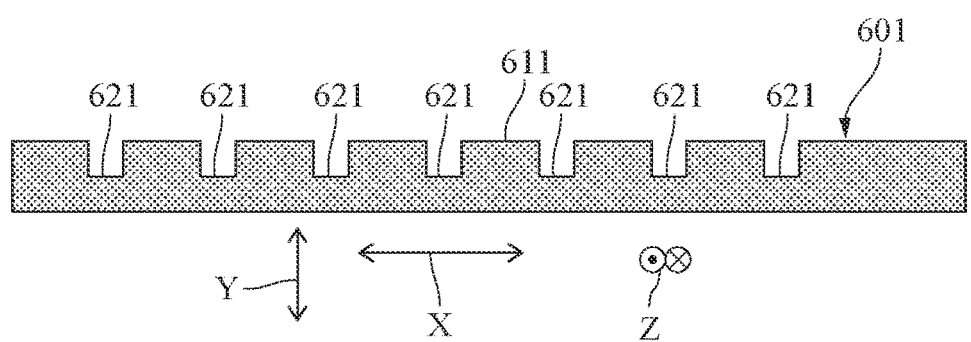
FIG. 5B is a diagram for describing the manufacturing method for the intermediate connection member according to the first embodiment.

5A and 5B, an insulating substrate 601 having a main surface 611 provided with a plurality of grooves 621 is formed. FIG. 5A is a plan view of the insulating substrate 601, and FIG. 5B is a section view of the insulating substrate 601 taken along a line V-V of FIG. 5A. The grooves 621 serve as first grooves. The main surface 611 serves as a first main surface. The insulating substrate 601 serves as a first insulating substrate.

Figure 5C:
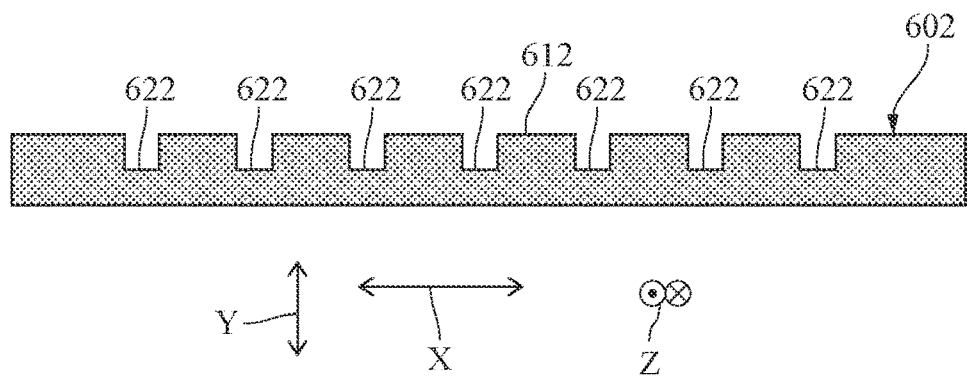
FIG. 5C is a diagram for describing the manufacturing method for the intermediate connection member according to the first embodiment.

Similarly, in a step illustrated in FIG. 5C, an insulating substrate 602 having a main surface 612 provided with a plurality of grooves 622 is formed. FIG. 5C is a section view of the insulating substrate 602. The grooves 622 serve as second grooves. The main surface 612 serves as a second main surface. The insulating substrate 602 serves as a second insulating substrate.

The plurality of grooves 621 are defined at intervals in the X direction so as to extend in the Z direction. Similarly to the plurality of grooves 621, the plurality of grooves 622 are defined at intervals in the X direction so as to extend in the Z direction. Although the plurality of grooves 621 and the plurality of grooves 622 are each defined in a linear shape in the present embodiment, the plurality of grooves 621 and the plurality of grooves 622 may be each defined in a curved shape.

The width and depth of each of the grooves 621 and 622 are set in accordance with the diameter of the wiling portions 311 and 312 to be formed. For example, in the case where the diameter of a wire that will be described later is φ0.2 mm, the width and depth of each of the grooves 621 and 622 are preferably each set to about 0.2 mm equal to the diameter of the wire. In addition, it is preferable that the pitch of the plurality of grooves 621 and the pitch of the plurality of grooves 622 are set to the same value, and for example, each pitch is set to about 0.57 mm.

Although the shape of the cross-section of each of the grooves 621 and 622 is a rectangular shape in the present embodiment, the shape of the cross-section is not limited to this, and may be, for example, a semicircular shape. Although the processing to define the grooves 621 and 622 is preferably performed by machining using a dicer apparatus or a slicer apparatus, the grooves 621 and 622 may be defined by masking the parent material 500 by a resist or the like and physically processing the parent material 500 using a milling apparatus. In addition, the insulating substrates 601 and 602 may be molded by using molds having shapes suitable for defining the grooves. Forming an insulating substrate having a plurality of grooves close to each other is easier than forming an insulating substrate having a plurality of through holes close to each other. Therefore, the insulating substrate 601 having the plurality of grooves 621 and the insulating substrate 602 having the plurality of grooves 622 can be formed with high precision.

Figure 6A:
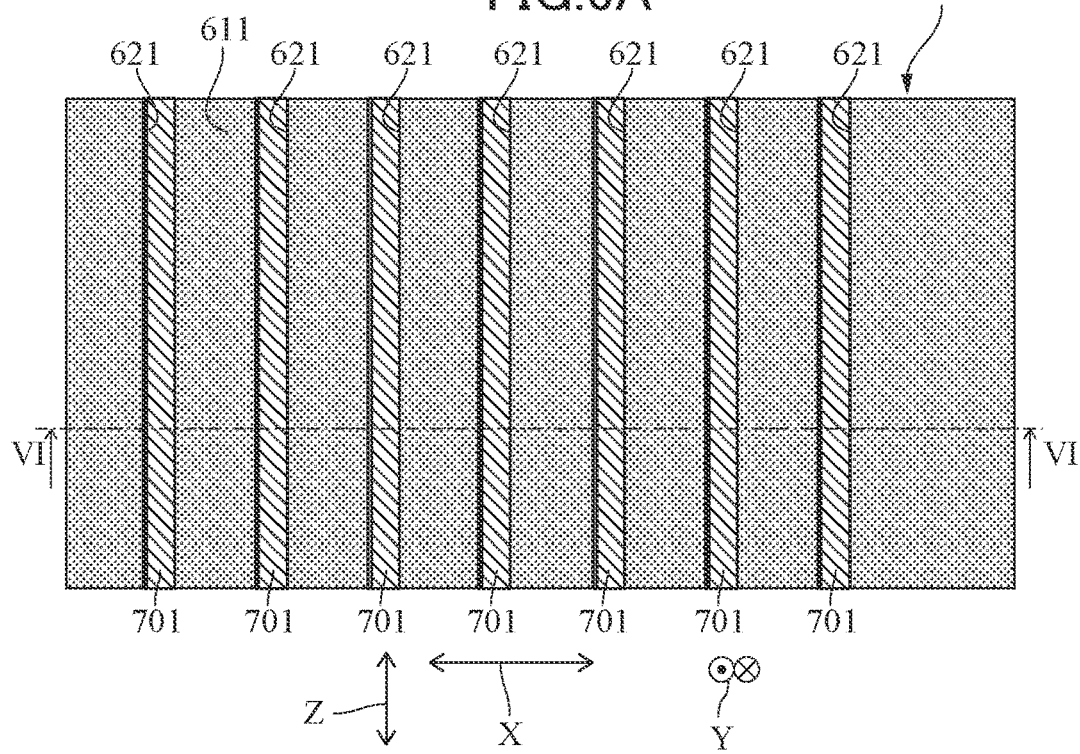
FIG. 6A is a diagram for describing the manufacturing method for the intermediate connection member according to the first embodiment.
Figure 6B:
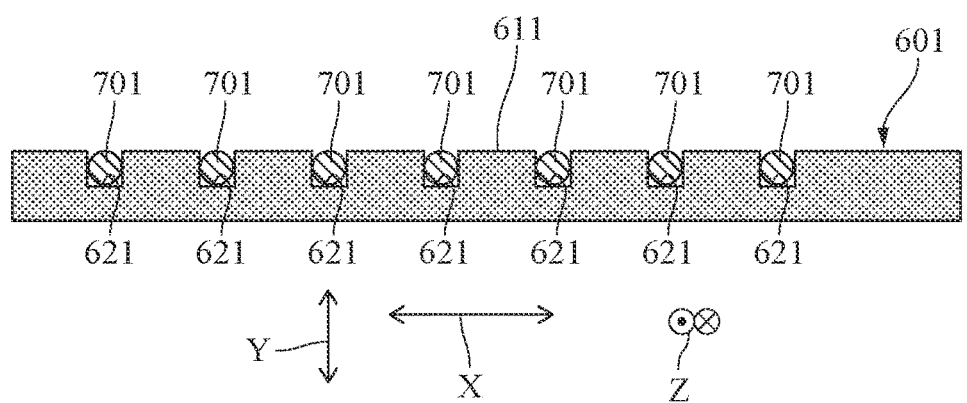
FIG. 6B is a diagram for describing the manufacturing method for the intermediate connection member according to the first embodiment.
Figure 6C:
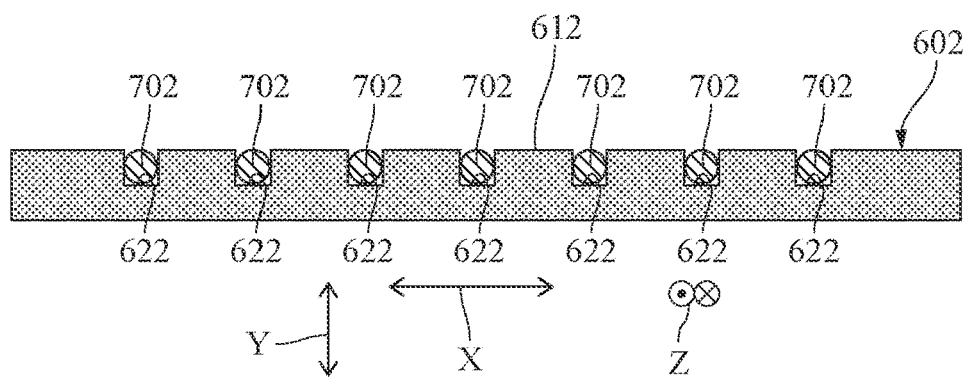
FIG. 6C is a diagram for describing the manufacturing method for the intermediate connection member according to the first embodiment.

Next, in a step illustrated in FIGS. 6A and 6B, a plurality of conductive members 701 are disposed in the plurality of grooves 621. FIG. 6A is a plan view of the insulating substrate 601 in which the plurality of conductive members 701 are disposed, and FIG. 6B is a section view of the insulating substrate 601 in which the plurality of conductive members 701 are disposed taken along a line VI-VI of FIG. 6A. The conductive members 701 serve as first conductive members. Similarly, in a step illustrated in FIG. 6C, a plurality of conductive members 702 are disposed in the plurality of grooves 622. FIG. 6C is a section view of the insulating substrate 602 in which the plurality of conductive members 702 are disposed. The conductive members 702 serve as second conductive members.

The plurality of conductive members 701 and the plurality of conductive members 702 are each a wire formed from metal such as copper. The diameter of each of the conductive members 701 is set to the same value in the present embodiment. The diameter of each of the conductive members 702 is also set to the same value in the present embodiment. In addition, the diameter of each of the conductive members 701 and the diameter of each of the conductive members 702 are also set to the same value in the present embodiment.

Although the cross-sectional shape of the wire is a circular shape in the present embodiment, the cross-sectional shape is not limited to this, and may be a polygonal shape such as a quadrangular shape. In the step illustrated in FIGS. 6A and 6B, the plurality of conductive members 701 are fitted in the plurality of grooves 621. In the step illustrated in FIG. 6C, the plurality of conductive members 702 are fitted in the plurality of grooves 622. As a result of this, droppage of the conductive members 701 from the grooves 621 of the insulating substrate 601 in later steps can be suppressed, and droppage of the conductive members 702 from the grooves 622 of the insulating substrate 602 in later steps can be suppressed.

When fitting the conductive members 701 in the grooves 621, an unillustrated adhesive may be applied in the grooves 621 to advance. Similarly, when fitting the conductive members 702 in the grooves 622, an unillustrated adhesive may be applied in the grooves 622 in advance. As this adhesive, an adhesive that hardens at about a room temperature is preferably selected. As a result of this, droppage of the conductive members 701 from the grooves 621 of the insulating substrate 601 can be effectively suppressed, and droppage of the conductive members 702 from the grooves 622 of the insulating substrate 602 can be effectively suppressed.

To be noted, although fitting the wires in the grooves is preferable as a method of disposing the conductive members 701 and 702 in the grooves 621 and 622, the method is not limited to this. For example, the conductive members may be formed by applying a conductive paste in the grooves by a dispenser or the like and firing the paste. The material of the conductive members 701 and 702 may be formed from any material as long as the material is conductive. For example, the material may be an inorganic material such as copper, silver, or aluminum, or an organic material such as conductive rubber.

The diameter and thickness of the conductive members 701 and 702 are preferably 0.05 mm or more and 2 mm or less in consideration of bondability to the pads of the wiring boards 211 and 221 via solder, and handleability and deformation of the conductive members 701 and 702 when disposing the conductive members 701 and 702 in the grooves 621 and 622. In consideration of the highly dense arrangement of wires, the diameter and thickness of the conductive members 701 and 702 are more preferably 0.5 mm or less.

Figure 7A:
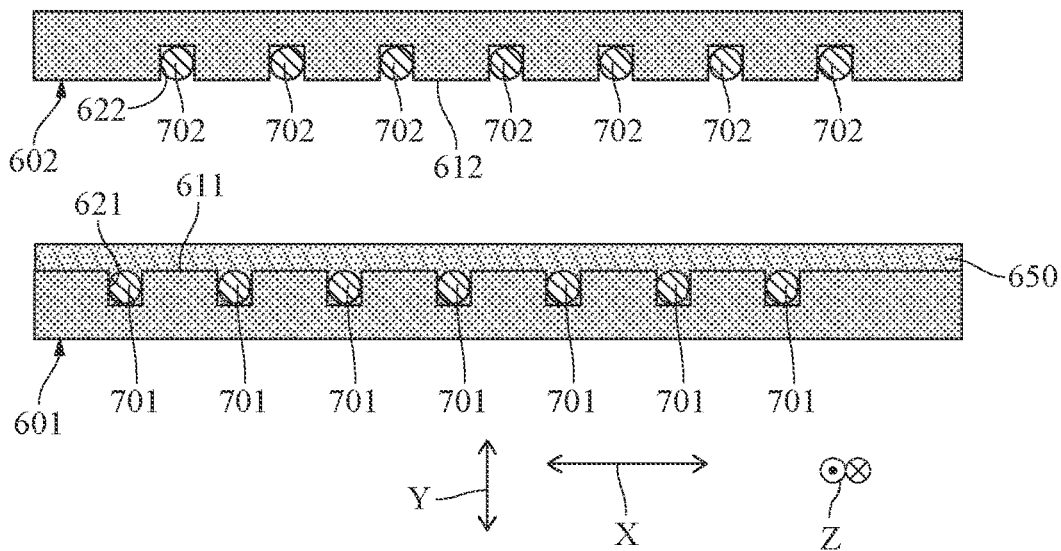
FIG. 7A is a diagram for describing the manufacturing method for the intermediate connection member according to the first embodiment.

Next, steps for forming a structure 800 illustrated in FIGS. 7A to 7C will be described. In this series of steps, the structure 800 is formed by sticking together the main surface 611 of the insulating substrate 601 and the main surface 612 of the insulating substrate 602 with the insulating member 651 therebetween such that the direction in which the plurality of conductive members 701 extend and the direction in which the plurality of conductive members 702 extend are aligned. In this series of steps, the structure 800 is formed by sticking together the main surface 611 of the insulating substrate 601 and the main surface 612 of the insulating substrate 602 such that the plurality of conductive members 701 and the plurality of conductive members 702 are alternately arranged in the X direction.

The steps of forming the structure 800 illustrated in FIGS. 7A to 7C will be described in detail below. First, in the step illustrated in FIG. 7A, an adhesive 650 is applied on the main surface 611 of the insulating substrate 601. The adhesive 650 is, for example, an insulating adhesive containing epoxy resin or silicone resin as a main component. As the adhesive 650, for example, an adhesive that is thermally cured at about 100° C. can be selected.

Figure 7B:
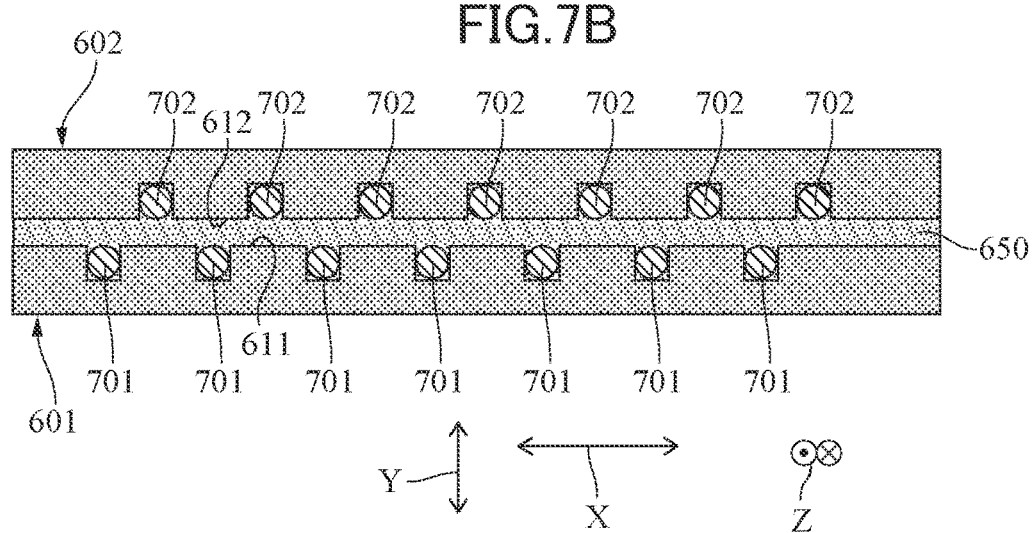
FIG. 7B is a diagram for describing the manufacturing method for the intermediate connection member according to the first embodiment.

Next, in the step illustrated in FIG. 7B, before the adhesive 650 is cured, the main surface 612 of the insulating substrate 602 is brought into contact with the adhesive 650 such that the adhesive 650 is sandwiched between the main surfaces 611 and 612. The insulating substrates 601 and 602 are aligned by an unillustrated alignment apparatus. As a result of this, the main surface 611 of the insulating substrate 601 and the main surface 612 of the insulating substrate 602 are stuck together with the plurality of conductive members 701 and the plurality of conductive members 702 therebetween while controlling the thickness of the layer of the adhesive 650. The alignment between the insulating substrates 601 and 602 may be performed by causing the end surfaces of the insulating substrates 601 and 602 to abut an unillustrated abutting member, or may be performed by using an unillustrated alignment mark that is formed in advance. In addition, an insulating spacer serving as a thickness regulating material may be mixed in the adhesive 650 for the purpose of controlling the thickness of the layer of the adhesive 650.

Figure 7C:
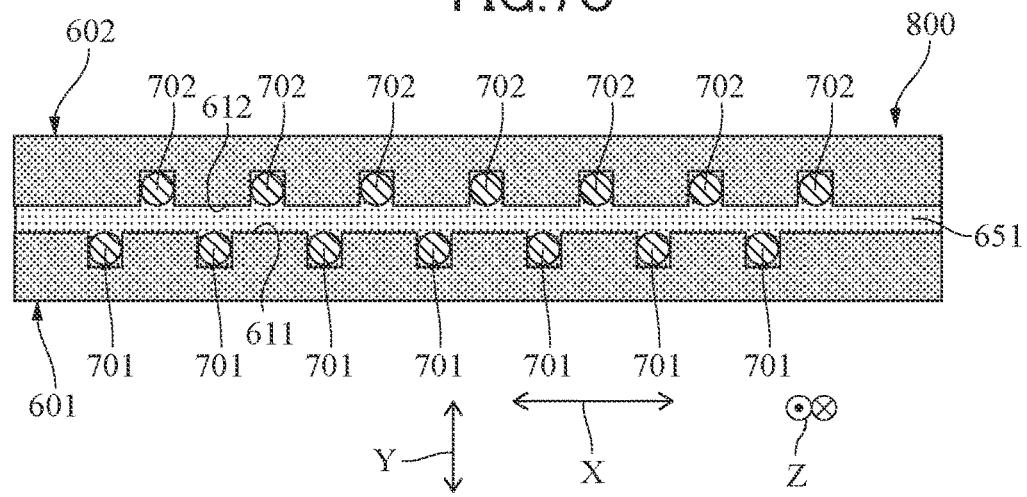
FIG. 7C is a diagram for describing the manufacturing method for the intermediate connection member according to the first embodiment.

Then, in the step illustrated in FIG. 7C, the adhesive 650 is cured to form the insulating member 651. As described above, by sticking together the main surface 611 of the insulating substrate 601 and the main surface 612 of the insulating substrate 602 by using the adhesive 650, the insulating member 651 is formed from the solidified adhesive 650.

In the present embodiment, the structure 800 is processed to form the intermediate connection member 300. The insulating substrate 601 in the structure 800 corresponds to the insulating substrate portion 321 in the intermediate connection member 300. The insulating substrate 602 in the structure 800 corresponds to the insulating substrate portion 322 in the intermediate connection member 300. The insulating member 651 in the structure 800 corresponds to the insulating layer portion 323 in the intermediate connection member 300. The conductive members 701 in the structure 800 correspond to the wiring portions 311 in the intermediate connection member 300. The conductive members 702 in the structure 800 correspond to the wiring portions 312 in the intermediate connection member 300.

The thickness of the insulating member 651 that becomes the insulating layer portion 323 in the Y direction is preferably 10 μm or more from the viewpoint of suppressing peeling of the insulating substrate portions 321 and 322 illustrated in FIG. 3A in a subsequent reflow step. In the case where the thickness is smaller than 10 μm, the insulating substrate portions 321 and 322 may be peeled off from each other or the conductive members 701 and 702 may short-circuit when the conductive members 701 and 702 are disposed to oppose each other. In addition, the thickness of the insulating member 651 that becomes the insulating layer portion 323 in the Y direction is preferably 300 μm or less in consideration of the deformation of the conductive members or the like. In the case where the thickness is larger than 300 μm, the conductive members may be deformed or the insulating layer portion 323 may not have a sufficient mechanical strength due to absorption of moisture. That is, the thickness of the insulating member 651 that becomes the insulating layer portion 323 in the Y direction is preferably 10 μm to 300 μm. Therefore, the thickness of the insulating layer portion 323 in the Y direction is preferably 10 μm to 300 μm.

Figure 8A:
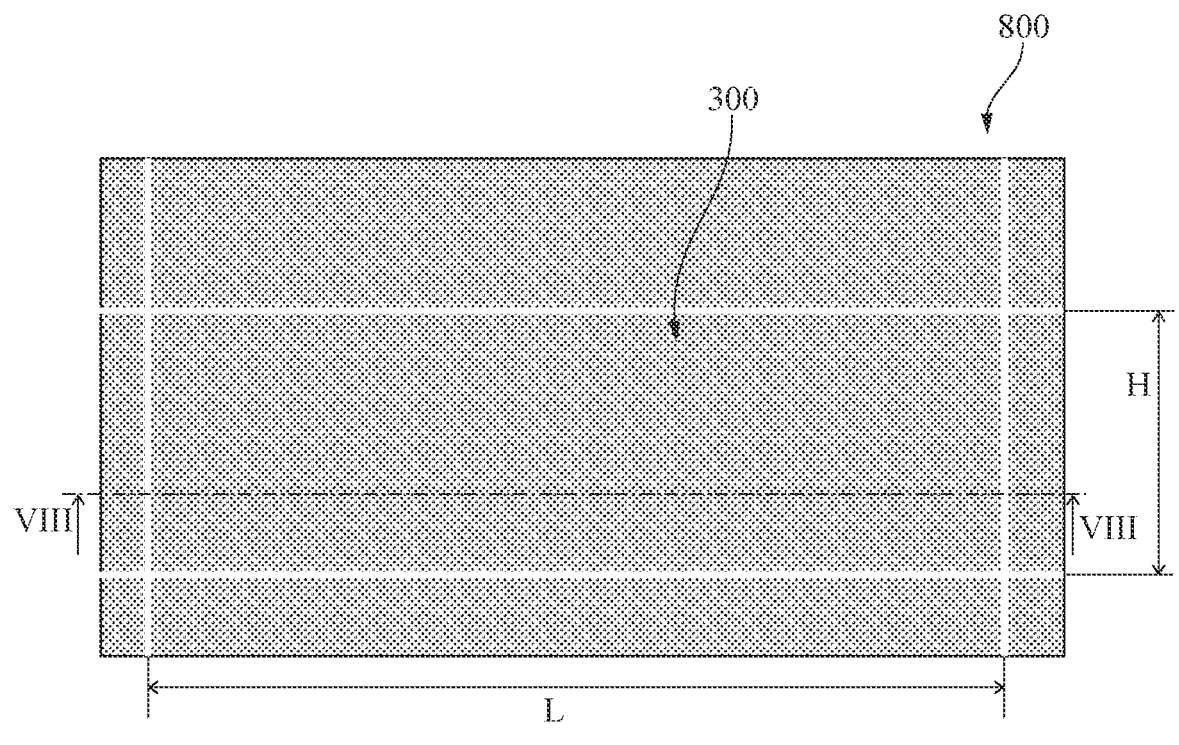
FIG. 8A is a diagram for describing the manufacturing method for the intermediate connection member according, to the first embodiment.
Figure 8B:
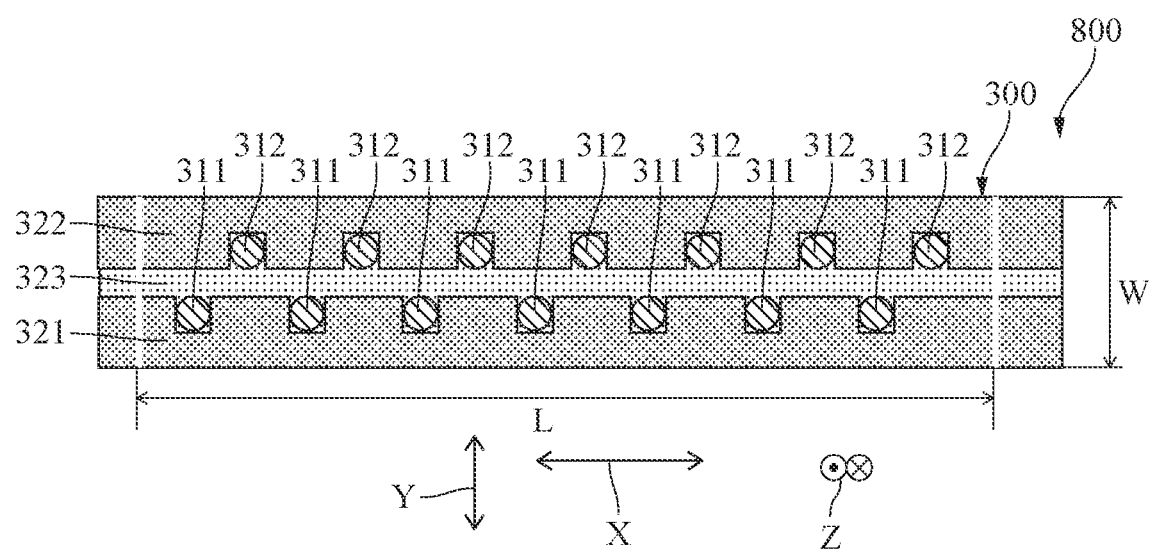
FIG. 8B is a diagram for describing the manufacturing method for the intermediate connection member according to the first embodiment.

Next, in the step illustrated in FIGS. 8A and 8B, the structure 800 is cut in the X direction. FIG. 8A is a plan view of the structure 800, and FIG. 8B is a section view of the structure 800 taken along a line VIII-VIII of FIG. 8A By cutting the structure 800 in the X direction along lines separated from each other by a distance of in the Z direction, the end surfaces 3111, 3112, 3121, and 3122 of the wiring portions 311 and 312 illustrated in FIG. 3A can be exposed. In the present embodiment, by cutting the structure 800 in the X direction and the Z direction, the intermediate connection member 300 having a predetermined size, that is, having a length L, a height H, and a width W that are predetermined can be formed. For example, the intermediate connection member 300 in which the thickness of each of the insulating substrate portions 321 and 322 in the Y direction is 0.5 mm and the thickness of the insulating layer portion 323 in the Y direction is 0.085 mm, and which has a length L of 41.0 mm, a height H of 2.0 mm, and a width W of 1.085 mm is formed. The structure 800 is cut by using a dicer apparatus, a wire saw apparatus, or the like. In this step, one intermediate connection member 300 may be formed from one structure 800, or a plurality of intermediate connection members 300 may be formed from one structure 800. In the case of forming a plurality of intermediate connection members 300 from one structure 800, the one structure 800 may be cut along the X direction at intervals of H in the Z direction. In addition, the one structure 800 may be cut along the Z direction at intervals of L in the X direction.

To be noted, the direction in which the structure 800 is cut may be diagonal with respect to the conductive members 701 and 702. In this case, the end surfaces of the wiring portions that are formed have elliptical shapes, which have a larger sectional area than circular shapes, and therefore the bonding area with solder can be larger.

According to the manufacturing process as described above, the intermediate connection member 300 in which the wiring portions 311 and 312 are arranged with high precision as illustrated in FIG. 3A can be obtained. In addition, the highly precise intermediate connection member 300 including the wiring portions 311 and 312 that are highly densely arranged at a small pitch can be obtained.

Here, the pitch between the two closest wiring portions among the plurality of wiring portions 311 and 312 is denoted by P. A ratio H/P of the height H of the intermediate connection member 300 in the Z direction to the pitch P is preferably 4 or more. For example, if the pitch P is set to 0.4 mm and the height is set to 2.0 mm, the ratio H/P is 5. As described above, the intermediate connection member 300 having a large height H can be formed while highly densely arranging the wiring portions 311 and 312.

Next, a manufacturing method for the image pickup module will be described. FIGS. 9A to 10C are diagrams for describing steps of the manufacturing method for the image pickup module 200 according to the first embodiment.

Figure 9A:
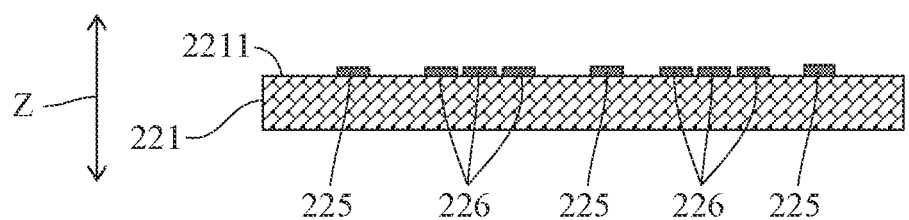
FIG. 9A is a diagram for describing a manufacturing method for an image pickup module according to the first embodiment.
Figure 9B:
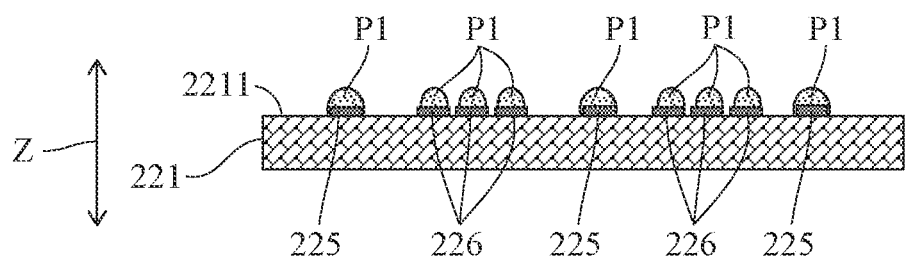
FIG. 9B is a diagram for describing the manufacturing method for the image pickup module according to the first embodiment.

As illustrated in FIG. 9A, the wiring hoard 221 is prepared. Then, a solder paste P1 containing solder powder and flux is supplied onto pads 225 and 226 on the wiring board 221 as illustrated in FIG. 9B. As the solder powder, for example, a solder powder of Sn—Ag—Cu is used. The solder paste P1 can be supplied by, for example, screen printing or using a dispenser.

The solder paste P1 may be supplied to cover the entirety of the surface of the pads 225 and 226, or supplied to cover part of the surface of the pads 225 and 226 similarly to so-called offset printing.

Figure 9C:
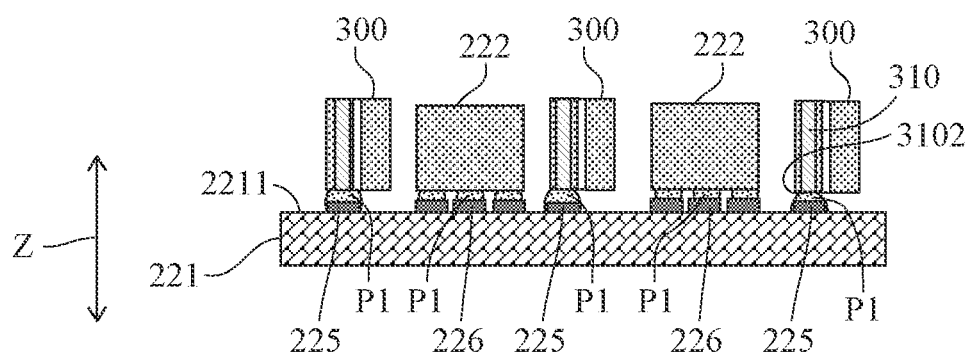
FIG. 9C is a diagram for describing the manufacturing method for the image pickup module according to the first embodiment.

Next, as illustrated in FIG. 9C, the memory elements 222, the intermediate connection members 300, and unillustrated chip parts are placed on the wiring board 211 as illustrated in FIG. 9C. The unillustrated chip pans are, for example, capacitors or resistors. The memory elements 222, the intermediate connection members 300, and the unillustrated chip members are placed on corresponding pads by using a mounter or the like. That is, the memory elements 222 are placed on the pads 226, and the intermediate connection members 300 are placed on the pads 225. At this time, the intermediate connection members 300 are mounted on the wiring board 221 such that the end surfaces 3102 of the wiring portions 310 of the intermediate connection members 300 are in contact with the solder paste P1. The intermediate connection members 300 are preferably capable of erecting without any support mechanism after being mounted on the wiring board 221.

Figure 10A:
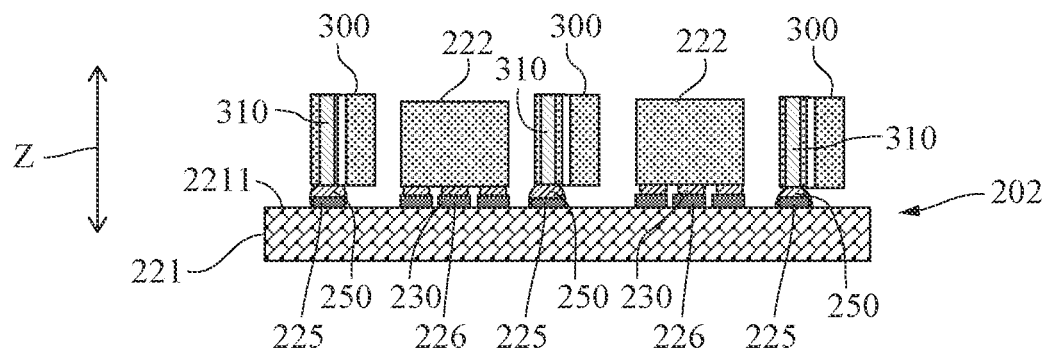
FIG. 10A is a diagram for describing the manufacturing method for the image pickup module according to the first embodiment.

Next, in an unillustrated reflow furnace, a reflow processing in which the solder paste P1 is heated to a temperature equal to or higher than the melting point of the solder powder to melt and aggregate the solder powder, and then cooled to a temperature lower than the melting point of the solder powder to solidify the solder paste P1 is performed. As a result of the solidification of solder, the memory elements 222, the intermediate connection members 300, and the unillustrated chip parts are electrically and mechanically bonded to the wiring board 221 as illustrated in FIG. 10A. That is, a structure in which the intermediate connection members 300 and the circuit unit 202 are bonded via solder is manufactured. The wiring portions 310 of the intermediate connection members 300 are electrically connected to the pads 225 via solder 250.

Figure 10B:
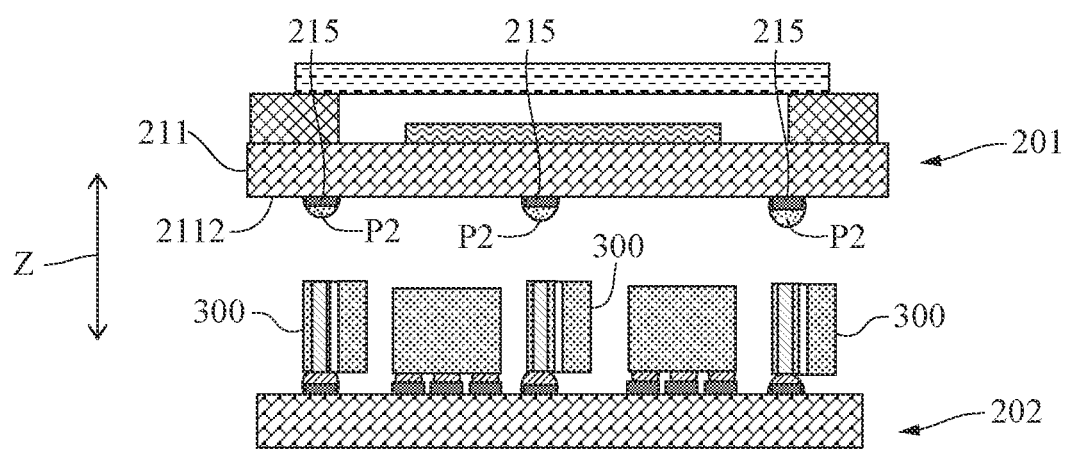
FIG. 10B is a diagram for describing the manufacturing method for the image pickup module according to the first embodiment.

Next, as illustrated in FIG. 10B, a solder paste P2 containing solder powder and flux is supplied onto the pads 215 on the wiring board 211. As the solder powder, for example, a solder powder of Sn—Ag—Cu is used. The solder paste P2 can be supplied by, for example, screen printing or using a dispenser. The solder paste P2 may be supplied to cover the entirety of the surface of the pads 215, or supplied to cover part of the surface of the pads 215 similarly to so-called offset printing.

Figure 10C:
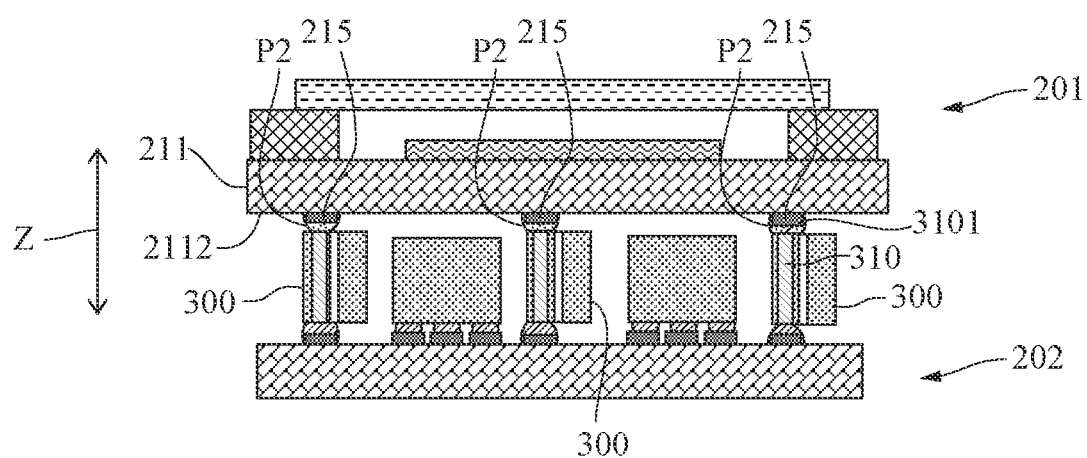
FIG. 10C is a diagram for describing the manufacturing method for the image pickup module according to the first embodiment.

Then, as illustrated in FIG. 10C, the circuit unit 201 is mounted on the intermediate connection members 300 on the circuit unit 202. the circuit unit 201 is placed on the intermediate connection members 300 by using a mounter or the like. At this time, the circuit unit 201 is mounted on the intermediate connection members 300 such that the solder paste P2 is in contact with the end surfaces 3101 of the wiring portions 310 of the intermediate connection members 300.

Next, in an unillustrated reflow furnace, a reflow processing in which the solder paste P2 is heated to a temperature equal to or higher than the melting point of the solder powder to melt and aggregate the solder powder, and then cooled to a temperature lower than the melting point of the solder powder to solidify the solder paste P2 is performed. As a result of the solidification of solder, the intermediate connection members 300 are bonded to the circuit unit 201 via solder, and thus the image pickup module 200 illustrated in FIG. 2B is manufactured.

In the image pickup module 200 manufactured in this manner, there is no connection failure between the intermediate connection members 300 and the circuit units 201 and 202, and therefore sufficient optical performance of the image sensor 212 included in the circuit unit 201 can be assured.

Second Embodiment

Figure 11A:
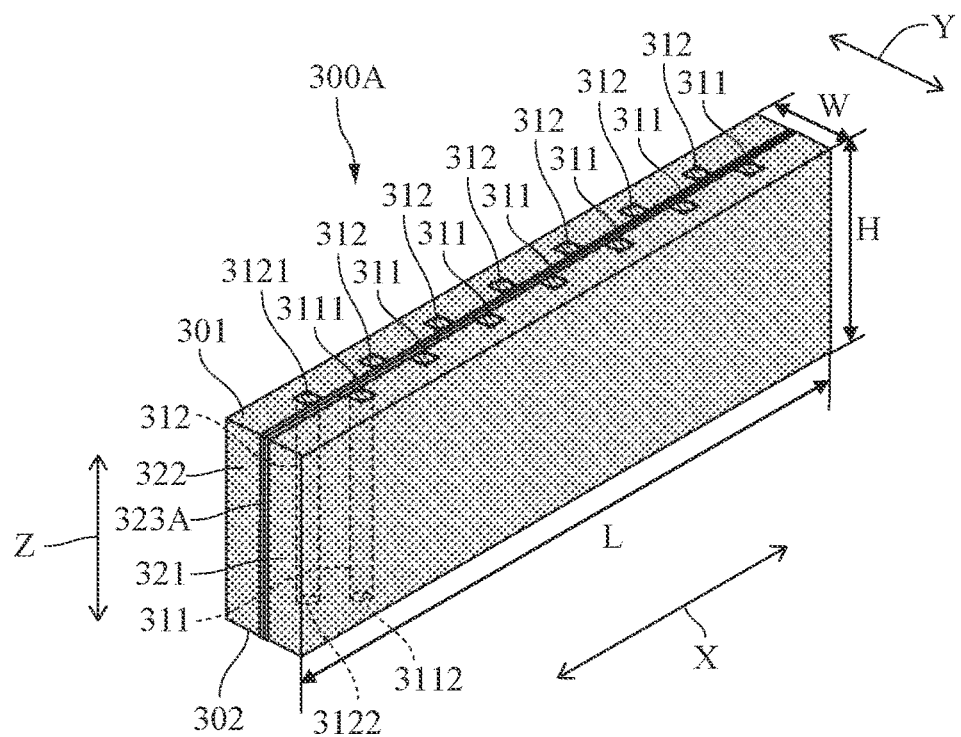
FIG. 11A is a perspective view of an intermediate connection member according to a second embodiment.
Figure 11B:
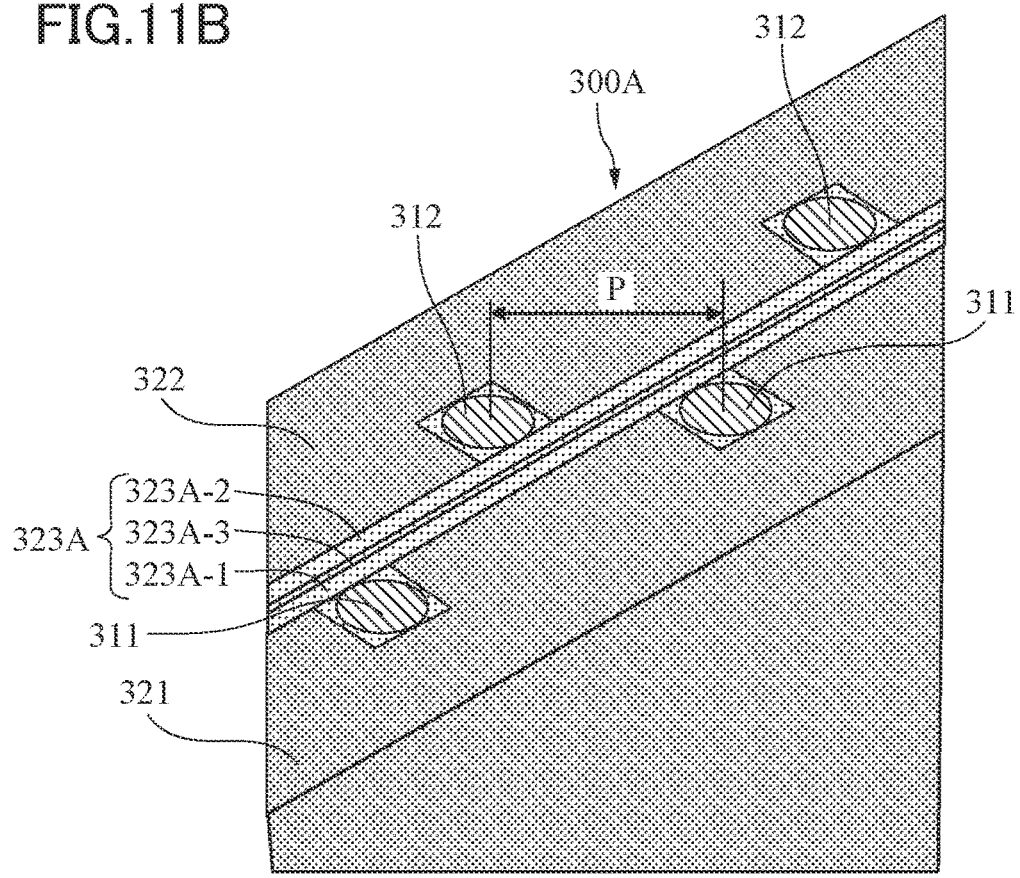
FIG. 11B is an enlarged view of part of the intermediate connection member illustrated in FIG. 11A.

Next, intermediate connection members according to a second embodiment will be described. FIG. 11A is a perspective view of an intermediate connection member 300A according to the second embodiment. FIG. 11B is an enlarged view of part of the intermediate connection member 300A illustrated in FIG. 11A. To be noted, in the second embodiment, substantially the same elements as in the first embodiment will be denoted by the same reference signs in the drawings, and description thereof will be omitted.

The intermediate connection member 300A is a rigid board having a rectangular parallelepiped shape, and the pair of end surfaces 301 and 302 thereof in the Z direction each serve as a connecting surface. The intermediate connection member 300A includes the plurality of wiring portions 311 and the plurality of wiring portions 312.

The intermediate connection member 300A includes the insulating substrate portions 321 and 322. In addition, the intermediate connection member 300A includes an insulating layer portion 323A provided between the insulating substrate portions 321 and 322 and formed from a different material from the insulating substrate portions 321 and 322.

The plurality of wiring portions 311 are disposed between the insulating substrate portion 321 and the insulating layer portion 323A. The plurality of wiring portions 312 are disposed between the insulating substrate portion 322 and the insulating layer portion 323A.

The insulating layer portion 323A includes three insulating layers 323A-1, 323A-2, and 323A-3. The insulating layer 323A-1 serves as a first insulating layer. The insulating layer 323A-2 serves as a second insulating layer. The insulating layer 323A-3 serves as a third insulating layer. The insulating layers 323A-1 and 323A-2 are formed by solidification of an adhesive of the same material. The insulating layer 323A-3 is disposed between the insulating layers 323A-1 and 323A-2. The insulating layer 323A-3 is formed from a different material from the insulating layers 323A-1 and 323A-3. The insulating layers 323A-1 and 323A-2 are formed by, for example, curing an adhesive containing epoxy resin or silicone resin as a main component. The insulating layer 323A-3 is formed from, for example, polyimide.

The thickness W of the insulating layer portion 323A in the Y direction is preferably 10 µm to 300 µm as in the first embodiment.

Next, a manufacturing method for the intermediate connection member 300A according to the second embodiment will be described. Steps of the manufacturing method for the intermediate connection member 300A according to the second embodiment will be described below with reference to FIGS. 12A to 12D. The manufacturing method for the intermediate connection member 300A according to the second embodiment is the same as the manufacturing method for the intermediate connection member 300 according to the first embodiment except for the steps of forming a structure illustrated in FIGS. 7A to 7C. That is, a structure 800A formed in steps illustrated in FIGS. 12A to 12D is different from the structure 800 formed in the first embodiment. Therefore, only the steps for forming the structure 800A illustrated in FIGS. 12A to 12D will be described. In this series of steps, the structure 800A is formed by sticking together the main surface 611 of the insulating substrate 601 and the main surface 612 of the insulating substrate 602 with an insulating member 651A therebetween such that the direction in which the plurality of conductive members 701 extend and the direction in which the plurality of conductive members 702 extend are aligned. In this series of steps, the structure 800A is formed by sticking together the main surface 611 of the insulating substrate 601 and the main surface 612 of the insulating substrate 602 such that the plurality of conductive members 701 and the plurality of conductive members 702 are alternately arranged in the X direction.

In the steps for forming the structure 800A illustrated in FIGS. 12A to 12D, the insulating member 651A is formed by sticking together the main surface 611 of the insulating substrate 601 and the main surface 612 of the insulating substrate 602 by an adhesive with an insulating sheet 650A-3 therebetween. The steps for forming the structure 800A will be described in detail below. First, in the step illustrated in FIG. 12A, an adhesive 650A-1 is applied on the main surface 611 of the insulating substrate 601. The adhesive 650A-1 is, for example, an insulating adhesive containing epoxy resin or silicone resin as a main component.

Figure 12A:
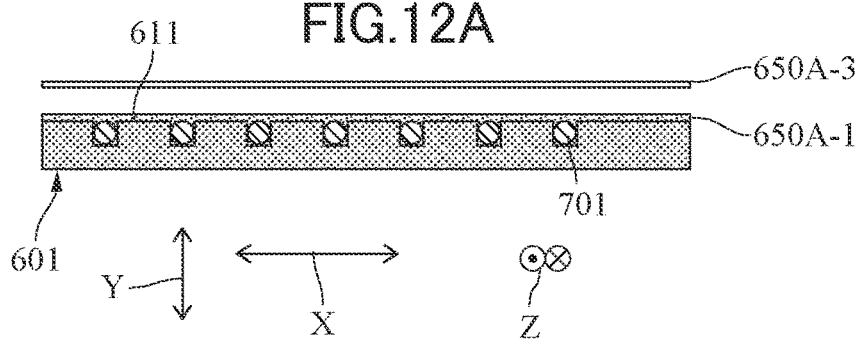
FIG. 12A is a diagram for describing a manufacturing method for the intermediate connection member according to the second embodiment.
Figure 12B:
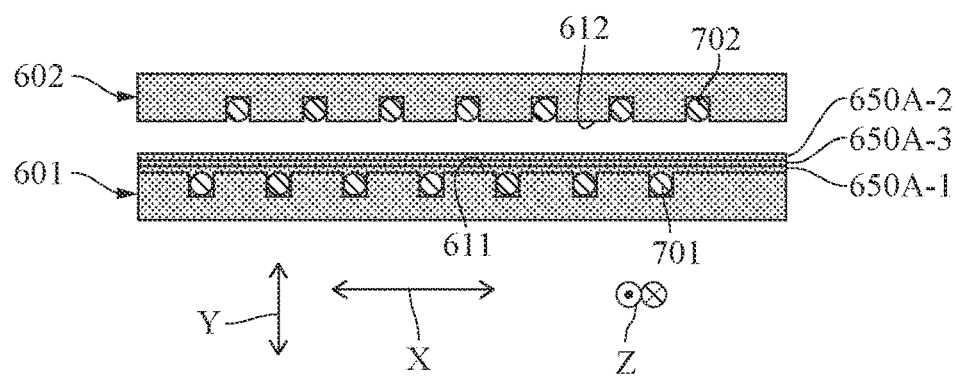
FIG. 12B is a diagram for describing the manufacturing method for the intermediate connection member according to the second embodiment.

Next, in the step illustrated in FIG. 12B, the insulating sheet 650A-3 is placed on the adhesive 650A-1 before the adhesive 650A-1 is cured, and then further an adhesive 650A-2 having the same composition as the adhesive 650A-1 is applied on the insulating sheet 650A-3. The insulating sheet 650A-3 is a sheet having a film shape and formed from polyimide or the like.

Figure 12C:
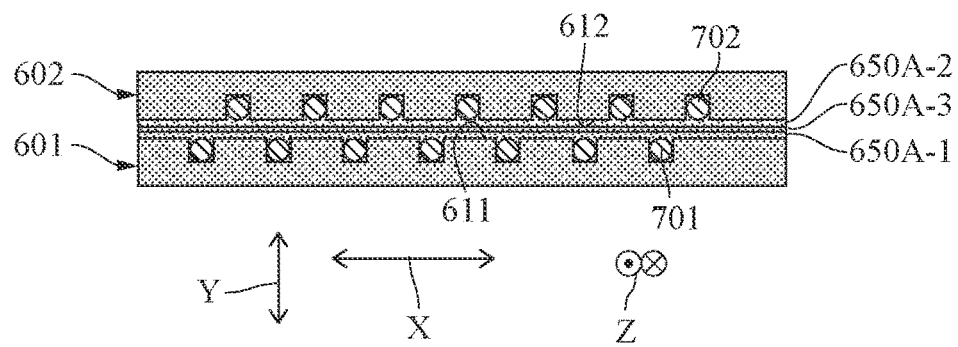
FIG. 12C is a diagram for describing the manufacturing method for the intermediate connection member according to the second embodiment.

Next, in the step illustrated in FIG. 12C, the main surface 612 of the insulating substrate 602 is brought into contact with the adhesive 650A-2. The insulating substrates 601 and 602 are aligned by an unillustrated alignment apparatus. The insulating sheet 650A-3 defines the thickness of each layer of the adhesives 650A-1 and 650A-2 in the direction, and thus the thickness of the layers of the adhesives 650A-1 and 650A-2 in the Y direction are made uniform. As a result of this, the main surface 611 of the insulating substrate 601 and the main surface 612 of the insulating substrate 602 are stuck together with the plurality of conductive members 701 and the plurality of conductive members 702 therebetween while controlling the thickness of the layers of the adhesives 650A-1 and 650A-2. The alignment between the insulating substrates 601 and 602 may be performed by causing the end surfaces of the insulating substrates 601 and 602 to abut an unillustrated abutting member, or may be performed by using an unillustrated alignment mark that is formed in advance.

Figure 12D:
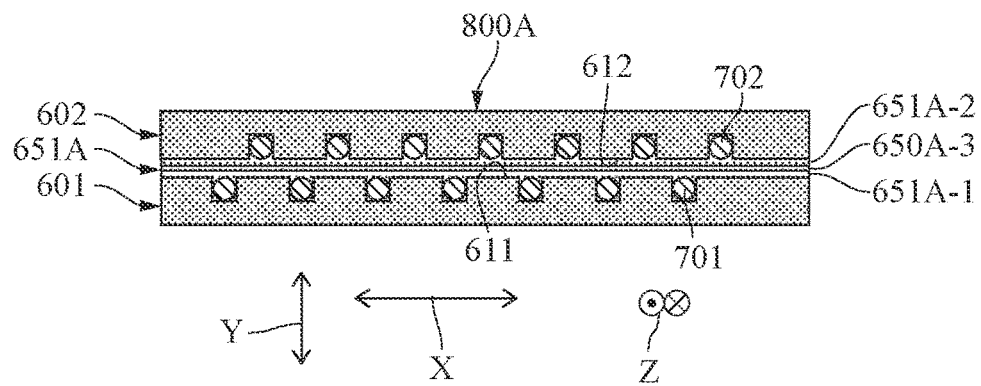
FIG. 12D is a diagram for describing the manufacturing method for the intermediate connection member according to the second embodiment.

Then, the adhesives 650A-1 and 650A-2 are cured to form the insulating member 651A illustrated in FIG. 12D. The insulating member 651A is constituted by an insulating layer 651A-1 formed by curing the adhesive 650A-1, an insulating layer 651A-2 formed by curing the adhesive 650A-2, and the insulating sheet 650A-3.

In the present embodiment, the intermediate connection member 300A is formed by cutting the structure 800A. The cutting method thereof is substantially the same as in the first embodiment. The insulating substrate 601 in the structure 800A corresponds to the insulating substrate portion 321 in the intermediate connection member 300A. The insulating substrate 602 in the structure 800A corresponds to the insulating substrate portion 322 in the intermediate connection member 300A. The insulating member 651A in the structure 800A corresponds to the insulating layer portion 323A in the intermediate connection member 300A. The conductive members 701 in the structure 800A correspond to the wiring portions 311 in the intermediate connection member 300A. The conductive members 702 in the structure 800A correspond to the wiring portions 312 in the intermediate connection member 300A.

In addition, the insulating layer 651A-1 in the structure 800A corresponds to the insulating layer 323A-1 in the intermediate connection member 300A. The insulating layer 651A-2 in the structure 800A corresponds to the insulating layer 323A-2 in the intermediate connection member 300A. The insulating sheet 650A-3 in the structure 800A corresponds to the insulating layer 323A-3 in the intermediate connection member 300A.

Also according to the second embodiment, the intermediate connection member 300A in which the wiring portions 311 and 312 are highly precisely arranged can be obtained similarly to the first embodiment. In addition, the highly precise intermediate connection member 300A including the wiring portions 311 and 312 that are highly densely arranged at a small pitch can be obtained. To be noted, the manufacturing method for the image pickup module according to the second embodiment is substantially the same as that of the first embodiment, and therefore description thereof will be omitted.

Third Embodiment

Figure 13:
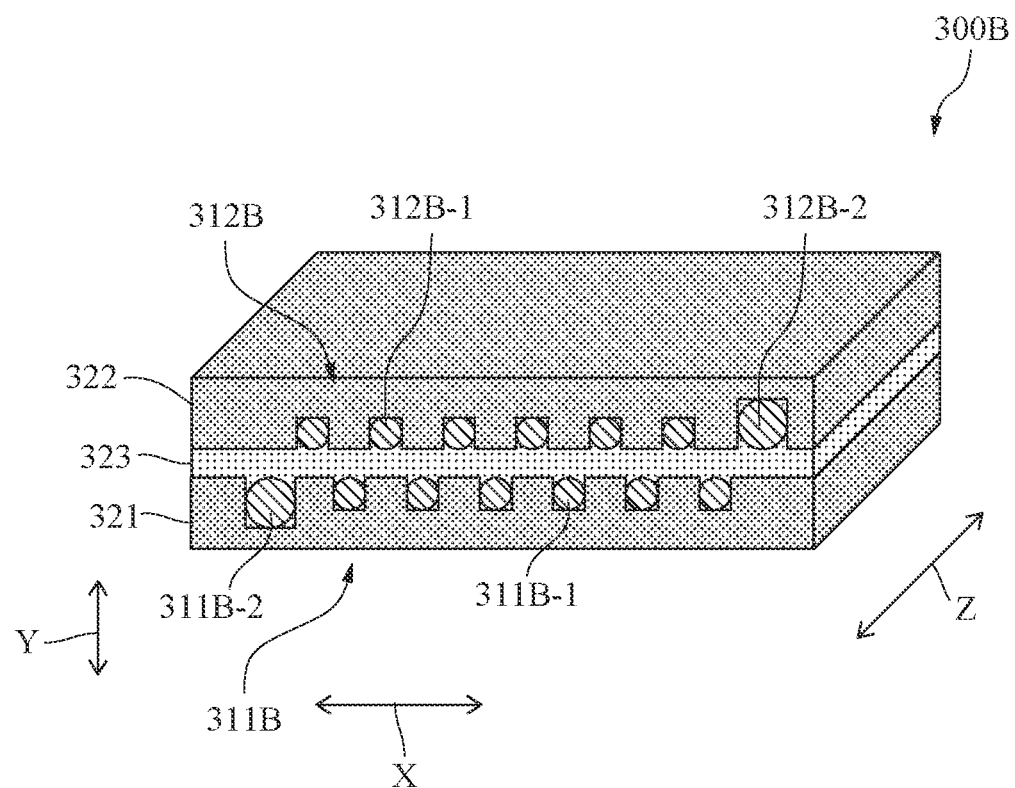
FIG. 13 is a perspective view of an intermediate connection member according to a third embodiment.

Next, intermediate connection members according to a third embodiment will be described. FIG. 13 is a perspective view of an intermediate connection member 300B according to the third embodiment. To be noted, in the third embodiment, substantially the same elements as in the first embodiment will be denoted by the same reference signs in the drawings, and description thereof will be omitted. In addition, the manufacturing method for the intermediate connection member 300B is also substantially the same as in the first embodiment, and therefore description thereof will be omitted.

The intermediate connection member 300B includes the insulating substrate portions 321 and 322, and the insulating layer portion 323. In addition, the intermediate connection member 300B includes a wiring portion group 311B constituted by a plurality of first wiring portion and a wiring portion group 312B constituted by a plurality of second wiring portions. The wiring portion groups 311B and 312B are formed from metal such as copper.

The wiring portion group 311B includes wiring portions 311B-1, and a wiring portion 311B-2 having a larger diameter than the wiring portions 311B-1. The wiring portion group 312B includes wiring portions 312B-1, and a wiring portion 312B-2 having a larger diameter than the wiring portions 312B-1.

As a result of this, a larger current can flow in the wiring portions 311B-2 and 312B-2 than in the wiring portions 311B-1 and 312B-1. Therefore, the wiring portions 311B-2 and 312B-2 can be used as, for example, grounding wires. When manufacturing the intermediate connection member 300B, wires having a larger diameter than wires used for the wiring portions 311B-1 and 312B-1 may be used for the wiring portions 311B-2 and 312B-2. For example, in the case where the diameter of each of the wiring portions 311B-1 and 312B-1 is set to $\varphi 0.2$ mm, the diameter of each of the wiring portions 311B-2 and 312B-2 serving as grounding wires may be set to $\varphi 0.3$ mm, which is larger than $\varphi 0.2$ mm.

The wiring portion groups 311B and 312B may each include a wiring portion of a first diameter and a wiring portion of a second diameter larger than the first diameter. In the present embodiment, the wiring portions 311B-1 and 312B-1 serve as the wiring portions of the first diameter, and the wiring portions 311B-2 and 312B-2 serve as the wiring portions of the second diameter. To be noted, a configuration in which only one of the wiring portion groups 311B and 312B includes the wiring portion 311B-2 or 312B-2 having a larger diameter than the wiring portions 311B-1 or 311B-2 may be employed. That is, the configuration of the wiring portion groups is not limited as long as at least one wiring portion among the wiring portion groups 311B and 312B has a larger diameter than other wiring portions. In addition, the insulating layer portion 323 may be configured in a similar manner to the insulating layer portion 323A of the second embodiment.

Fourth Embodiment

Figure 14:
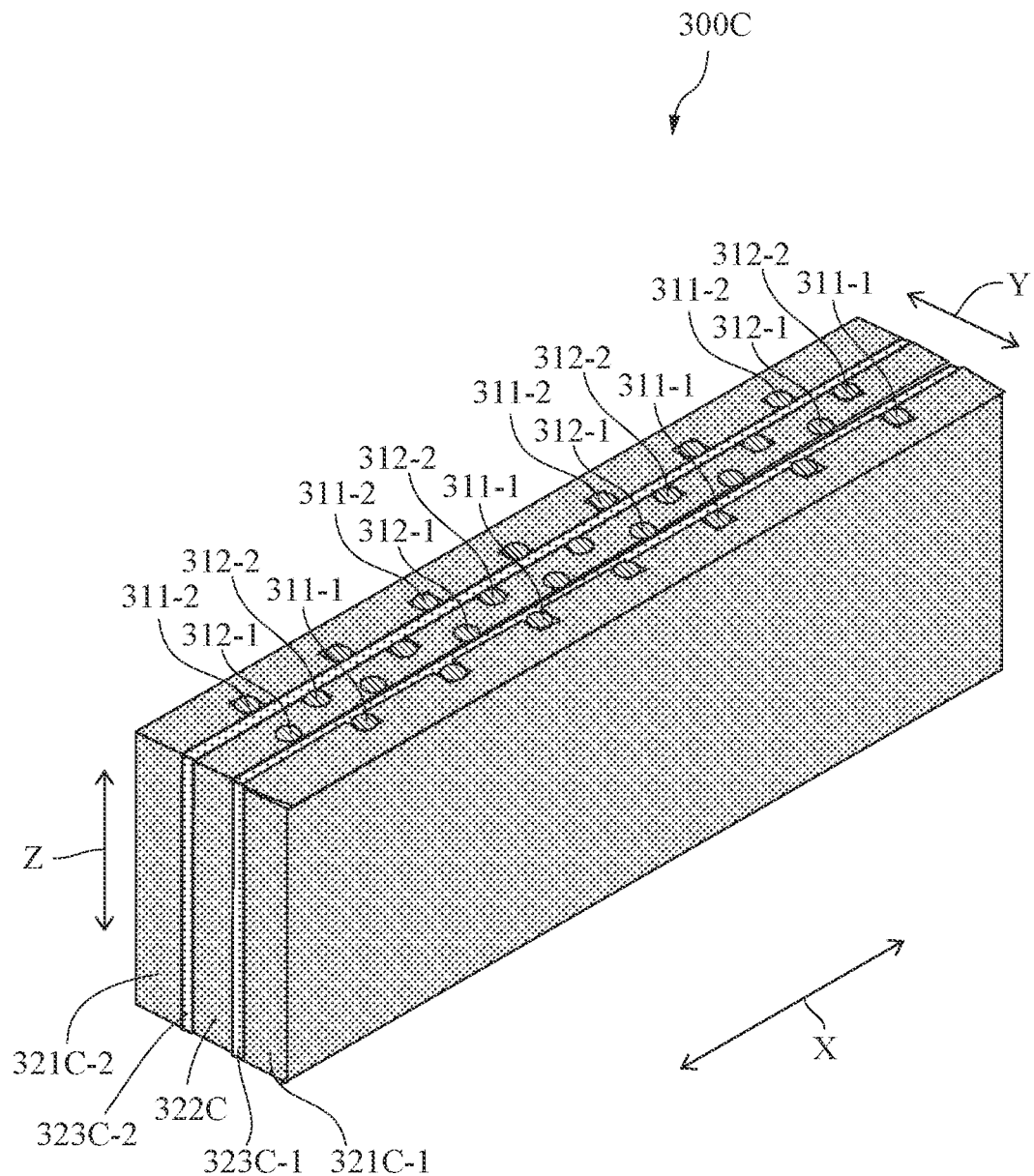
FIG. 14 is a perspective view of an intermediate connection member according to a fourth embodiment.

Next, intermediate connection members according to a fourth embodiment will be described. FIG. 14 is a perspective view of an intermediate connection member 300C according to the fourth embodiment. To be noted, in the fourth embodiment, substantially the same elements as in the first embodiment will be denoted by the same reference signs in the drawings and description thereof will be omitted. In addition, the manufacturing method for the intermediate connection member 300C is also substantially the same as in the first embodiment, and therefore description thereof will be omitted. Although the intermediate connection member 300 of a layered structure including the two insulating substrate portions 321 and 322 in which the plurality of wiring portions 311 and the plurality of wiring portions 312 are disposed in a connection portion between the two insulating substrates has been described in the first embodiment, the configuration is not limited to this. Any configuration can be employed as long as the intermediate connection member includes three or more insulating substrate portions and a plurality of first wiring portions and a plurality of second wiring portions are disposed in a connection portion between two adjacent insulating substrate portions.

The intermediate connection member 300C of the fourth embodiment includes three insulating substrate portions 321C-1, 322C, and 321C-2. In the case where the insulating substrate portion 321C-1 serves as a first insulating substrate portion, the insulating substrate portion 322C serves as a second insulating substrate portion. In addition, in the case where the insulating substrate portion 321C-2 serves as a first insulating substrate portion, the insulating substrate portion 322C serves as a second insulating substrate portion. The insulating material constituting the insulating substrate portions 321C-1, 322C, and 321C-2 is, for example, FR-4.

An insulating layer portion 323C-1 is disposed between the insulating substrate portions 321C-1 and 322C, and an insulating layer portion 323C-2 is disposed between the insulating substrate portions 321C-2 and 322C. The insulating layer portions 323C-1 and 323C-2 are formed from an insulating material different from the insulating material constituting the insulating substrate portions 321C-1, 322C, and 321C-2. The insulating layer portions 323C-1 and 323C-2 are formed by, for example, curing an insulating adhesive containing epoxy resin or silicone resin as a main component.

The intermediate connection member 300C of the fourth embodiment includes a plurality of wiring portions 311-1 serving as a plurality of first wiring portions, and a plurality of wiling portions 312-1 serving as a plurality of second wiring portions. The plurality of wiring portions 311-1 are disposed between the insulating substrate portion 321C-1 and the insulating layer portion 323C-1 so as to extend in the Z direction, and both end surfaces thereof in the Z direction are exposed to the outside. The plurality of wiring portions 312-1 are disposed between the insulating substrate portion 322C and the insulating layer portion 323C-1 so as to extend in the Z direction, and both end surfaces thereof in the Z direction are exposed to the outside. The plurality of wiring portions 311-1 and the plurality of wiring portions 312-1 are alternately arranged in the X direction.

In addition, the intermediate connection member 300C includes a plurality of wiring portions 311-2 serving as a plurality of first wiring portions, and a plurality of wiring portions 312-2 serving as a plurality of second wiring portions. The plurality of wiring portions 311-2 are disposed between the insulating substrate portion 321C-2 and the insulating layer portion 323C-2 so as to extend in the Z direction, and both end surfaces thereof in the Z direction are exposed to the outside. The plurality of wiring portions 312-2 are disposed between the insulating substrate portion 322C and the insulating layer portion 323C-2 so as to extend in the Z direction, and both end surfaces thereof in the Z direction are exposed to the outside. The plurality of wiring portions 311-2 and the plurality of wiring portions 312-2 are alternately arranged in the X direction.

As described above, also according to the fourth embodiment, the intermediate connection member 300C in which the wiring portions 311-1, 312-1, 311-2, and 312-2 are arranged with high precision can be obtained similarly to the first embodiment. In addition, also according to the fourth embodiment, the intermediate connection member 300C can be manufactured with high precision while realizing the wiring structure of a small pitch. To be noted, although the insulating layer portions 323C-1 and 323C-2 have substantially the same configuration as the insulating layer portion 323 of the first embodiment, the insulating layer portions 323C-1 and 323C-2 may have substantially the same configuration as the insulating layer portion 323A of the second embodiment.

Fifth Embodiment

Figure 15A:
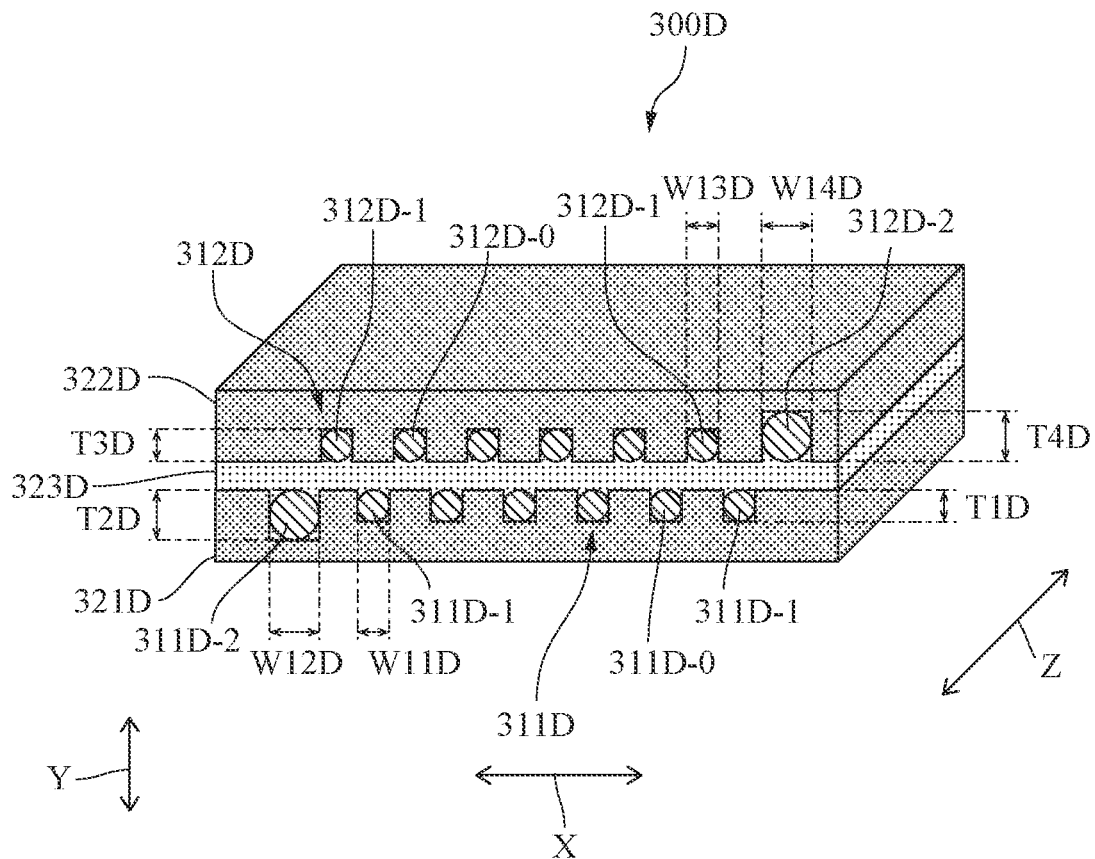
FIG. 15A is a perspective view of an intermediate connection member according to a fifth embodiment.

Next, intermediate connection members of a fifth embodiment will be described. FIG. 15A is a perspective view of an intermediate connection member 300D according to the fifth embodiment. To be noted, the configuration and manufacturing method of the intermediate connection member 300D of the fifth embodiment are substantially the same as the configuration and manufacturing method of the intermediate connection member 300B of the third embodiment. That is, the manufacturing method for the intermediate connection member 300D of the fifth embodiment is substantially the same as the manufacturing method for the intermediate connection member 300 of the first embodiment.

The intermediate connection member 300D includes a wiring portion group 311D configured in substantially the same manner as the wiring portion group 311B of the third embodiment, and a wiring portion group 312D configured in substantially the same manner as the wiring portion group 312B of the third embodiment. In addition, the intermediate connection member 300D includes an insulating substrate portion 321D configured in substantially the same manner as the insulating substrate portion 321 of the third embodiment, an insulating substrate portion 322D configured in substantially the same manner as the insulating substrate portion 322 of the third embodiment, and an insulating layer portion 323D configured in substantially the same manner as the insulating layer portion 323 of the third embodiment. The insulating substrate portion 321D serves as a first insulating substrate portion, and the insulating substrate portion 322D serves as a second insulating substrate portion. The insulating substrate portions 321D and 322D are opposed to each other with the insulating layer portion 323D therebetween. The insulating substrate portions 321D and 322D are formed from the same material as the insulating substrate portions 321 and 322 described in the first embodiment, for example, glass epoxy. The insulating layer portion 323D is formed from a different material from the insulating substrate portions 321D and 322D and the same material as the insulating layer portion 323 described in the first embodiment, for example, a solidified adhesive containing epoxy resin or silicone resin as a main component.

In the fifth embodiment, the wiring portion group 311D includes a plurality of wiring portions 311D-0 as a plurality of first wiring portions. In the present embodiment, the wiring portion group 311D includes seven wiring portions 311D-0. The plurality of wiring portions 311D-0 are arranged at intervals in the X direction. The wiring portions 311D-0 are each disposed to extend in the Z direction such that both end surfaces thereof in the Z direction are exposed to the outside. The material of each of the wiring portions 311D-0 is a conductive material such as copper. The plurality of wiring portions 311D-0 include, for example, six wiring portions 311D-1 as at least one first wiring portion, and, for example, one wiring portion 311D-2 as at least another one first wiring portion having a different size and/or shape from the wiring portions 311D-1. The number of the wiring portions 311D-1 is preferably 2 or more, and is 6 in the fifth embodiment. The number of the wiring portions 311D-2 is preferably smaller than the number of the wiring portions 311D-1, and is 1 in the fifth embodiment.

The wiring portion group 312D is disposed at a position away from the wiring portion group 311D in the Y direction. The wiring portion group 312D includes a plurality of wiring portions 312D-0 as a plurality of second wiring portions. In the present embodiment, the wiring portion group 312D includes seven wiring portions 312D-0. The plurality of wiring portions 312D-0 are arranged at intervals in the X direction. The wiring portions 312D-0 are each disposed to extend in the Z direction such that both end surfaces thereof in the Z direction are exposed to the outside. The material of each of the wiring portions 312D-0 is a conductive material such as copper. The plurality of wiring portions 312D-0 include, for example, six wiring portions 312D-1 as at least one second wiring portion, and, for example, one wiring portion 312D-2 as at least another one second wiring portion having a different size and/or shape from the wiring portions 312D-1. The number of the wiring portions 312D-1 is preferably 2 or more, and is 6 in the fifth embodiment. The number of the wiring portions 312D-2 is preferably smaller than the number of the wiring portions 312D-1, and is 1 in the fifth embodiment.

In the manufacturing process of the image pickup module in the fifth embodiment, it is preferable that the intermediate connection member 300D is provided with an alignment mark for improving the alignment precision between the intermediate connection member 300D and the wiring board 221 illustrated in FIG. 9C. By providing the intermediate connection member 300D with an alignment mark, the wiring portions in the image pickup module can be arranged with high precision.

In addition, in the manufacturing process of the intermediate connection member 300 in the first embodiment, the insulating substrates 601 and 602 are stuck together by using an adhesive as illustrated in FIG. 7C and as described above. Also in the fifth embodiment, in the manufacturing process of the intermediate connection member 300D, an insulating substrate corresponding to the insulating substrate portion 321D and an insulating substrate corresponding to the insulating substrate portion 322D are stuck together by using an adhesive. To improve the alignment precision at this time, it is preferable that at least one of the two insulating substrates is provided with an alignment mark. By providing an insulating substrate with an alignment mark, the wiring portions can be arranged with high precision in the intermediate connection member 300D.

Therefore, in the fifth embodiment, the wiring portion 311D-2 in the plurality of wiring portions 311D-0 and the wiring portion 312D-2 in the plurality of wiring portions 312D-0 are used as alignment marks. The wiring portion 311D-2 is a wiring portion positioned at an end in the X direction among the plurality of wiring portions 311D-0. The wiring portion 312D-2 is a wiring portion positioned at an end in the X direction among the plurality of wiring portions 312D-0.

The width of each of the wiring portions 311D-1 in the X direction is a width W11D. The width W11D serves as a first width. The width of the wiring portion 311D-2 in the X direction is a width W12D larger than the width W11D. The width W12D serves as a second width. Since the width W12D of the wiring portion 311D-2 is larger than the width W11D of each of the wiring portions 311D-1 as described above, the wiring portion 311D-2 can be used as an alignment mark.

In addition, the thickness of each of the wiring portions 311D-1 in the Y direction is a thickness T1D. The thickness T1D serves as a first thickness. The thickness of the wiring portion 311D-2 in the Y direction is a thickness T2D larger than the thickness T1D. The thickness T2D serves as a second thickness. Since the thickness T2D of the wiring portion 311D-2 is larger than the thickness T1D of the wiring portions 311D-1 as described above, the wiring portion 311D-2 can be used as an alignment mark.

The wiring portions 311D-1 and 311D-2 are each constituted by, for example, a wire, and the diameter of the wiring portion 311D-2 is larger than the diameter of each of the wiring portions 311D-1. As a result of this, the width W12D of the wiring portion 311D-2 is larger than the width W11D of each of the wiring portions 311D-1, and the thickness T2D of the wiring portion 311D-2 is larger than the thickness T1D of each of the wiring portions 311D-1.

The width of each of the wiring portions 312D-1 in the X direction is a width W13D. The width W13D serves as a third width. The width of the wiring portion 312D-2 in the X direction is a width W14D larger than the width W13D. The width W14D serves as a fourth width. Since the width W14D of the wiring portion 312D-2 is larger than the width W13D of the wiring portions 312D-1 as described above, the wiring portion 312D-2 can be used as an alignment mark.

In addition, the thickness of each of the wiring portions 312D-1 in the Y direction is a thickness T3D. The thickness T3D serves as a third thickness. The thickness of the wiring portion 312D-2 in the Y direction is a thickness T4D larger than the thickness T3D. The thickness T4D serves as a fourth thickness. Since the thickness T4D of the wiring portion 312D-2 is larger than the thickness T3D of each of the wiring portions 312D-1 as described above, the wiring portion 312D-2 can be used as an alignment mark.

The wiring portions 312D-1 and 312D-2 are each constituted by, for example, a wire, and the diameter of the wiring portion 312D-2 is larger than the diameter of the wiring portions 312D-1. As a result of this, the width W14D of the wiring portion 312D-2 is larger than the width W13D of each of the wiring portions 312D-1, and the thickness T4D of the wiring portion 312D-2 is larger than the thickness T3D of each of the wiring portions 312D-1.

Figure 15B:
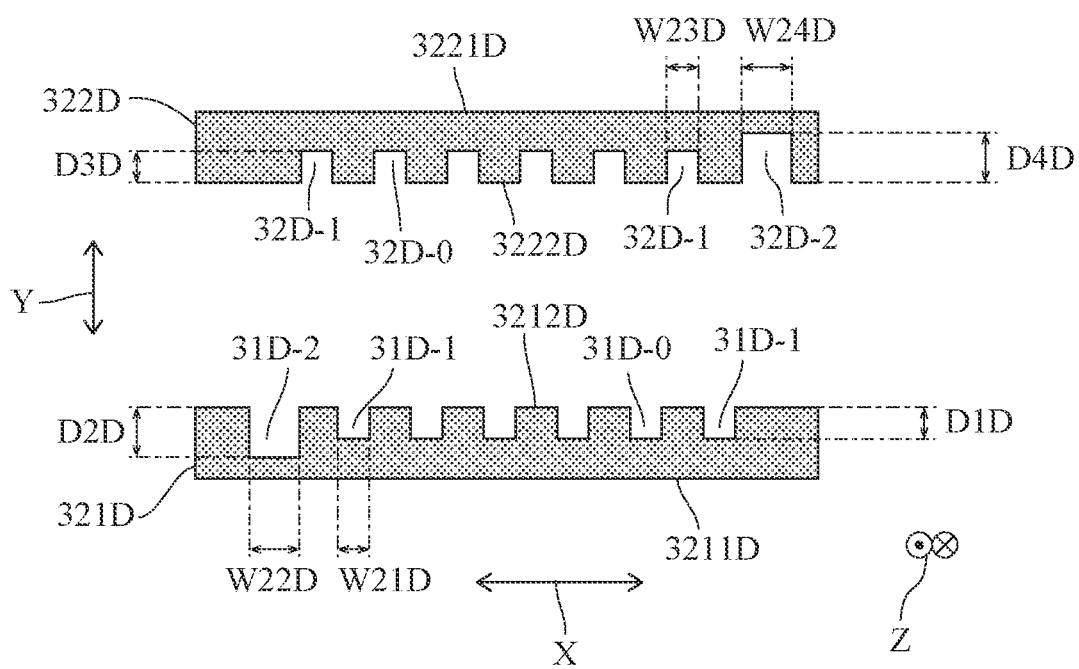
FIG. 15B is an explanatory diagram of two insulating substrate portions according to the fifth embodiment.

In the fifth embodiment, the plurality of wiring portions 311D-0 are disposed on the insulating substrate portion 321D, and the plurality of wiring portions 312D-0 are disposed on the insulating substrate portion 322D. Configurations of the insulating substrate portion 321D on which the wiring portions 311D-0 are disposed and the insulating substrate portion 322D on which the wiring portions 312D-0 are disposed will be described in detail below. FIG. 15B is an explanatory diagram of the two insulating substrate portions 321D and 322D according to the fifth embodiment. FIG. 15B is a plan view of the insulating substrate portions 321D and 322D as viewed in the Z direction.

The insulating substrate portion 321D has a surface 3211D and a surface 3212D opposite to the surface 3211D in the Y direction. The insulating substrate portion 322D has a surface 3221D and a surface 3222D opposite to the surface 3221D in the Y direction. The insulating layer portion 323D illustrated in FIG. 15A is disposed between the surfaces 3212D and 3222D. That is, the surfaces 3212D and 3222D oppose each other with the insulating layer portion 323D therebetween.

The plurality of wiring portions 311D-0 are disposed on the surface 3212D, and the plurality of wiring portions 312D-0 are disposed on the surface 3222D. That is, the plurality of wiring portions 311D-0 are disposed between the insulating substrate portion 321D and the insulating layer portion 323D, and the plurality of wiring portions 312D-0 are disposed between the insulating substrate portion 322D and the insulating layer portion 323D.

A plurality of groove portions 31D-0 corresponding to the plurality of wiring portions 311D-0 are defined in the surface 3212D. The plurality of groove portions 31D-0 are defined at intervals in the X direction. The groove portions 31D-0 each extend in the Z direction. The plurality of groove portions 31D-0 include a plurality of groove portions 31D-1 corresponding to the plurality of wiring portions 311D-1, and a groove portion 31D-2 corresponding to the wiring portion 311D-2. The groove portion 31D-2 serves as a first groove portion.

Each of the wiring portions 311D-1 is disposed in a corresponding one of the groove portions 31D-1. The wiring portion 311D-2 is disposed in the groove portion 31D-2. Therefore, a width W22D of the groove portion 31D-2 in the X direction is larger than a width W21D of each of the groove portions 31D-1 in the X direction, that is, larger than the width W11D of each of the wiring portions 311D-1 in the X direction. In addition, a depth D2D of the groove portion 31D-2 in the Y direction is larger than a depth D1D of each of the groove portions 31D-1 in the Y direction, that is, larger than the thickness T1D of each of the wiring portions 311D-1 in the Y direction.

The width W21D of each of the groove portions 31D-1 is preferably larger than the width W11D of each of the wiring portions 311D-1. That is, the width W21D of each of the groove portions 31D-1 is preferably larger than 1.0 time of the width W11D of each of the wiring portions 311D-1. For example, the width W21D of each of the groove portions 31D-1 is preferably 1.1 times or more of the width W11D of each of the wiring portions 311D-1, may be 1.5 times or more of the width W11D, or may be 2.0 times or more of the width W11D. In addition, the width W21D of each of the groove portions 31D-1 is preferably 20 times or less of the width W11D of each of the wiring portions 311D-1.

The width W22D of the groove portion 31D-2 is preferably larger than the width W12D of the wiring portion 311D-2. That is, the width W22D of the groove portion 31D-2 is preferably larger than 1.0 time of the width W12D of the wiring portion 311D-2. For example, the width W22D of the groove portion 31D-2 is preferably 1.1 times or more of the width W12D of the wiring portion 311D-2, may be 1.5 times or more of the width W12D, or may be 2.0 times or more of the width W12D. In addition, the width W22D of the groove portion 31D-2 is preferably 20 times or less of the width W12D of the wiring portion 311D-2.

The depth D1D of each of the groove portions 31D-1 is preferably larger than the thickness T1D of each of the wiring portions 311D-1. That is, the depth D1D of each of the groove portions 31D-1 is preferably larger than 1.0 time of the thickness T1D of each of the wiring portions 311D-1. For example, the depth D1D of each of the groove portions 31D-1 is preferably 1.1 times or more of the thickness T1D of each of the wiring portions 311D-1, may be 1.5 times or more of the thickness T1D, or may be 2.0 times or more of the thickness T1D. In addition, the depth D1D of each of the groove portions 31D-1 is preferably 20 times or less of the thickness T1D of each of the wiring portions 311D-1.

The depth D2D of the groove portion 31D-2 is preferably larger than the thickness T2D of the wiring portion 311D-2. That is, the depth D2D of the groove portion 31D-2 is preferably larger than 1.0 time of the thickness T2D of the wiring portion 311D-2. For example, the depth D2D of the groove portion 31D-2 is preferably 1.1 times or more of the thickness T2D of the wiring portion 311D-2, may be 1.5 times or more of the thickness T2D, or may be 2.0 times or more of the thickness T2D. In addition, the depth D2D of the groove portion 31D-2 is preferably 20 times or less of the thickness T2D of the wiring portion 311D-2.

A plurality of groove portions 32D-0 corresponding to the plurality of wiring portions 312D-0 are defined in the surface 3222D. The plurality of groove portions 32D-0 are defined at intervals in the X direction. The groove portions 32D-0 each extend in the Z direction. The plurality of groove portions 32D-0 include a plurality of groove portions 32D-1 corresponding to the plurality of wiring portions 312D-1, and a groove portion 32D-2 corresponding to the wiring portion 312D-2. The groove portion 32D-2 serves as a second groove portion.

Each of the wiring portions 312D-1 is disposed in a corresponding one of the groove portions 32D-1. The wiring portion 312D-2 is disposed in the groove portion 32D-2. Therefore, a width W24D of the groove portion 32D-2 in the X direction is larger than a width W23D of each of the groove portions 32D-1 in the X direction, that is, larger than the width W13D of each of the wiring portions 312D-1 in the X direction. In addition, a depth D4D of the groove portion 32D-2 in the Y direction is larger than a depth D3D of each of the groove portions 32D-1 in the Y direction, that is, larger than the thickness T3D of each of the wiring portions 312D-1 in the Y direction.

The width W23D of each of the groove portions 32D-1 is preferably larger than the width W13D of each of the wiring portions 312D-1. That is, the width W23D of each of the groove portions 32D-1 is preferably larger than 1.0 time of the width W13D of each of the wiring portions 312D-1. For example, the width W23D of each of the groove portions 32D-1 is preferably 1.1 times or more of the width W13D of each of the wiring portions 312D-1, may be 1.5 times or more of the width W13D, or may be 2.0 times or more of the width W13D. In addition, the width W23D of each of the groove portions 32D-1 is preferably 20 times or less of the width W13D of each of the wiring portions 312D-1.

The width W24D of the groove portion 32D-2 is preferably larger than the width W14D of the wiring portion 312D-2. That is, the width W24D of the groove portion 32D-2 is preferably larger than 1.0 time of the width W14D of the wiring portion 312D-2. For example, the width W24D of the groove portion 32D-2 is preferably 1.1 times or more of the width W14D of the wiring portion 312D-2, may be 1.5 times or more of the width W14D, or may be 2.0 times or more of the width W14D. In addition, the width W24D of the groove portion 32D-2 is preferably 20 times or less of the width W14D of the wiring portion 312D-2.

The depth D3D of each of the groove portions 32D-1 is preferably larger than the thickness T3D of each of the wiring portions 312D-1. That is, the depth D3D of each of the groove portions 32D-1 is preferably larger than 1.0 time of the thickness T3D of each of the wiring portions 312D-1. For example, the depth D3D of each of the groove portions 32D-1 is preferably 1.1 times or more of the thickness T3D of each of the wiring portions 312D-1, may be 1.5 times or more of the thickness T3D, or may be 2.0 times or more of the thickness T3D. In addition, the depth D3D of each of the groove portions 32D-1 is preferably 20 times or less of the thickness T3D of each of the wiring portions 312D-1.

The depth D1D of the groove portion 32D-2 is preferably larger than the thickness T4D of the wiring portion 312D-2. That is, the depth D4D of the groove portion 32D-2 is preferably larger than 1.0 time of the thickness T4D of the wiring portion 312D-2. For example, the depth D4D of the groove portion 32D-2 is preferably 1.1 times or more of the thickness T4D of the wiring portion 312D-2, may be 1.5 times or more of the thickness T4D, or may be 2.0 times or more of the thickness T4D. In addition, the depth D4D of the groove portion 32D-2 is preferably 20 times or less of the thickness T4D of the wiring portion 312D-2.

In this manner, as viewed in the Z direction, the area of the wiring portion 311D-2 is larger than the area of each of the wiring portions 311D-1, and the area of the wiring portion 312D-2 is larger than the area of each of the wiring portions 312D-1. As a result of this, the wiring portions 311D-2 and 312D-2 are each used as an alignment mark, and thus the alignment precision of the intermediate connection member 300D with respect to the wiring board 221 illustrated in FIG. 9C is improved. In addition, since the area of each of the wiring portions 311D-2 and 312D-2 is large as viewed in the Z direction, a self-alignment effect of the intermediate connection member 300D with respect to the wiring hoard 221 when bonding the intermediate connection member 300D to the wiring board 221 with solder is improved.

In the fifth embodiment, the wiring portion 311D-2 having the width W12D and the thickness T2D and included in the plurality of wiring portions 311D-0 and the wiring portion 312D-2 having the width W14D and the thickness T4D and included in the plurality of wiring portions 312D-0 are displaced from each other in the X direction. That is, among the plurality of wiring portions 311D-0 and the plurality of wiring portions 312D-0, the distance between the wiring portions 311D-2 and 312D-2 is larger than a distance between two of the other wiring portions. As a result of this, the alignment precision of the intermediate connection member 300D with respect to the wiring board 221 in the manufacturing process of an image pickup module in the fifth embodiment is further improved. In addition, the self-alignment effect of the intermediate connection member 300D with respect to the wiring board 221 when bonding the intermediate connection member 300D to the wiring board 221 with solder is further improved. In addition, the alignment precision at the time of sticking together an insulating substrate corresponding to the insulating substrate portion 321D and an insulating substrate corresponding to the insulating substrate portion 322D in the manufacturing process of the intermediate connection member 300D is further improved.

To be noted, although a case where the wiring portions 311D-2 and 312D-2 are each used as an alignment mark has been described, the configuration is not limited to this. For example, a configuration in which the wiring portion 312D-2 and the groove portion 32D-2 may be omitted and only the wiring portion 311D-2 is used as an alignment mark may be employed. In addition, in the intermediate connection member 300D, the wiring portion group 312D, that is, the plurality of wiring portions 312D-0 may be omitted. Also in this case, the wiring portion 311D-2 may be used as an alignment mark.

In addition, although it is preferable that the width W12D of the wiring portion 311D-2 is larger than the width W11D of each of the wiring portions 311D-1 and the thickness T2D of the wiring portion 311D-2 is larger than the thickness T1D of each of the wiring portions 311D-1, the configuration is not limited to this. For example, in the case where the width W12D of the wiring portion 311D-2 is larger than the width W11D of each of the wiring portions 311D-1, the thickness T2D of the wiring portion 311D-2 may be equal to or smaller than the thickness T1D of each of the wiring portions 311D-1. In this case, it is preferable that the width W22D of the groove portion 31D-2 is larger than the width W21D of each of the groove portions 31D-1 and the depth D2D of the groove portion 31D-2 is equal to or smaller than the depth D1D of each of the groove portions 31D-1. Similarly, in the case where the thickness T2D of the wiring portion 311D-2 is larger than the thickness T1D of each of the wiring portions 311D-1, the width W12D of the wiring portion 311D-2 may be equal to or smaller than the width W12D of each of the wiring portions 311D-1. In this case, it is preferable that the depth D2D of the groove portion 31D-2 is larger than the depth D1D of each of the groove portions 31D-1 and the width W22D of the groove portion 31D-2 is equal to or smaller than the width W21D of each of the groove portions 31D-1. That is, it suffices as long as the groove portion 31D-2 is a groove portion having a width larger than the width of each of the groove portions 31D-1, that is, larger than the width of each of the wiring portions 311D-1 and/or having a thickness larger than the depth of each of the groove portions 31D-1, that is, larger than the thickness of each of the wiring portions 311D-1. The wiring portion 311D-2 can be used as an alignment mark also in these cases.

Similarly, although it is preferable that the width W14D of the wiring portion 312D-2 is larger than the width W13D of each of the wiring portions 312D-1 and the thickness T4D of the wiring portion 312D-2 is larger than the thickness T3D of each of the wiring portions 312D-1, the configuration is not limited to this. For example, in the case where the width W14D of the wiring portion 312D-2 is larger than the width W13D of each of the wiring portions 312D-1, the thickness T4D of the wiring portion 312D-2 may be equal to or smaller than the thickness T3D of each of the wiring portions 312D-1. In this case, it is preferable that the width W24D of the groove portion 32D-2 is larger than the width W23D of each of the groove portions 32D-1 and the depth D4D of the groove portion 32D-2 is equal to or smaller than the depth D3D of each of the groove portions 32D-1. Similarly, in the case where the thickness T4D of the wiring portion 312D-2 is larger than the thickness T3D of each of the wiring portions 312D-1, the width W14D of the wiring portion 312D-2 may be equal to or smaller than the width W13D of each of the wiring portions 312D-1. In this case, it is preferable that the depth D4D of the groove portion 32D-2 is larger than the depth D3D of each of the groove portions 32D-1 and the width W24D of the groove portion 32D-2 is equal to or smaller than the width W23D of each of the groove portions 32D-1. That is, it suffices as long as the groove portion 32D-2 is a groove portion having a width larger than the width of each of the groove portions 32D-1, that is, larger than the width of each of the wiring portions 312D-1 and/or having a thickness larger than the depth of each of the groove portions 32D-1, that is, larger than the thickness of each of the wiring portions 312D-1. The wiring portion 312D-2 can be used as an alignment mark also in these cases.

In addition, although a case where the wiring portion group 311D, that is, the plurality of wiring portions 311D-0 include the one wiring portion 311D-2 has been described, the configuration is not limited to this, and the wiring portion group 311D may include two or more wiring portions 311D-2. In this case, it is preferable that two wiring portions positioned at respective ends in the X direction among the plurality of wiring portions 311D-0 are each the wiring portion 311D-2.

Similarly, although a case where the wiring portion group 312D, that is, the plurality of wiring portions 312D-0 include the one wiring portion 312D-2 has been described, the configuration is not limited to this, and the wiring portion group 312D may include two or more wiring portions 312D-2. In this case, it is preferable that two wiring portions positioned at respective ends in the X direction among the plurality of wiring portions 312D-0 are each the wiring portion 312D-2.

In addition, although a case where the plurality of wiring portions 311D-0 are each a wire has been described, the configuration is not limited to this. The plurality of wiring portions 311D-0 may be in any forms as long as the plurality of wiring portions 311D-0 are each formed from a conductive material. Therefore, for example, a configuration in which part or all of the plurality of wiring portions 311D-0 are constituted by a conductor pattern may be employed.

Similarly, although a case where the plurality of wiring portions 312D-0 are each a wire has been described, the configuration is not limited to this. The plurality of wiring portions 312D-0 may be in any forms as long as the plurality of wiring portions 312D-0 are each formed from a conductive material. Therefore, for example, a configuration in which part or all of the plurality of wiring portions 312D-0 are constituted by a conductor pattern may be employed.

In addition, although a case where the wiring portions 311D-2 and 312D-2 are respectively disposed in the groove portions 31D-2 and 32D-2 has been described, the configuration is not limited to this, and one or both of the wiring portions 311D-2 and 312D-2 may be omitted. In this case, a groove portion not provided with a wiring portion can be used as an alignment mark. To be noted, the groove portion not provided with the wiring portion is filled with part of the insulating layer portion 323D.

Sixth Embodiment

Figure 16A:
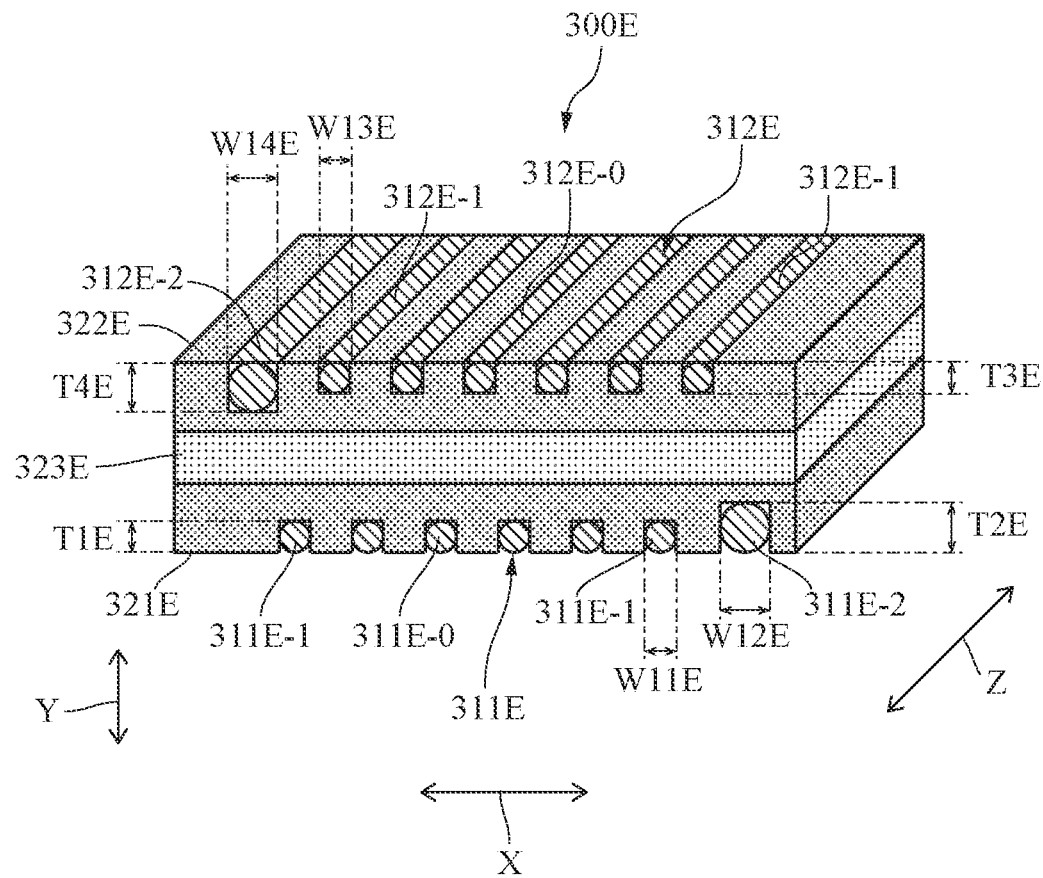
FIG. 16A is a perspective view of an intermediate connection member according to a sixth embodiment.

Next, intermediate connection members of a sixth embodiment will be described. FIG. 16A is a perspective view of an intermediate connection member 300E according to the sixth embodiment. To be noted, the configuration and manufacturing method of the intermediate connection member 300E of the sixth embodiment are substantially the same as the configuration and manufacturing method of the intermediate connection member 300B of the third embodiment. That is, the manufacturing method for the intermediate connection member 300E of the sixth embodiment is substantially the same as the manufacturing method for the intermediate connection member 300 of the first embodiment.

The intermediate connection member 300E includes a wiring portion group 311E and a wiring portion group 312E. In addition, the intermediate connection member 300E includes an insulating substrate portion 321E, an insulating substrate portion 322E, and an insulating layer portion 323E. The insulating substrate portion 321E serves as a first insulating substrate portion, and the insulating substrate portion 322E serves as a second insulating substrate portion. The insulating substrate portions 321E and 322E are opposed to each other with the insulating layer portion 323E therebetween. The insulating substrate portions 321E and 322E are formed from the same material as the insulating substrate portions 321 and 322 described in the first embodiment, fax example, glass epoxy. The insulating layer portion 323E is formed from a different material from the insulating substrate portions 321E and 322E and the same material as the insulating layer portion 323 described in the first embodiment, for example, a solidified adhesive containing epoxy resin or silicone resin as a main component.

In the sixth embodiment, the wiring portion group 311E includes a plurality of wiring portions 311E-0 as a plurality of first wiring portions. For example, in the present embodiment, the wiring portion group 311E includes seven wiring portions 311E-0. The plurality of wiring portions 311E-0 are arranged at intervals in the X direction. The wiring portions 311E-0 are each disposed to extend in the Z direction such that both end surfaces thereof in the Z direction are exposed to the outside. The material of each of the wiring portions 311E-0 is a conductive material such as copper. The plurality of wiring portions 311E-0 include, for example, six wiring portions 311E-1 as at least one first wiring portion, and, for example, one wiring portion 311E-2 as at least another one first wiring portion having a different size and/or shape from the wiring portions 311E-1. The number of the wiring portions 311E-1 is preferably 2 or more, and is 6 in the sixth embodiment. The number of the wiring portions 311E-2 is preferably smaller than the number of the wiring portions 311E-1, and is 1 in the sixth embodiment.

The wiring portion group 312E is disposed at a position away from the wiring portion group 311E in the Y direction. The wiring portion group 312E includes a plurality of wiring portions 312E-0 as a plurality of second wiring portions. For example, in the present embodiment, the wiring portion group 312E includes seven wiring portions 312E-0. The plurality of wiring portions 312E-0 are arranged at intervals in the X direction. The wiring portions 312E-0 are each disposed to extend in the Z direction such that both end surfaces thereof in the Z direction are exposed to the outside. The material of each of the wiring portions 312E-0 is a conductive material such as copper. The plurality of wiring portions 312E-0 include, for example, six wiring portions 312E-1 as at least one second wiring portion, and, for example, one wiring portion 312E-2 as at least another one second wiring portion having a different size and/or shape from the wiring portions 312E-1. The number of the wiring portions 312E-1 is preferably 2 or more, and is 6 in the sixth embodiment. The number of the wiring portions 312E-2 is preferably smaller than the number of the wiring portions 312E-1, and is 1 in the sixth embodiment.

Here, in the manufacturing process of the electronic module, the intermediate connection members need to be highly precisely aligned with respect to the wiring boards to which the intermediate connection members are to be bonded. Therefore, in the manufacturing process of the image pickup module in the sixth embodiment, it is preferable that the intermediate connection member 300E is provided with an alignment mark for improving the alignment precision between the intermediate connection member 300E and the wiring board 221 illustrated in FIG. 9C. By providing the intermediate connection member 300E with an alignment mark, the wiring portions in the image pickup module can be arranged with high precision.

In addition, in the manufacturing process of the intermediate connection member 300E in the sixth embodiment, an insulating substrate corresponding to the insulating substrate portion 321E and an insulating substrate corresponding to the insulating substrate portion 322E are stuck together by using an adhesive. To improve the alignment precision at this time, it is preferable that at least one of the two insulating substrates is provided with an alignment mark. By providing an insulating substrate with an alignment mark, the wiring portions can be arranged with high precision in the intermediate connection member 300E.

Therefore, in the sixth embodiment, the wiring portion 311E-2 in the plurality of wiring portions 311E-0 and the wiring portion 312E-2 in the plurality of wiring portions 312E-0 are used as alignment marks. The wiring portion 311E-2 is a wiring portion positioned at an end in the X direction among the plurality of wiring portions 311E-0. The wiring portion 312E-2 is a wiring portion positioned at an end in the X direction among the plurality of wiring portions 312E-0.

The width of each of the wiring portions 311E-1 in the X direction is a width W11E. The width W11E serves as a first width. The width of the wiring portion 311E-2 in the X direction is a width W12E larger than the width W11E. The width W12E serves as a second width. Since the width W12E of the wiring portion 311E-2 is larger than the width W11E of each of the wiring portions 311E-1 as described above, the wiring portion 311E-2 can be used as an alignment mark.

In addition, the thickness of each of the wiring portions 311E-1 in the Y direction is a thickness T1E. The thickness T1E serves as a first thickness. The thickness of the wiring portion 311E-2 in the direction is a thickness T2E larger than the thickness T1E. The thickness T2E serves as a second thickness. Since the thickness T2E of the wiring portion 311E-2 is larger than the thickness T1E of each of the wiring portions 311E-1 as described above, the wiring portion 311E-2 can be used as an alignment mark.

The wiring portions 311E-1 and 311E-2 are each constituted by, for example, a wire, and the diameter of the wiring portion 311E-2 is larger than the diameter of the wiring portions 311E-1. As a result of this, the width W12E of the wiring portion 311E-2 is larger than the width W11E of each of the wiring portions 311E-1, and the thickness T2E of the wiring portion 311E-2 is larger than the thickness T1E of each of the wiring portions 311E-1.

The width of each of the wiring portions 312E-1 in the X direction is a width W13E. The width W13E serves as a third width. The width of the wiring portion 312E-2 in the X direction is a width W14E larger than the width W13E. The width W14E serves as a fourth width. Since the width W14E of the wiring portion 312E-2 is larger than the width W13E of each of the wiring portions 312E-1 as described above, the wiring portion 312E-2 can be used as an alignment mark.

In addition, the thickness of each of the wiring portions 312E-1 in the Y direction is a thickness T3E. The thickness T3E serves as a third thickness. The thickness of the wiring portion 312E-2 in the Y direction is a thickness T4E larger than the thickness T3E. The thickness T4E serves as a fourth thickness. Since the thickness T4E of the wiring portion 312E-2 is larger than the thickness T3E of each of the wiring portions 312E-1 as described above, the wiring portion 312E-2 can be used as an alignment mark.

The wiring portions 312E-1 and 312E-2 are each constituted by, for example, a wire, and the diameter of the wiring portion 312E-2 is larger than the diameter of each of the wiring portions 312E-1. As a result of this, the width W14E of the wiring portion 312E-2 is larger than the width W13E of each of the wiring portions 312E-1, and the thickness T4E of the wiring portion 312E-2 is larger than the thickness T3E of each of the wiring portions 312E-1.

Figure 16B:
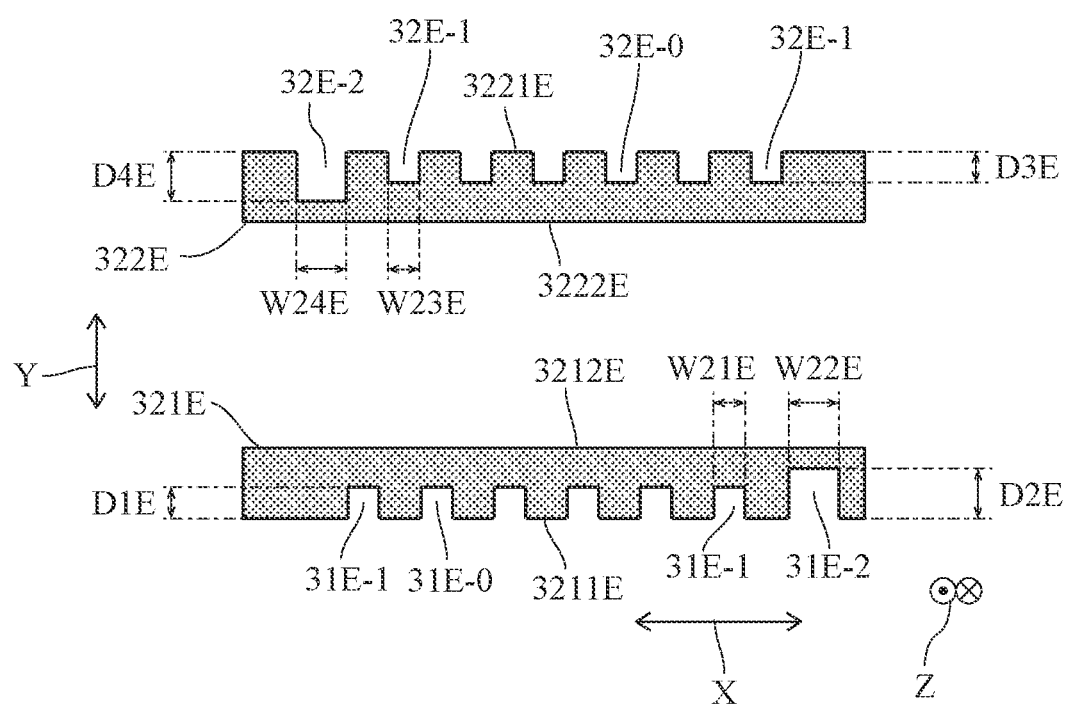
FIG. 16B is an explanatory diagram of two insulating substrate portions according to the sixth embodiment.

In the sixth embodiment, the plurality of wiring portions 311E-0 are disposed on the insulating substrate portion 321E, and the plurality of wiring portions 312E-0 are disposed on the insulating substrate portion 322E. Configurations of the insulating substrate portion 321E on which the wiring portions 311E-0 are disposed and the insulating substrate portion 322E on which the wiring portions 312E-0 are disposed will be described in detail below. FIG. 16B is an explanatory diagram of the two insulating substrate portions 321E and 322E according to the sixth embodiment. FIG. 16B is a plan view of the insulating substrate portions 321E and 322E as viewed in the Z direction.

The insulating substrate portion 321E has a surface 3211E and a surface 3212E opposite to the surface 3211E. The insulating substrate portion 322E has a surface 3221E and a surface 3222E opposite to the surface 3221E. The insulating layer portion 323E illustrated in FIG. 16A is disposed between the surfaces 3212E and 3222E. That is, the surfaces 3212E and 3222E oppose each other with the insulating layer portion 323E therebetween.

The plurality of wiring portions 311E-0 are disposed on the surface 3211E, and the plurality of wiring portions 312E-0 are disposed on the surface 3221E. That is, the plurality of wiring portions 311E-0 are disposed on the outer surface 3211E of the insulating substrate portion 321E, and the plurality of wiring portions 312E-0 are disposed on the outer surface 3221E of the insulating substrate portion 322E. To be noted, an unillustrated insulating layer may be provided on each of the surfaces 3211E and 3221E.

A plurality of groove portions 31E-0 corresponding to the plurality of wiring portions 311E-0 are defined in the surface 3211E. The plurality of groove portions 31E-0 are defined at intervals in the X direction. The groove portions 31E-0 each extend in the Z direction. The plurality of groove portions 31E-0 include a plurality of groove portions 31E-1 corresponding to the plurality of wiring portions 311E-1, and a groove portion 31E-2 corresponding to the wiring portion 311E-2. The groove portion 31E-2 serves as a first groove portion.

Each of the wiring portions 311E-1 is disposed in a corresponding one of the groove portions 31E-1. The wiring portion 311E-2 is disposed in the groove portion 31E-2. Therefore, a width W22E of the groove portion 31E-2 in the X direction is larger than a width W21E of each of the groove portions 31E-1 in the X direction, that is, larger than the width W11E of each of the wiring portions 311E-1 in the X direction. In addition, a depth D2E of the groove portion 31E-2 in the Y direction is larger than a depth D1E of each of the groove portions 31E-1 in the Y direction, that is, larger than the thickness T1E of each of the wiring portions 311E-1 in the Y direction.

The width W21E of each of the groove portions 31E-1 is preferably larger than the width W11E of each of the wiring portions 311E-1. That is, the width W21E of each of the groove portions 31E-1 is preferably larger than 1.0 time of the width W11E of each of the wiring portions 311E-1. For example, the width W21E of each of the groove portions 31E-1 is preferably 1.1 times or more of the width W11E of each of the wiring portions 311E-1, may be 1.5 times or more of the width W11E, or may be 2.0 times or more of the width W11E. In addition, the width W21E of each of the groove portions 31E-1 is preferably 20 times or less of the width W11E of each of the wiring portions 311E-1.

The width W22E of the groove portion 31E-2 is preferably larger than the width W12E of the wiring portion 311E-2. That is, the width W22E of the groove portion 31E-2 is preferably larger than 1.0 time of the width W12E of the wiring portion 311E-2. For example, the width W22E of the groove portion 31E-2 is preferably 1.1 times or more of the width W12E of the wiring portion 311E-2, may be 1.5 times or more of the width W12E, or may be 2.0 times or more of the width W12E. In addition, the width W22E of the groove portion 31E-2 is preferably 20 times or less of the width W12E of the wiring portion 311E-2.

The depth D1E of each of the groove portions 31E-1 is preferably larger than the thickness T1E of each of the wiring portions 311E-1. That is, the depth D1E of each of the groove portions 31E-1 is preferably larger than 1.0 time of the thickness T1E of each of the wiring portions 311E-1. For example, the depth D1E of each of the groove portions 31E-1 is preferably 1.1 times or more of the thickness T1E of each of the wiring portions 311E-1, may be 1.5 times or more of the thickness T1E, or may be 2.0 times or more of the thickness T1E. In addition, the depth D1E of each of the groove portions 31E-1 is preferably 20 times or less of the thickness T1E of each of the wiring portions 311E-1.

The depth D2E of the groove portion 31E-2 is preferably larger than the thickness T2E of the wiring portion 311E-2. That is, the depth D2E of the groove portion 31E-2 is preferably larger than 1.0 time of the thickness T2E of the wiring portion 311E-2. For example, the depth D2E of the groove portion 31E-2 is preferably 1.1 times or more of the thickness T2E of the wiring portion 311E-2, may be 1.5 times or more of the thickness T2E, or may be 2.0 times or more of the thickness T2E. In addition, the depth D2E of the groove portion 31E-2 is preferably 20 times or less of the thickness T2E of the wiring portion 311E-2.

A plurality of groove portions 32E-0 corresponding to the plurality of wiring portions 312E-0 are defined in the surface 3221E. The plurality of groove portions 32E-0 are defined at intervals in the X direction. The groove portions 32E-0 each extend in the Z direction. The plurality of groove portions 32E-0 include a plurality of groove portions 32E-1 corresponding to the plurality of wiring portions 312E-1, and a groove portion 32E-2 corresponding to the wiring portion 312E-2. The groove portion 32E-2 serves as a second groove portion.

Each of the wiring portions 312E-1 is disposed in a corresponding one of the groove portions 32E-1. The wiring portion 312E-2 is disposed in the groove portion 32E-2. Therefore, a width W24E of the groove portion 32E-2 in the X direction is larger than a width W23E of each of the groove portions 32E-1 in the X direction, that is, larger than the width W13E of each of the wiring portions 312E-1 in the X direction. In addition, a depth D4E of the groove portion 32E-2 in the Y direction is larger than a depth D3E of each of the groove portions 32E-1 in the Y direction, that is, larger than the thickness T3E of each of the wiring portions 312E-1 in the Y direction.

The width W23E of each of the groove portions 32E-1 is preferably larger than the width W13E of each of the wiring portions 312E-1. That is, the width W23E of each of the groove portions 32E-1 is preferably larger than 1.0 time of the width W13E of each of the wiring portions 312E-1. For example, the width W23E of each of the groove portions 32E-1 is preferably 1.1 times or more of the width W13E of each of the wiring portions 312E-1, may be 1.5 times or more of the width W13E, or may be 2.0 times or more of the width W13E. In addition, the width W23E of each of the groove portions 32E-1 is preferably 20 times or less of the width W13E of each of the wiring portions 312E-1.

The width W24E of the groove portion 32E-2 is preferably larger than the width W14E of the wiring portion 312E-2. That is, the width W24E of the groove portion 32E-2 is preferably larger than 1.0 time of the width W14E of the wiring portion 312E-2. For example, the width W24E of the groove portion 32E-2 is preferably 1.1 times or more of the width W14E of the wiring portion 312E-2, may be 1.5 times or more of the width W14E, or may be 2.0 times or more of the width W14E. In addition, the width W24E of the groove portion 32E-2 is preferably 20 times or less of the width W14E of the wiring portion 312E-2.

The depth D3E of each of the groove portions 32E-1 is preferably larger than the thickness T3E of each of the wiring portions 312E-1. That is, the depth D3E of each of the groove portions 32E-1 is preferably larger than 1.0 time of the thickness T3E of each of the wiring portions 312E-1. For example, the depth D3E of each of the groove portions 32E-1 is preferably 1.1 times or more of the thickness T3E of each of the wiring portions 312E-1, may be 1.5 times or more of the thickness T3E, or may be 2.0 times or more of the thickness T3E. In addition, the depth D3E of each of the groove portions 32E-1 is preferably 20 times or less of the thickness T3E of each of the wiring portions 312E-1.

The depth D4E of the groove portion 32E-2 is preferably larger than the thickness T4E of the wiring portion 312E-2. That is, the depth D4E of the groove portion 32E-2 is preferably larger than 1.0 time of the thickness T4E of the wiring portion 312E-2. For example, the depth D4E of the groove portion 32E-2 is preferably 1.1 times or more of the thickness T4E of the wiring portion 312E-2, may be 1.5 times or more of the thickness T4E, or may be 2.0 times or more of the thickness T4E. In addition, the depth D4E of the groove portion 32E-2 is preferably 20 times or less of the thickness T4E of the wiring portion 312E-2.

In this manner, as viewed in the Z direction, the area of the wiring portion 311E-2 is larger than the area of each of the wiring portions 311E-1, and the area of the wiring portion 312E-2 is larger than the area of each of the wiring portions 312E-1. As a result of this, the wiring portions 311E-2 and 312E-2 are each used as an alignment mark, and thus the alignment precision of the intermediate connection member 300E with respect to the wiring board 221 illustrated in FIG. 9C is improved. In addition, since the area of each of the wiring portions 311E-2 and 312E-2 is large as viewed in the Z direction, a self-alignment effect of the intermediate connection member 300E with respect to the wiring board 221 when bonding the intermediate connection member 300E to the wiring board 221 with solder is improved.

In the sixth embodiment, the wiring portion 311E-2 having the width W12E and the thickness T2E and included in the plurality of wiring portions 311E-0 and the wiring portion 312E-2 having the width W14E and the thickness T4E and included in the plurality of wiring portions 312E-0 are displaced from each other in the X direction. That is, among the plurality of wiring portions 311E-0 and the plurality of wiring portions 312E-0, the distance between the wiring portions 311E-2 and 312E-2 is larger than a distance between two of the other wiring portions. As a result of this, the alignment precision of the intermediate connection member 300E with respect to the wiring board 221 in the manufacturing process of an image pickup module in the sixth embodiment is further improved. In addition, the self-alignment effect of the intermediate connection member 300E with respect to the wiring board 221 when bonding the intermediate connection member 300E to the wiring board 221 with solder is further improved. In addition, the alignment precision at the time of sticking together an insulating substrate corresponding to the insulating substrate portion 321E and an insulating substrate corresponding to the insulating substrate portion 322E in the manufacturing process of the intermediate connection member 300E is further improved.

To be noted, although a case where the wiring portions 311E-2 and 312E-2 are each used as an alignment mark has been described, the configuration is not limited to this. For example, a configuration in which the wiring portion 312E-2 and the groove portion 32E-2 are omitted and only the wiring portion 311E-2 is used as an alignment mark may be employed. In addition, in the intermediate connection member 300E, the wiring portion group 312E, that is, the plurality of wiring portions 312E-0 may be omitted. Also in this case, the wiring portion 311E-2 may be used as an alignment mark.

In addition, although it is preferable that the width W12E of the wiring portion 311E-2 is larger than the width W11E of each of the wiring portions 311E-1 and the thickness T2E of the wiring portion 311E-2 is larger than the thickness T1E of each of the wiring portions 311E-1, the configuration is not limited to this. For example, in the case where the width W12E of the wiring portion 311E-2 is larger than the width W11E of each of the wiring portions 311E-1, the thickness T2E of the wiring portion 311E-2 may be equal to or smaller than the thickness T1E of each of the wiring portions 311E-1. In this case, it is preferable that the width W22E of the groove portion 31E-2 is larger than the width W21E of each of the groove portions 31E-1 and the depth D2E of the groove portion 31E-2 is equal to or smaller than the depth D1E of each of the groove portions 31E-1. Similarly, in the case where the thickness T2E of the wiring portion 311E-2 is larger than the thickness T1E of each of the wiring portions 311E-1, the width W12E of the wiring portion 311E-2 may be equal to or smaller than the width W11E of each of the wiring portions 311E-1. In this case, it is preferable that the depth D2E of the groove portion 31E-2 is larger than the depth D1E of each of the groove portions 31E-1 and the width W22E of the groove portion 31E-2 is equal to or smaller than the width W21E of each of the groove portions 31E-1. That is, it suffices as long as the groove portion 31E-2 is a groove portion having a width larger than the width of each of the groove portions 31E-1, that is, larger than the width of each of the wiring portions 311E-1 and/or having a thickness larger than the depth of each of the groove portions 31E-1, that is, larger than the thickness of each of the wiring portions 311E-1. The wiring portion 311E-2 can be used as an alignment mark also in these cases.

Similarly, although it is preferable that the width W14E of the wiring portion 312E-2 is larger than the width W13E of each of the wiring portions 312E-1 and the thickness T4E of the wiring portion 312E-2 is larger than the thickness T3E of each of the wiring portions 312E-1, the configuration is not limited to this. For example, in the case where the width W14E of the wiring portion 312E-2 is larger than the width W13E of each of the wiring portions 312E-1, the thickness T4E of the wiring portion 312E-2 may be equal to or smaller than the thickness T3E of each of the wiring portions 312E-1. In this case, it is preferable that the width W24E of the groove portion 32E-2 is larger than the width W23E of each of the groove portions 32E-1 and the depth D4E of the groove portion 32E-2 is equal to or smaller than the depth D3E of each of the groove portions 32E-1. Similarly, in the case where the thickness T4E of the wiring portion 312E-2 is larger than the thickness T3E of each of the wiring portions 312E-1, the width W14E of the wiring portion 312E-2 may be equal to or smaller than the width W13E of each of the wiring portions 312E-1. In this case, it is preferable that the depth D4E of the groove portion 32E-2 is larger than the depth D3E of each of the groove portions 32E-1 and the width W24E of the groove portion 32E-2 is equal to or smaller than the width W23E of each of the groove portions 32E-1. That is, it suffices as long as the groove portion 32E-2 is a groove portion having a width larger than the width of each of the groove portions 32E-1, that is, larger than the width of each of the wiring portions 312E-1 and/or having a thickness larger than the depth of each of the groove portions 32E-1, that is, larger than the thickness of each of the wiring portions 312E-1. The wiring portion 312E-2 can be used as an alignment mark also in these cases.

In addition, although a case where the wiring portion group 311E, that is, the plurality of wiring portions 311E-0 include the one wiring portion 311E-2 has been described, the configuration is not limited to this, and the wiring portion group 311E may include two or more wiring portions 311E-2. In this case, it is preferable that two wiring portions positioned at respective ends in the X direction among the plurality of wiring portions 311E-0 are each the wiring portion 311E-2.

Similarly, although a case where the wiring portion group 312E, that is, the plurality of wiring portions 312E-0 include the one wiring portion 312E-2 has been described, the configuration is not limited to this, and the wiring portion group 312E may include two or more wiring portions 312E-2. In this case, it is preferable that two wiring portions positioned at respective ends in the X direction among the plurality of wiring portions 312E-0 are each the wiring portion 312E-2.

In addition, although a case where the plurality of wiring portions 311E-0 are each a wire has been described, the configuration is not limited to this. The plurality of wiring portions 311E-0 may be in any forms as long as the plurality of wiring portions 311E-0 are each formed from a conductive material. Therefore, for example, a configuration in which part or all of the plurality of wiring portions 311E-0 are constituted by a conductor pattern may be employed.

Similarly, although a case where the plurality of wiring portions 312E-0 are each a wire has been described, the configuration is not limited to this. The plurality of wiring portions 312E-0 may be in any forms as long as the plurality of wiring portions 312E-0 are each formed from a conductive material. Therefore, for example, a configuration in which part or all of the plurality of wiring portions 312E-0 are constituted by a conductor pattern may be employed.

Figure 17A:
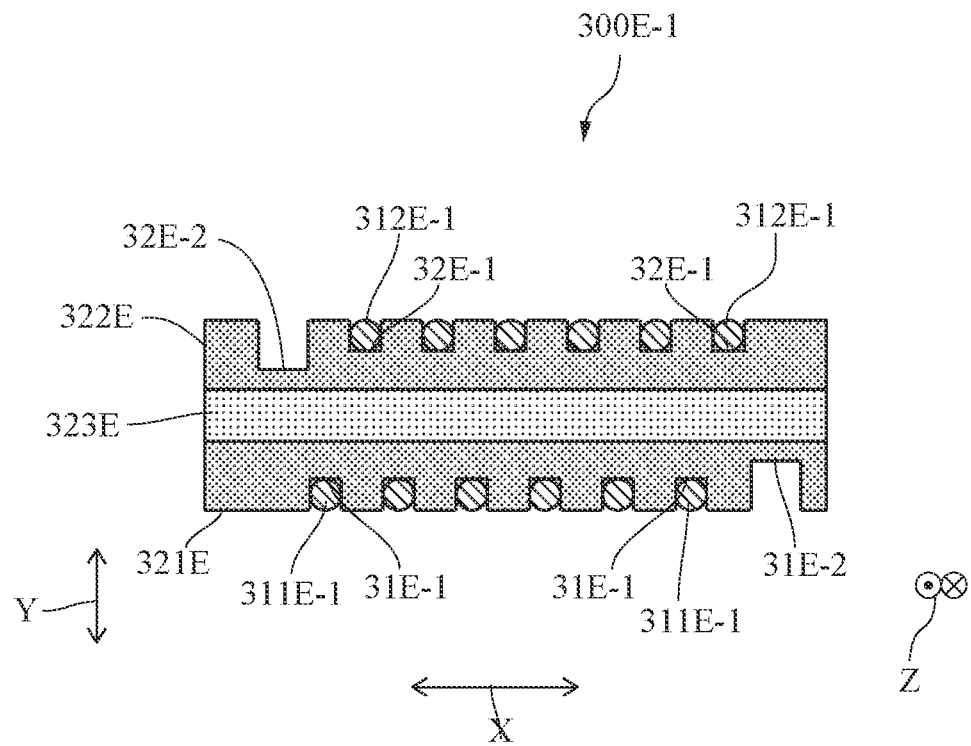
FIG. 17A is an explanatory diagram of an intermediate connection member of a modification example.
Figure 17B:
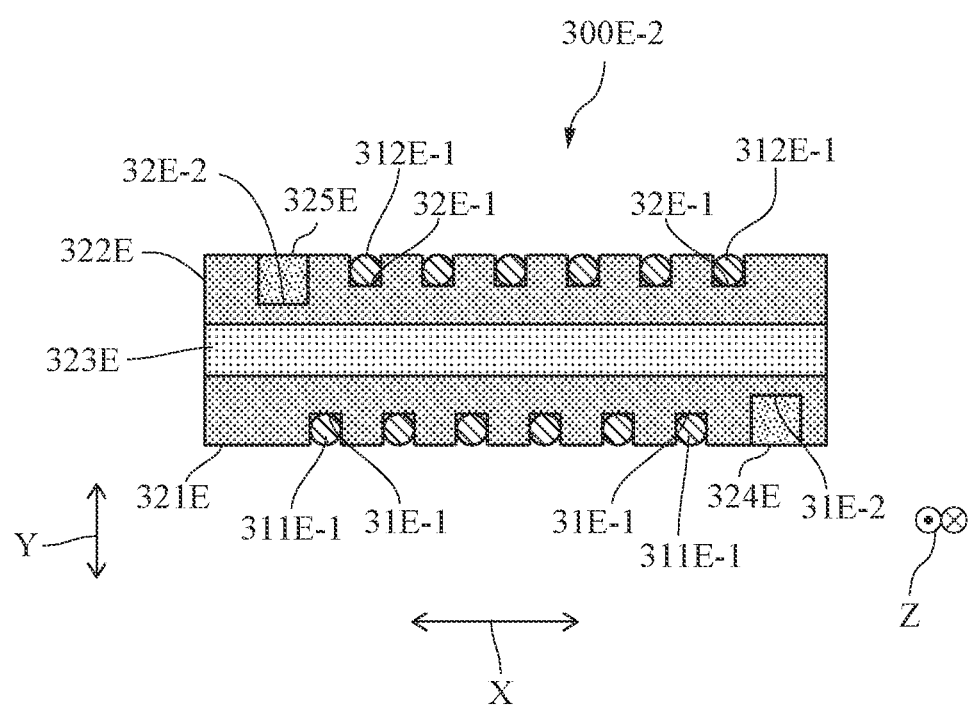
FIG. 17B is an explanatory diagram of an intermediate connection member of a modification example.

FIGS. 17A and 17B are respectively explanatory diagrams of intermediate connection members 300E-1 and 300E-2 of modification examples. Although a case where the wiring portions 311E-2 and 312E-2 are respectively disposed in the groove portions 31E-2 and 32E-2 has been described in the sixth embodiment, the configuration is not limited to this, and one or both of the wiring portions 311E-2 and 312E-2 illustrated in FIG. 16A may be omitted. In the modification examples of FIGS. 17A and 17B, both the wiring portions 311E-2 and 312E-2 are omitted. The groove portions 31E-2 and 32E-2 of the intermediate connection member 300E-1 illustrated in FIG. 17A are not filled with anything, and are each used as an alignment mark.

In addition, the groove portions 31E-2 and 32E-2 of the intermediate connection member 300E-2 illustrated in FIG. 17B are respectively filled with insulators 324E and 325E. The insulators 324E and 325E are each an insulator formed from a different material or in a different color from the insulating substrate portions 321E and 322E, and are each used as an alignment mark.

Seventh Embodiment

Figure 18A:
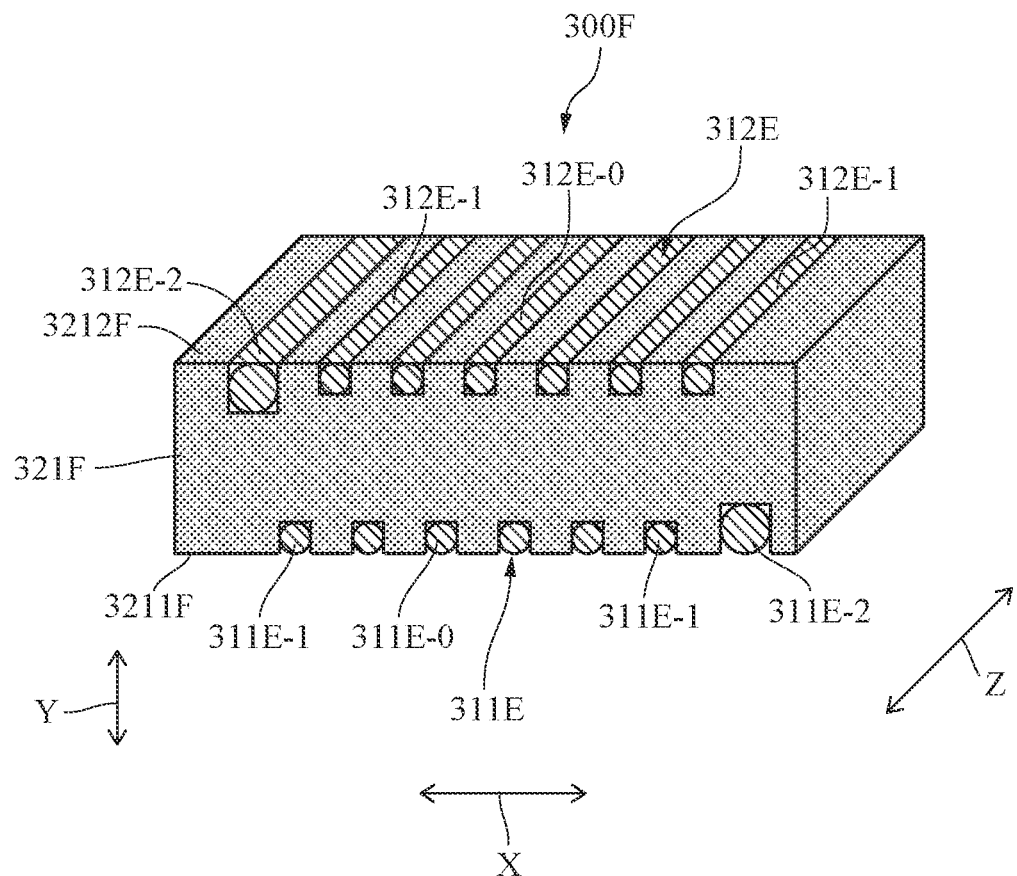
FIG. 18A is a perspective view of an intermediate connection member according to a seventh embodiment.

Next, intermediate connection members of a seventh embodiment will be described. FIG. 18A is a perspective view of an intermediate connection member 300F according to the seventh embodiment. To be noted, the intermediate connection member 300F of the seventh embodiment has a configuration in which an insulating substrate portion 321F is used in place of the insulating substrate portions 321E and 322E and the insulating layer portion 323E of the intermediate connection member 300E of the sixth embodiment. In the manufacturing method for the intermediate connection member 300F of the seventh embodiment, a step of sticking together the insulating substrate portions 321E and 322E is omitted from the manufacturing method for the intermediate connection member 300E of the sixth embodiment.

The intermediate connection member 300F includes the wiring portion group 311E and the wiring portion group 312E similarly to the sixth embodiment. In addition, the intermediate connection member 300F includes the insulating substrate portion 321F. The insulating substrate portion 321F serves as a first insulating substrate portion. The insulating substrate portion 321F is formed from the same material as the insulating substrate portions 321 and 322 described in the first embodiment, for example, glass epoxy.

In the seventh embodiment, the wiring portion group 311E includes the plurality of wiring portions 311E-0 as a plurality of first wiring portions. For example, in the present embodiment, the wiring portion group 311E includes seven wiring portions 311E-0. The material of each of the wiring portions 311E-0 is a conductive material such as copper. The plurality of wiring portions 311E-0 include at least one, for example, six wiring portions 311E-1, and at least another one, for example, one wiring portion 311E-2. The wiring portion group 312E is disposed at a position away from the wiring portion group 311E in the Y direction. The wiring portion group 312E includes the plurality of wiring portions 312E-0 as a plurality of second wiring portions. For example, in the present embodiment, the wiring portion group 312E includes seven wiring portions 312E-0. The plurality of wiring portions 312E-0 include at least one, for example, six wiring portions 312E-1, and at least another one, for example, one wiring portion 312E-2.

In the manufacturing process of the image pickup module in the seventh embodiment, it is preferable that the intermediate connection member 300F is provided with an alignment mark for improving the alignment precision between the intermediate connection member 300F and the wiring board 221 illustrated in FIG. 9C. By providing the intermediate connection member 300F with an alignment mark, the wiring portions in the image pickup module can be arranged with high precision.

Therefore, in the seventh embodiment, the wiring portion 311E-2 in the plurality of wiring portions 311E-0 and the wiring portion 312E-2 in the plurality of wiring portions 312E-0 are used as alignment marks. The miring portion 311E-2 is a wiring portion positioned at an end in the X direction among the plurality of wiring portions 311E-0. The wiring portion 312E-2 is a wiring portion positioned at an end in the X direction among the plurality of wiring portions 312E-0. The wiring portions 311E-1, 311E-2, 312E-1, and 312E-2 each have a width and thickness described in the sixth embodiment.

Figure 18B:
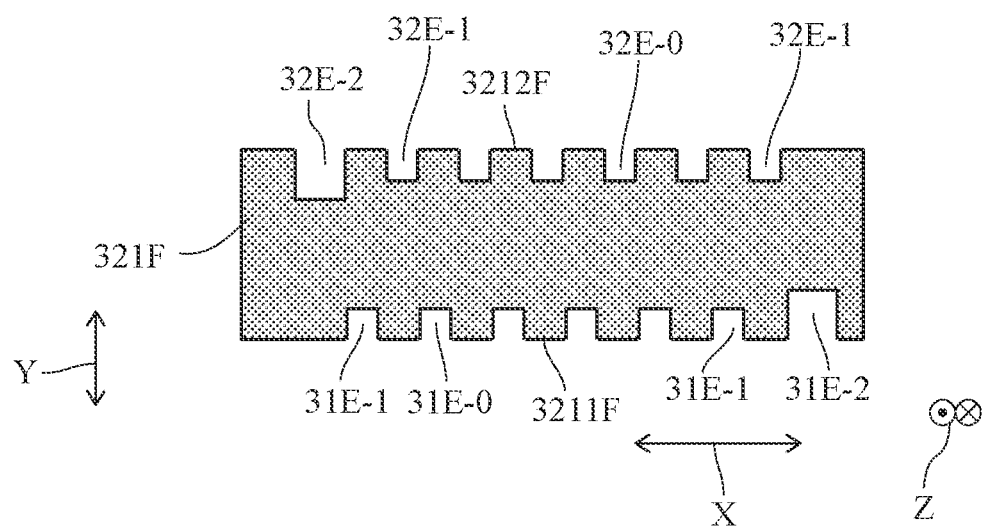
FIG. 18B is an explanatory diagram of an insulating substrate portion according to the seventh embodiment.

The wiring portions 311E-0 and 312E-0 are each constituted by, for example, a wire. In the seventh embodiment, the plurality of wiring portions 311E-0 and the plurality of wiring portions 312E-0 are disposed on the same insulating substrate portion 321F. A configuration of the insulating substrate portion 321F on which the wiring portions 311E-0 and 312E-0 are disposed will be described in detail below. FIG. 18A is an explanatory diagram of the insulating substrate portion 321F according to the seventh embodiment. FIG. 18B is a plan view of the insulating substrate portion 321F as viewed in the Z direction. The insulating substrate portion 321F has a surface 3211F and a surface 3212F opposite to the surface 3211F in the Y direction.

The plurality of wiring portions 311E-0 are disposed on the surface 3211F, and the plurality of wiring portions 312E-0 are disposed on the surface 3212F. That is, the plurality of wiring portions 311E-0 are disposed on the outer surface 3211F of the insulating substrate portion 321F, and the plurality of wiring portions 312E-0 are disposed on the outer surface 3212F of the insulating substrate portion 321F. To be noted, an unillustrated insulating layer may be provided on each of the surfaces 3211F and 3212F.

The plurality of groove portions 31E-0 configured in substantially the same manner as in the sixth embodiment and corresponding to the plurality of wiring portions 311E-0 are defined in the surface 3211F. The plurality of groove portions 31E-0 are defined at intervals in the X direction. The groove portions 31E-0 each extend in the Z direction. The plurality of groove portions 31E-0 include the plurality of groove portions 31E-1 corresponding to the plurality of wiring portions 311E-1, and the groove portion 31E-2 corresponding to the wiring portion 311E-2. The groove portion 31E-2 serves as a first groove portion. Each of the wiring portions 311E-1 is disposed in a corresponding one of the groove portions 31E-1. The wiring portion 311E-2 is disposed in the groove portion 31E-2.

The plurality of groove portions 32E-0 configured in substantially the same manner as in the sixth embodiment and corresponding to the plurality of wiring portions 312E-0 are defined in the surface 3212F. The plurality of groove portions 32E-0 are defined at intervals in the X direction. The groove portions 32E-0 each extend in the Z direction. The plurality of groove portions 32E-0 include the plurality of groove portions 32E-1 corresponding to the plurality of wiring portions 312E-1, and the groove portion 32E-2 corresponding to the wiring portion 312E-2. The groove portion 32E-2 serves as a second groove portion. Each of the wiring portions 312E-1 is disposed in a corresponding one of the groove portions 32E-1. The wiring portion 312E-2 is disposed in the groove portion 32E-2.

In the seventh embodiment, the groove portions 31E-1, the groove portion 31E-2, the group portions 32E-1, and the groove portion 32E-2 each have a width and depth described in the sixth embodiment.

In this manner, as viewed in the Z direction, the area of the wiring portion 311E-2 is larger than the area of each of the wiring portions 311E-1, and the area of the wiring portion 312E-2 is larger than the area of each of the wiring portions 312E-1. As a result of this, the wiring portions 311E-2 and 312E-2 are each used as an alignment mark, and thus the alignment precision of the intermediate connection member 300F with respect to the wiring board 221 illustrated in FIG. 9C is improved. In addition, since the area of each of the wiring portions 311E-2 and 312E-2 is large as viewed in the Z direction, a self-alignment effect of the intermediate connection member 300F with respect to the wiring board 221 when bonding the intermediate connection member 300F to the wiring board 221 with solder is improved.

In the seventh embodiment, the wiring portion 311E-2 included in the plurality of wiring portions 311E-0 and the wiring portion 312E-2 included in the plurality of wiring portions 312E-0 are displaced from each other in the X direction. That is, among the plurality of wiring portions 311E-0 and the plurality of wiring portions 312E-0, the distance between the wiring portions 311E-2 and 312E-2 is larger than a distance between two of the other wiring portions. As a result of this, the alignment precision of the intermediate connection member 300F with respect to the wiring board 221 in the manufacturing process of an image pickup module in the seventh embodiment is further improved.

To be noted, a similar modification to the modification example of the sixth embodiment is applicable to the seventh embodiment.

Eighth Embodiment

Figure 19:
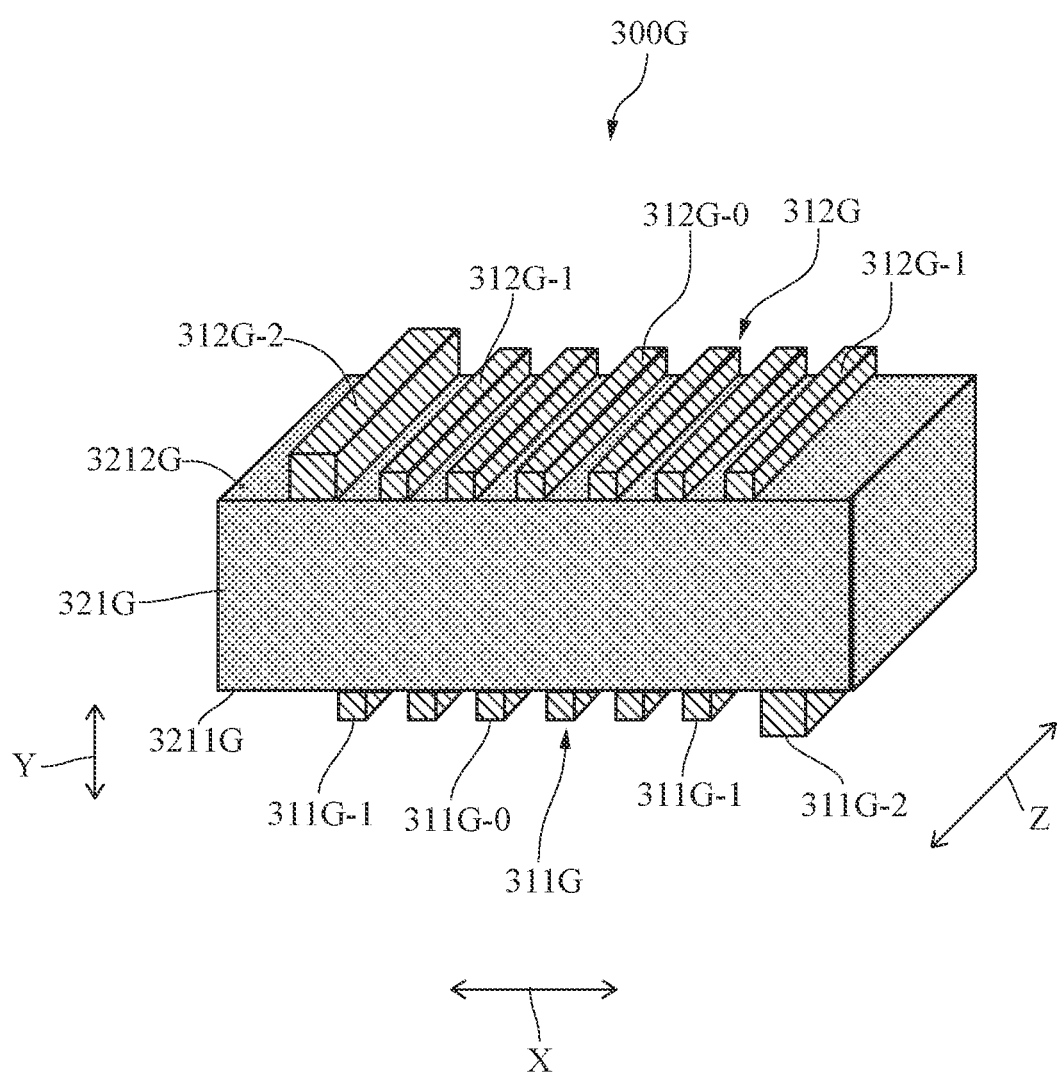
FIG. 19 is a perspective view of an intermediate connection member according to an eighth embodiment.

Next, intermediate connection members of an eighth embodiment will be described. FIG. 19 is a perspective view of an intermediate connection member 300G according to the eighth embodiment.

The intermediate connection member 300G includes a wiring portion group 311G and a wiring portion group 312G. In addition, the intermediate connection member 300G includes an insulating substrate portion 321G serving as a first insulating substrate portion. The insulating substrate portion 321G is formed from the same material as the insulating substrate portions 321 and 322 described in the first embodiment, for example, glass epoxy.

In the eighth embodiment, the wiring portion group 311G includes a plurality of wiring portions 311G-0 as a plurality of first wiring portions. For example, in the present embodiment, the wiring portion group 311G includes seven wiring portions 311G-0. The material of each of the wiring portions 311G-0 is a conductive material such as copper. The plurality of wiring portions 311G-0 include at least one, for example, six wiring portions 311G-1, and at least another one, for example, one wiring portion 311G-2. The wiring portion group 312G is disposed at a position away from the wiring portion group 311G in the Y direction. The wiring portion group 312G includes a plurality of wiring portions 312G-0 as a plurality of second wiring portions. For example, in the present embodiment, the wiring portion group 312G includes seven wiring portions 312G-0. The plurality of wiring portions 312G-0 include at least another one, for example, six wiring portions 312G-1, and at least one, for example, one wiring portion 312G-2.

In the manufacturing process of the image pickup module in the eighth embodiment, it is preferable that the intermediate connection member 300G is provided with an alignment mark for improving the alignment precision between the intermediate connection member 300G and the wiring board 221 illustrated in FIG. 9C. By providing the intermediate connection member 300G with an alignment mark, the wiring portions in the image pickup module can be arranged with high precision.

Therefore, in the eighth embodiment, the wiring portion 311G-2 in the plurality of wiring portions 311G-0 and the wiring portion 312G-2 in the plurality of wiring portions 312G-0 are used as alignment marks. The wiring portion 311G-2 is a wiring portion positioned at an end in the X direction among the plurality of wiring portions 311G-0. The wiring portion 312G-2 is a wiring portion positioned at an end in the X direction among the plurality of wiring portions 312G-0. The wiring portions 311G-1, 311G-2, 312G-1, and 312G-2 each have a width and thickness described in the sixth embodiment.

The plurality of wiring portions 311G-0 and the plurality of wiring portions 312G-0 are each constituted by, for example, a conductor pattern. In the eighth embodiment, the plurality of wiring portions 311G-0 and the plurality of wiring portions 312G-0 are disposed on the same insulating substrate portion 321G.

The insulating substrate portion 321G has a surface 3211G and a surface 3212G opposite to the surface 3211G in the Y direction. The plurality of wiring portions 311G-0 are disposed on the surface 3211G, and the plurality of wiring portions 312G-0 are disposed on the surface 3212G. That is, the plurality of wiring portions 311G-0 are disposed on the outer surface 3211G of the insulating substrate portion 321G, and the plurality of wiring portions 312G-0 are disposed on the outer surface 3212G of the insulating substrate portion 321G. To be noted, an unillustrated insulating layer may be provided on each of the surfaces 3211G and 3212G.

In this manner, as viewed in the Z direction, the area of the wiring portion 311G-2 is larger than the area of each of the wiring portions 311G-1, and the area of the wiring portion 312G-2 is larger than the area of each of the wiring portions 312G-1. As a result of this, the wiring portions 311G-2 and 312G-2 are each used as an alignment nark, and thus the alignment precision of the intermediate connection member 300G with respect to the wiring board 221 illustrated in FIG. 9C is improved. In addition, since the area of each of the wiring portions 311G-2 and 312G-2 is large as viewed in the Z direction, a self-alignment effect of the intermediate connection member 300G with respect to the wiring board 221 when bonding the intermediate connection member 300G to the wiring board 221 with solder is improved.

In the eighth embodiment, the wiring portion 311G-2 included in the plurality of wiring portions 311G-0 and the wiring portion 312G-2 included in the plurality of wiring portions 312G-0 are displaced from each other in the X direction. That is, among the plurality of wiring portions 311G-0 and the plurality of wiring portions 312G-0, the distance between the wiring portions 311G-2 and 312G-2 is larger than a distance between two of the other wiring portions. As a result of this, the alignment precision of the intermediate connection member 300G with respect to the wiring board 221 in the manufacturing process of an image pickup module in the eighth embodiment is further improved.

To be noted, although a case where the wiring portions 311G-2 and 312G-2 are each used as an alignment mark has been described in the eighth embodiment, the configuration is not limited to this. For example, a configuration in which the wiring portion 312G-2 is omitted and only the wiring portion 311G-2 is used as an alignment mark may be employed. In addition, in the intermediate connection member 300G, the wiring portion group 312G, that is, the plurality of wiring portions 312G-0 may be omitted. Also in this case, the wiring portion 311G-2 may be used as an alignment mark.

In addition, the width and/or thickness of each of the wiring portions 311G-2 and 312G-2 in the eighth embodiment can be also modified in a similar manner to the modification example of the width and/or thickness of each of the wiring portions 311D-2 and 312D-2 in the fifth embodiment.

In addition, although a case where the wiring portion group 311G, that is, the plurality of wiring portions 311G-0 include the one wiring portion 311G-2 has been described, the configuration is not limited to this, and the wiring portion group 311G may include two or more wiring portions 311G-2. In this case, it is preferable that two wiring portions positioned at respective ends in the X direction among the plurality of wiring portions 311G-0 are each the wiring portion 311G-2.

Similarly, although a case where the wiring portion group 312G, that is, the plurality of wiring portions 312G-0 include the one wiring portion 312G-2 has been described, the configuration is not limited to this, and the wiring portion group 312G may include two or more wiring portions 312G-2. In this case, it is preferable that two wiring portions positioned at respective ends in the X direction among the plurality of wiring portions 312G-0 are each the wiring portion 312G-2.

Figure 20A:
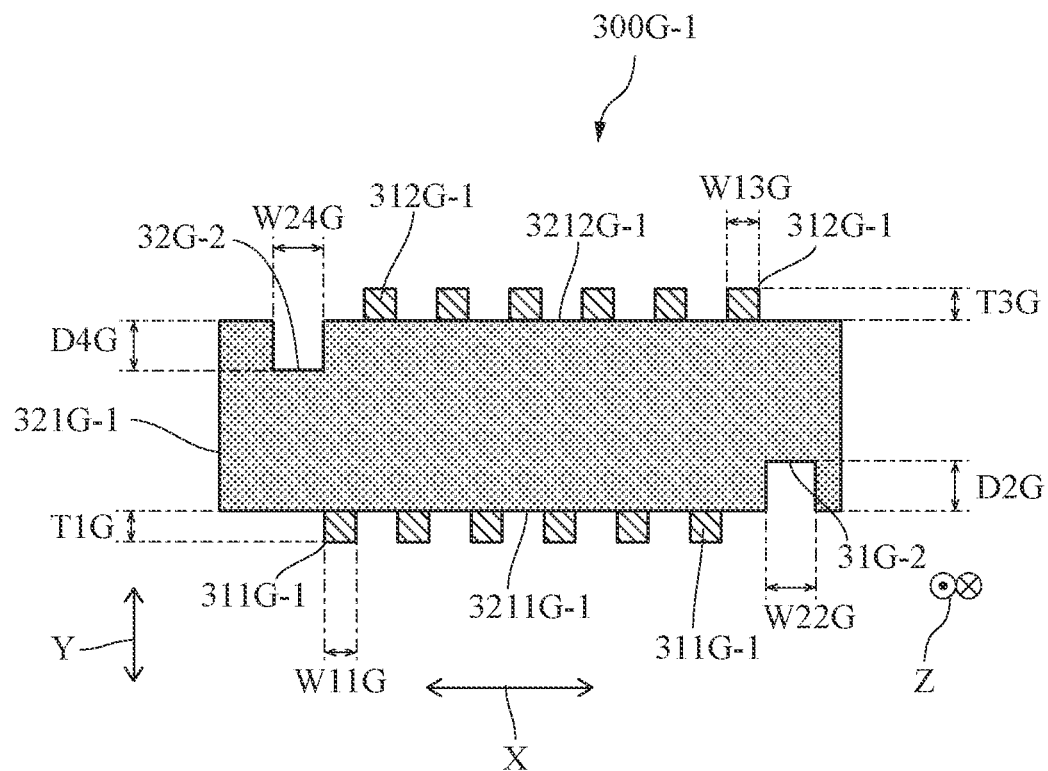
FIG. 20A is an explanatory diagram of an intermediate connection member of a modification example.
Figure 20B:
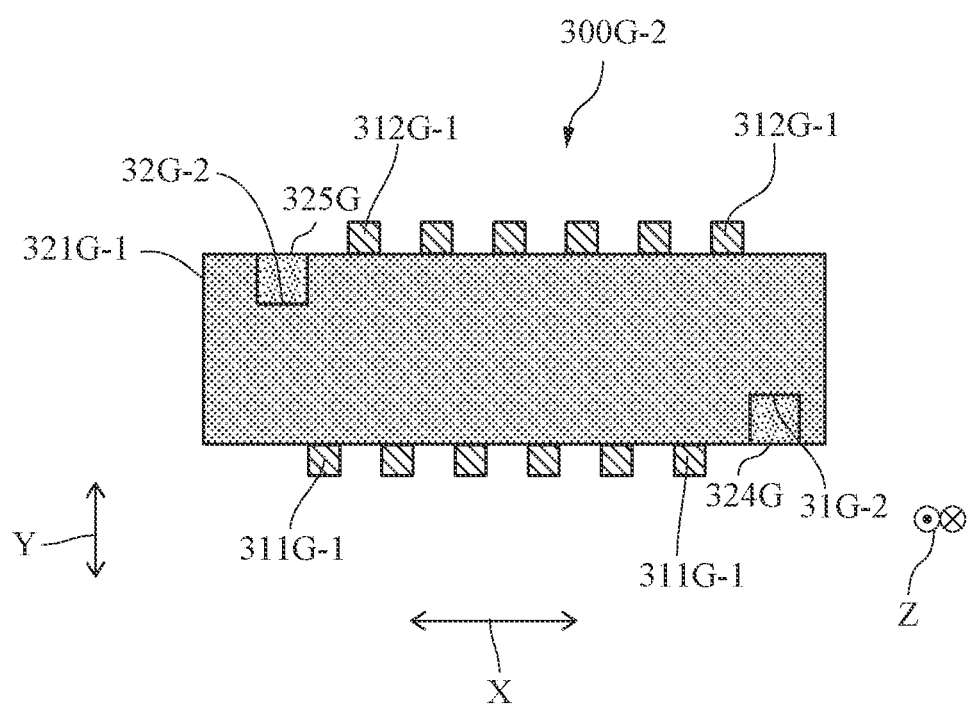
FIG. 20B is an explanatory diagram of an intermediate connection member of a modification example.

FIGS. 20A and 20B are respectively explanatory diagrams of intermediate connection members 300G-1 and 300G-2 of modification examples. First, the intermediate connection member 300G-1 of the modification example illustrated in FIG. 20A will be described. The intermediate connection member 300G-1 includes an insulating substrate portion 321G-1, a plurality of wiring portions 311G-1, and a plurality of wiring portions 312G-1. The insulating substrate portion 321G-1 has a surface 3211G-1 having a groove portion 31G-2, and a surface 3212G-1 having a groove portion 32G-2. The surface 3212G-1 is opposite to the surface 3211G-1 in the Y direction. The groove portion 31G-2 serves as a first groove portion, and the groove portion 32G-2 serves as a second groove portion.

The groove portion 31G-2 is preferably a groove portion having a width larger than a width W11G of each of the wiring portions 311G-1 and/or having a depth larger than a thickness T1G of each of the wiring portions 311G-1. In the intermediate connection member 300G-1 of the modification example illustrated in FIG. 20A, a width W22G of the groove portion 31G-2 in the X direction is larger than the width W11G of each of the wiring portions 311G-1 in the X direction. In addition, a depth D2G of the groove portion 31G-2 in the Y direction is larger than the thickness T1G of each of the wiring portions 311G-1 in the Y direction.

The groove portion 32G-2 is preferably a groove portion having a width larger than a width W13G of each of the wiring portions 312G-1 and/or having a depth larger than a thickness T3G of each of the wiring portions 312G-1. In the intermediate connection member 300G-1 of the modification example illustrated in FIG. 20A, a width W24G of the groove portion 32G-2 in the X direction is larger than the width W13G of each of the wiring portions 312G-1 in the X direction. In addition, a depth D4G of the groove portion 32G-2 in the Y direction is larger than the thickness T3G of each of the wiring portions 312G-1 in the Y direction.

According to the configuration described above, the groove portions 31G-2 and 32G-2 can be each used as an alignment mark, and thus the alignment precision of the intermediate connection member 300G-1 with respect to the wiring board 221 illustrated in FIG. 9C is improved.

The groove portions 31G-2 and 32G-2 are preferably displaced from each other in the X direction. To be noted, in the intermediate connection member 300G-1, the groove portion 32G-2 can be omitted. In addition, the insulating substrate portion 321G-1 may have a plurality of groove portions 31G-2 or a plurality of groove portions 32G-2.

The intermediate connection member 300G-2 of the modification example illustrated in FIG. 20B will be described. The intermediate connection member 300G-2 includes the insulating substrate portion 321G-1, the plurality of wiring portions 311G-1, and the plurality of wiring portions 312G-1 similarly to the intermediate connection member 300G-1. The groove portions 31G-2 and 32G-2 of the intermediate connection member 300G-2 illustrated in FIG. 20B are respectively filled with insulators 324G and 325G. The insulators 324G and 325G are each an insulator formed from a different material or in a different color from the insulating substrate portion 321G-1, and are each used as an alignment mark.

According to the configuration described above, the insulators 324G and 325G can be each used as an alignment mark, and thus the alignment precision of the intermediate connection member 300G-2 with respect to the wiring board 221 illustrated in FIG. 9C is improved.

The groove portions 31G-2 and 32G-2 are preferably displaced from each other in the X direction. To be noted, in the intermediate connection member 300G-2, the groove portion 32G-2 and the insulator 325G can be omitted. In addition, the insulating substrate portion 321G-1 may have a plurality of groove portions 31G-2 or a plurality of groove portions 32G-2.

The present invention is not limited to the embodiments described above, and can be modified in various ways within the technical concept of the present invention. For example, a plurality of embodiments can be combined. In addition, part of elements of at least one embodiment can be deleted or replaced. In addition, a new matter can be added to at least one embodiment. For example, in the sixth to eighth embodiments, at least part of the plurality of wiring portions 312 other than both the end surfaces thereof in the Z direction may be covered by an insulating film such as a solder resist film provided on the insulating substrate portion 321. The insulating film suppresses a short circuit and corrosion of the plurality of wiring portions 312. In addition, the effects described in the embodiments are merely enumeration of most preferable effects that can be obtained by the present invention, and the effects of the present invention are not limited to those described in the embodiments. To be noted, the disclosure of the present specification is not limited to matters explicitly described in the present specification, and includes all matters that can be grasped from the present specification and drawings attached to the present specification. In addition, the disclosure of the present specification includes a complementary set of each individual concept described in the present specification. That is, for example, in the case where the present specification includes a description "A is B", it can be said that the present specification discloses "A is not B" even if an explicit description of "A is not B" is omitted. This is because "A is B" is described on the premise that a case where "A is not B" has been also considered.

Although a case where the electronic part is an image sensor or a memory element has been described as an example in the embodiments described above, the configuration is not limited to this. For example, the electronic part may be a semiconductor device for image processing, or a power integrated circuit: power IC. For example, the electronic part may be a semiconductor device for communication, or a control IC. In addition, although a case where the electronic module is an image pickup module has been described as an example, the configuration is not limited to this. For example, the electronic module may be a memory module, a signal processing module, a power module, a communication module, or a control module.

In addition, although a case where the electronic equipment is a digital camera has been described as an example, the configuration is not limited to this. For example, the electronic equipment may be a mobile communication equipment. For example, the electronic equipment may be an information equipment such as a smartphone or a personal computer, or a communication equipment such as a modem or a router. Alternatively, the electronic equipment may be an office equipment such as a printer or a copier, a medical equipment such as a radiographing apparatus, a magnetic image capturing apparatus, an ultrasonic image capturing apparatus, or an endoscope, an industrial equipment such as a robot or a semiconductor manufacturing apparatus, or a transport equipment such as a car, an airplane, or a ship. In the case of providing wiring in a limited space in a casing of an electronic equipment, the size of the electronic equipment can be reduced and the arrangement density of the wiring can be increased by using the intermediate connection members 300. The electronic module of the present invention is applicable to various electronic equipment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-121963, filed Jul. 16, 2020, and Japanese Patent Application No. 2021-75792, filed Apr. 28, 2021, which are hereby incorporated by reference herein in their entirety.

What is claimed is:

1. An intermediate connection member used for electrically connecting a first circuit unit and a second circuit unit to each other, the first circuit unit and the second circuit unit being provided to oppose each other, the intermediate connection member comprising:
    a first insulating substrate portion;
    a second insulating substrate portion;
    an insulating layer portion provided between the first insulating substrate portion and the second insulating substrate portion and formed from a different material from the first insulating substrate portion and the second insulating substrate portion;
    a plurality of first wiring portions provided between the first insulating substrate portion and the insulating layer portion so as to extend in a first direction such that both end portions of the plurality of first wiring portions in the first direction are exposed to an outside; and
    a plurality of second wiring portions provided between the second insulating substrate portion and the insulating layer portion so as to extend in the first direction such that both end portions of the plurality of second wiring portions in the first direction are exposed to the outside,
    wherein the insulating layer portion comprises a first insulating layer, a second insulating layer formed from the same material as the first insulating layer, and a third insulating layer provided between the first insulating layer and the second insulating layer and formed from a different material from the first insulating layer and the second insulating layer.

2. The intermediate connection member according to claim 1, wherein the plurality of first wiring portions and the plurality of second wiring portions are alternately arranged in a second direction intersecting with the first direction.

3. The intermediate connection member according to claim 1, wherein a thickness of the insulating layer portion is 10 μm to 300 μm.

4. The intermediate connection member according to claim 1, wherein a ratio of a height of the intermediate connection member in the first direction to a distance between two closest wiring portions of one wiring portion in the plurality of first wiring portions and one wiring portion in the plurality of second wiring portions is 4 or more.

5. An intermediate connection member used for electrically connecting a first circuit unit and a second circuit unit to each other, the first circuit unit and the second circuit unit being provided to oppose each other, the intermediate connection member comprising:
    a first insulating substrate portion;
    a second insulating substrate portion;
    an insulating layer portion provided between the first insulating substrate portion and the second insulating substrate portion and formed from a different material from the first insulating substrate portion and the second insulating substrate portion;
    a plurality of first wiring portions arranged at intervals in a second direction intersecting with a first direction,
    wherein the plurality of first wiring portions are each provided to extend in the first direction such that both end surfaces thereof in the first direction are exposed to an outside, and
    wherein at least one of the plurality of first wiring portions has a first width, and at least another one of the plurality of first wiring portions has a second width larger than the first width,
    wherein the plurality of first wiring portions are disposed on the first insulating substrate portion, and
    wherein the insulating layer portion comprises a first insulating layer, a second insulating layer formed from the same material as the first insulating layer, and a third insulating layer provided between the first insulating layer and the second insulating layer and formed from a different material from the first insulating layer and the second insulating layer.

6. The intermediate connection member according to claim 5, further comprising:
    a plurality of second wiring portions arranged at intervals in the second direction,
    wherein the plurality of second wiring portions are provided so as to be separated from the plurality of first wiring portions in a third direction intersecting with the first direction and the second direction, wherein the plurality of second wiring portions are each provided to extend in the first direction such that both end surfaces thereof in the first direction are exposed to the outside, and wherein at least one of the plurality of second wiring portions has a third width, and at least another one of the plurality of second wiring portions has a fourth width larger than the third width.

7. The intermediate connection member according to claim 6, wherein the at least one first wiring portion having the second width in the plurality of first wiring portions and the at least one second wiring portion having the fourth width in the plurality of second wiring portions are displaced from each other in the second direction.

8. An intermediate connection member used for electrically connecting a first circuit unit and a second circuit unit to each other, the first circuit unit and the second circuit unit being provided to oppose each other, the intermediate connection member comprising:

a first insulating substrate portion;
a second insulating substrate portion;
an insulating layer portion provided between the first insulating substrate portion and the second insulating substrate portion and formed from a different material from the first insulating substrate portion and the second insulating substrate portion;
a plurality of first wiring portions arranged at intervals in a second direction intersecting with a first direction,
wherein the plurality of first wiring portions are each provided to extend in the first direction such that both end surfaces thereof in the first direction are exposed to an outside, and
wherein at least one of the plurality of first wiring portions has a first thickness, and at least another one of the plurality of first wiring portions has a second thickness larger than the first thickness,
wherein the plurality of first wiring portions are disposed on the first insulating substrate portion, and
wherein the insulating layer portion comprises a first insulating layer, a second insulating layer formed from the same material as the first insulating layer, and a third insulating layer provided between the first insulating layer and the second insulating layer and formed from a different material from the first insulating layer and the second insulating layer.

9. The intermediate connection member according to claim 8, further comprising:

a plurality of second wiring portions arranged at intervals in the second direction,
wherein the plurality of second wiring portions are provided so as to be separated from the plurality of first wiring portions in a third direction intersecting with the first direction and the second direction,
wherein the second wiring portions are each provided to extend in the first direction such that both end surfaces thereof in the first direction are exposed to the outside, and
wherein at least one of the plurality of second wiring portions has a third thickness, and at least another one of the plurality of second wiring portions has a fourth thickness larger than the third thickness.

10. The intermediate connection member according to claim 9, wherein the at least one first wiring portion having the second thickness in the plurality of first wiring portions and the at least one second wiring portion having the fourth thickness in the plurality of second wiring portions are displaced from each other in the second direction.

11. An intermediate connection member used for electrically connecting a first circuit unit and a second circuit unit to each other, the first circuit unit and the second circuit unit being provided to oppose each other, the intermediate connection member comprising:

a first insulating substrate portion;
a plurality of first wiring portions that are provided on the first insulating substrate portion and arranged at intervals in a second direction intersecting with a first direction; and
a second insulating substrate portion opposing the first insulating substrate portion with an insulating layer portion therebetween,
wherein the plurality of first wiring portions are each provided to extend in the first direction such that both end surfaces thereof in the first direction are exposed to an outside, and
wherein the first insulating substrate portion has a first groove portion having a width larger than a width of one of the plurality of first wiring portions and/or having a depth larger than a thickness of one of the plurality of first wiring portions, and
wherein the insulating layer portion comprises a first insulating layer, a second insulating layer formed from the same material as the first insulating layer, and a third insulating layer provided between the first insulating layer and the second insulating layer and formed from a different material from the first insulating layer and the second insulating layer.

12. The intermediate connection member according to claim 11, further comprising:

a plurality of second wiring portions that are provided on the first insulating substrate portion and arranged at intervals in the second direction,
wherein the plurality of second wiring portions are provided to be separated from the plurality of first wiring portions in a third direction intersecting with the first direction and the second direction,
wherein the plurality of second wiring portions are each provided to extend in the first direction such that both end surfaces thereof in the first direction are exposed to the outside, and
wherein the first insulating substrate portion has a second groove portion having a width larger than a width of one of the plurality of second wiring portions and/or having a depth larger than a thickness of one of the plurality of second wiring portions.

13. The intermediate connection member according to claim 11, further comprising:

a plurality of second wiring portions that are provided on the second insulating substrate portion and arranged at intervals in the second direction,
wherein the plurality of second wiring portions are provided to be separated from the plurality of first wiring portions in a third direction intersecting with the first direction and the second direction,
wherein the plurality of second wiring portions are each provided to extend in the first direction such that both end surfaces thereof in the first direction are exposed to the outside, and
wherein the second insulating substrate portion has a second groove portion having a width larger than a width of one of the plurality of second wiring portions and/or having a depth larger than a thickness of one of the plurality of second wiring portions.

14. A method for manufacturing an electronic module, the method comprising:

preparing the intermediate connection member according to claim 8;
bonding the intermediate connection member and the first circuit unit to each other with solder; and
bonding the intermediate connection member and the second circuit unit to each other with solder.

15. An electronic module comprising:
a first circuit unit comprising a first electronic part;
a second circuit unit provided to oppose the first circuit unit and comprising a second electronic part; and
the intermediate connection member according to claim 1 electrically connecting the first circuit unit and the second circuit unit to each other.

16. The electronic module according to claim 15, wherein the first electronic part is an image sensor.

17. An electronic equipment comprising:
a casing; and
the electronic module according to claim 15 provided in the casing.

18. A method for manufacturing an electronic module, the method comprising:
preparing the intermediate connection member according to claim 5;
bonding the intermediate connection member and the first circuit unit to each other with solder; and
bonding the intermediate connection member and the second circuit unit to each other with solder.

19. A method for manufacturing an electronic module, the method comprising:
preparing the intermediate connection member according to claim 8;
bonding the intermediate connection member and the first circuit unit to each other with solder; and
bonding the intermediate connection member and the second circuit unit to each other with solder.

20. A method for manufacturing an electronic module, the method comprising:
preparing the intermediate connection member according to claim 11;
bonding the intermediate connection member and the first circuit unit to each other with solder; and
bonding the intermediate connection member and the second circuit unit to each other with solder.

21. An electronic equipment comprising:
a first circuit unit comprising a first electronic part;
a second circuit unit provided to oppose the first circuit unit and comprising a second electronic part;
the intermediate connection member according to claim 5 electrically connecting the first circuit unit and the second circuit unit to each other; and
a casing,
wherein the first circuit unit, the second circuit unit and the intermediate connection member are provided in the casing.

22. An electronic equipment comprising:
a first circuit unit comprising a first electronic part;
a second circuit unit provided to oppose the first circuit unit and comprising a second electronic part;
the intermediate connection member according to claim 8 electrically connecting the first circuit unit and the second circuit unit to each other; and
a casing,
wherein the first circuit unit, the second circuit unit and the intermediate connection member are provided in the casing.

23. An electronic equipment comprising:
a first circuit unit comprising a first electronic part;
a second circuit unit provided to oppose the first circuit unit and comprising a second electronic part;
the intermediate connection member according to claim 11 electrically connecting the first circuit unit and the second circuit unit to each other; and
a casing,
wherein the first circuit unit, the second circuit unit and the intermediate connection member are provided in the casing.

* * * * *